United States Patent [19]
Yui et al.

[11] Patent Number: 4,914,463
[45] Date of Patent: Apr. 3, 1990

[54] DEVELOPMENT OF IMAGING SHEETS EMPLOYING PHOTOSENSITIVE MICROCAPSULES

[75] Inventors: Yasuji Yui, Saitama; Akio Hitachi, Tokyo; Tatsuru Sato, Chiba; Akira Shirakura, Tokyo, all of Japan

[73] Assignee: Sony Corp., Tokyo, Japan

[21] Appl. No.: 271,156

[22] Filed: Nov. 14, 1988

[30] Foreign Application Priority Data

| Nov. 14, 1987 | [JP] | Japan | 62-288178 |
| Nov. 24, 1987 | [JP] | Japan | 62-295796 |
| Nov. 26, 1987 | [JP] | Japan | 62-298605 |
| Nov. 28, 1987 | [JP] | Japan | 62-301115 |
| Dec. 10, 1987 | [JP] | Japan | 62-313080 |
| Dec. 12, 1987 | [JP] | Japan | 62-314936 |
| Dec. 16, 1987 | [JP] | Japan | 62-318199 |

[51] Int. Cl.$^4$ ............................................. G03D 5/02
[52] U.S. Cl. .................................. 354/304; 354/301; 355/27; 430/138
[58] Field of Search .............. 354/297, 301, 302, 304; 355/27, 100, 106; 430/138

[56] References Cited
U.S. PATENT DOCUMENTS

| 4,648,699 | 3/1987 | Holycross et al. | 355/27 |
| 4,768,050 | 8/1988 | Beery | 354/304 |
| 4,816,873 | 3/1989 | Hatta | 355/27 |

Primary Examiner—A. A. Mathews
Attorney, Agent, or Firm—Alvin Sinderbrand

[57] ABSTRACT

In an apparatus for developing a picture on a sheet of developing paper from an exposed sheet of photo-sensitive material by pressing together the sheets of developing paper and photo-sensitive material, and in which such sheets in contact with each other are intermittently transported in a predetermined direction of sheet travel across a back-up surface, and a rotatable roller having its axis of rotation extending substantially at right angles to a longitudinal median of the back-up surface is transported relative to the back-up surface in directions parallel to the longitudinal median thereof while the roller is urged toward the back-up surface with the sheets of developing paper and photo-sensitive material therebetween so as to be pressed together at a relatively narrow stripe-like area defined by the rolling path of the peripheral surface of the roller; standby surfaces extend from the opposite ends of the back-up surface and are raised relative to the latter for defining shoulders therebetween by which the sheets are guided in being transported across the back-up surface, and the roller is situated on one of the standby surfaces during the transporting of the sheets and, when the sheets are at rest, the roller moves from one to the other of the standby surfaces and rolls smoothly across the contacting sheets therebetween.

41 Claims, 29 Drawing Sheets

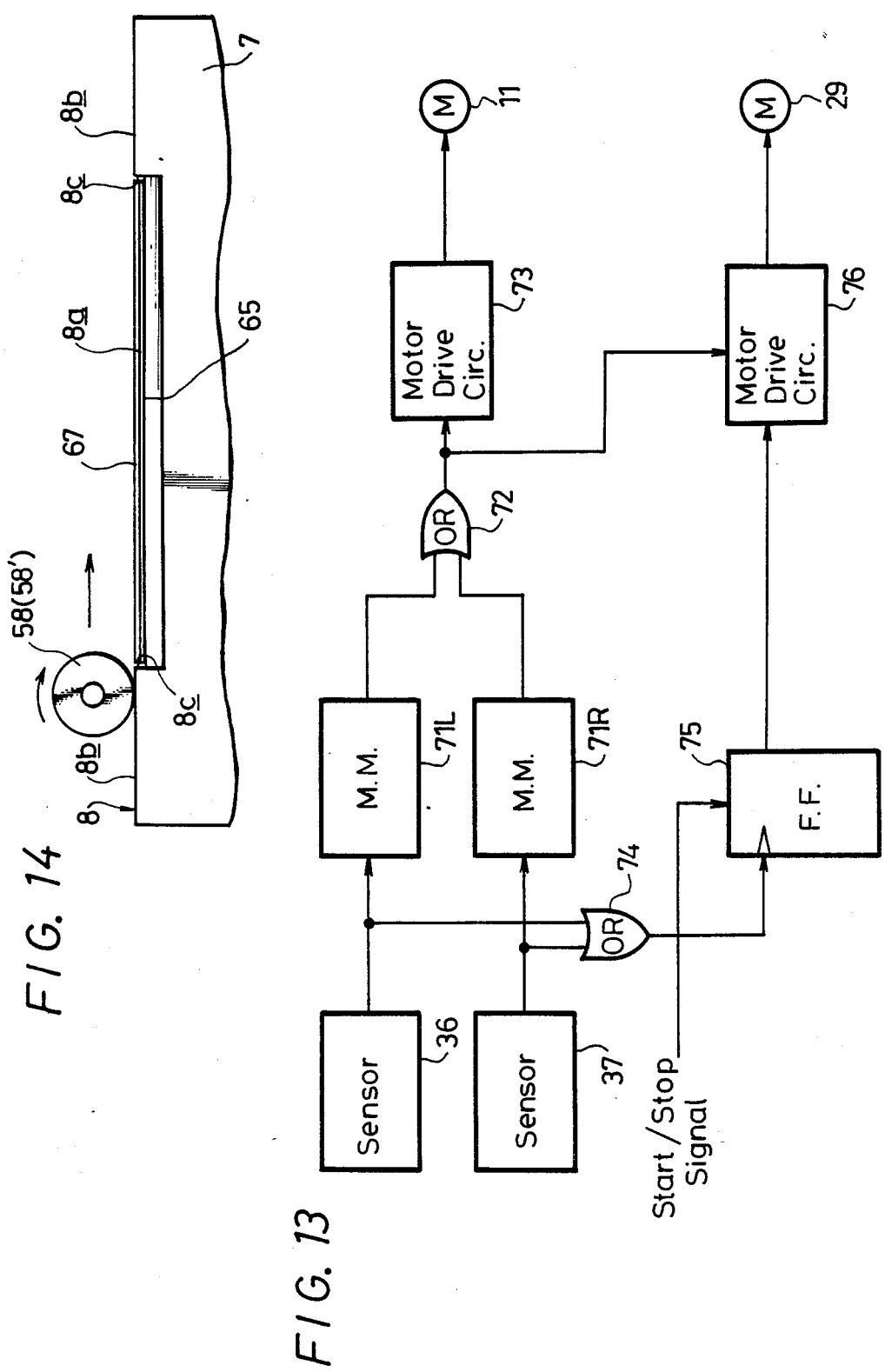

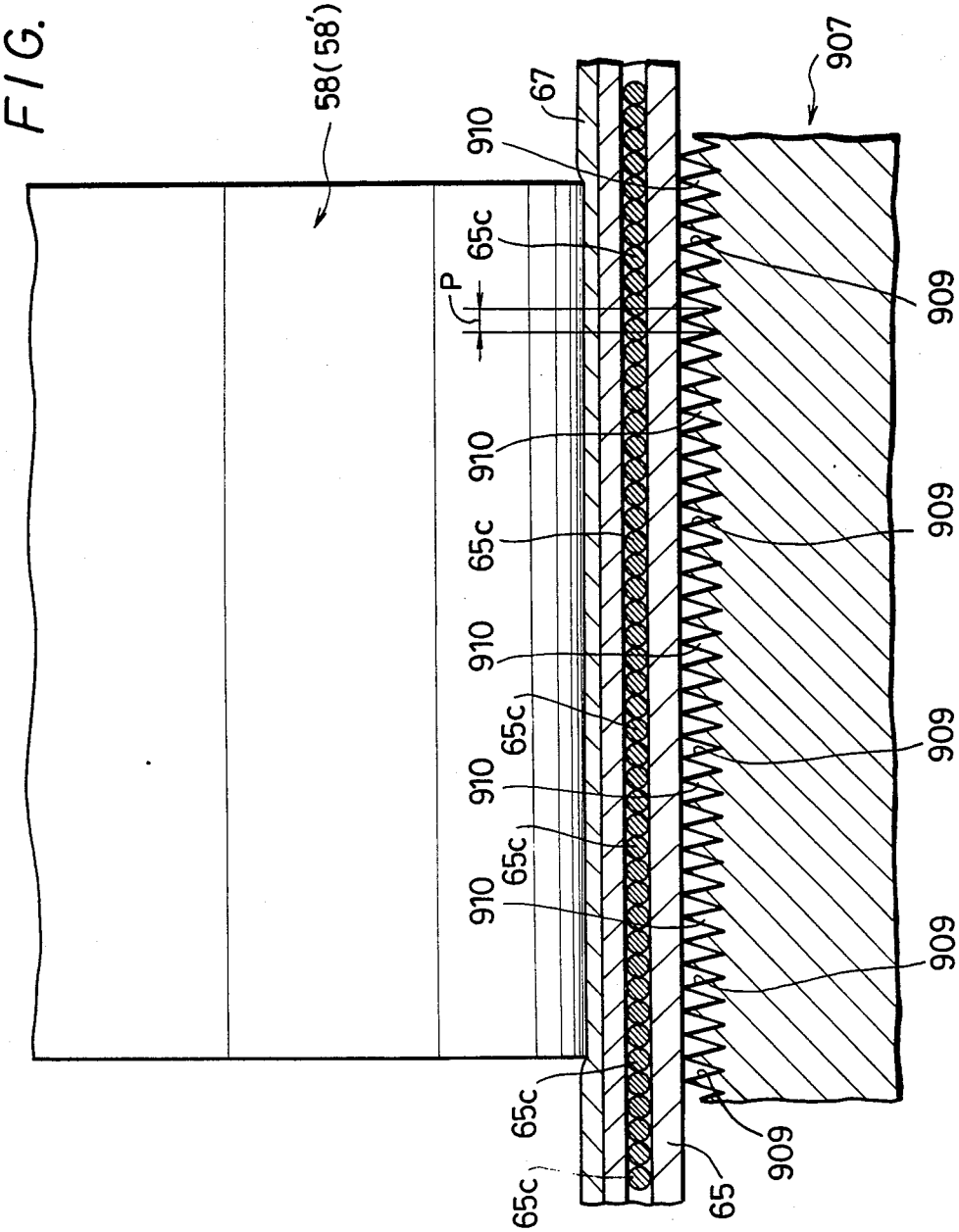

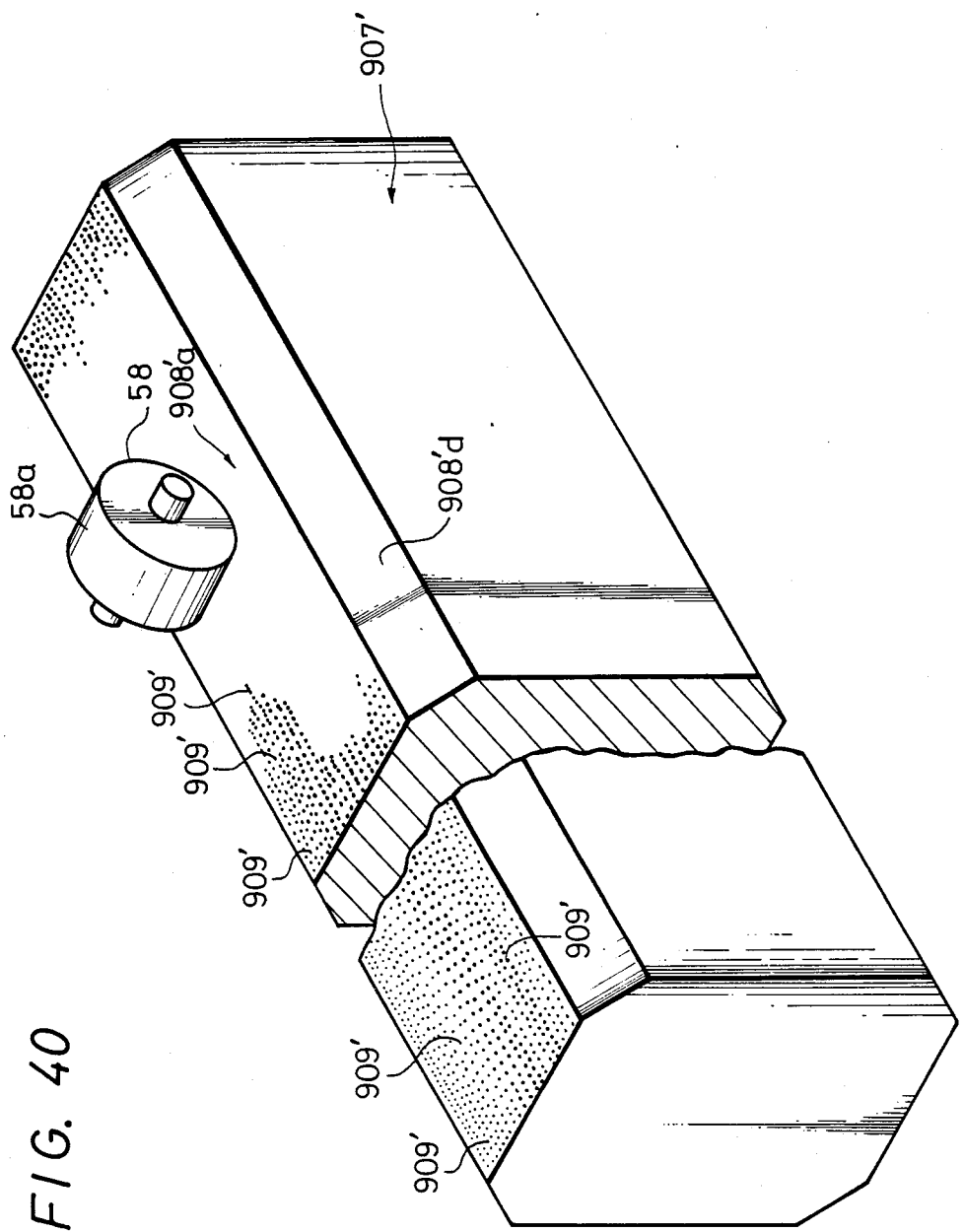

DEVELOPMENT OF IMAGING SHEETS EMPLOYING PHOTOSENSITIVE MICROCAPSULES

BACKGROUND OF THE INVENTION

1. Field Of The Invention

This invention relates generally to developing apparatus, and more particularly is directed to an apparatus for developing an image or picture on a sheet of developing paper from an exposed sheet of photo-sensitive material by pressing together the sheets.

2. Description of the Prior Art

It is known, for example, as disclosed in Japanese laid-open Patent Gazette No. 59-30537, to print or develop a color picture on a sheet of developing paper from a sheet of photo-sensitive material having a coating of photo-sensitive microcapsules which have been irradiated with a light image of the picture. This known printing method employs, as the photo-sensitive sheet, a base made of a suitable resin on which there is a coating of uniformly distributed yellow, magenta and cyan microcapsules. Each of the yellow, magenta and cyan microcapsules has an outer shell of a relatively soft material in which there is sealed an optically-hardening composition containing a respective pigment or a precursor thereof. When the photo-sensitive microcapsules are irradiated with respective wave lengths of light, the optically-hardening compositions therein are selectively hardened. For example, irradiation with blue light hardens the yellow microcapsules containing the precursor of yellow pigment, irradiation with green light hardens the magenta microcapsules containing the precursor of magenta pigment and irradiation with red light hardens the cyan microcapsules containing the precursor of cyan pigment.

It will be appreciated that, when irradiating the above described sheet of photo-sensitive material with a light image of a color picture, the light of the color picture is suitably analyzed into the three primary colors of red, green and blue and the sheet of photo-sensitive material is irradiated separately with a red light image, a green light image and a blue light image by which the cyan, magenta and yellow microcapsules, respectively, are selectively hardened in accordance with such images. Then, the irradiated or exposed coating of photo-sensitive microcapsules on the sheet of photo-sensitive material is placed in contact with a sheet of developing paper coated with or containing a developing substance, and the contacting sheets are pressed together so as to rupture the shells of the yellow, magenta and cyan microcapsules that were not substantially hardened by irradiation with light of corresponding wave lengths. The substances containing precursors of pigments are transferred from the ruptured microcapsules to the facing surface of the sheet of developing paper and react with the developing substances thereon for developing the respective color pigments from the precursors thereof. Thus, the transferred precursors of pigments from the yellow, magenta and cyan microcapsules are developed into the respective pigments which are suitably mixed to present a printed color picture on the sheet of developing paper.

In a known apparatus for pressing together the sheets of developing paper and photo-sensitive material, as indicated at a on FIG. 1, the sheet c of the photo-sensitive material, which is desirably in the form of a long web or film, and a sheet d of the developing paper are passed together between a pair of vertically superposed cylindrical pressure rollers e and f having axial lengths somewhat greater than the width of the sheets c and d. The lower pressure roller e is rotatably mounted in a suitable support frame (not shown) and rotated by a motor (also not shown). The upper pressure roller is rotatably mounted in a vertically movable frame which is pressed downward by one or more strong resilient members (not shown) so that roller f is pressed downwardly against roller e. A frame or area of the web or sheet c of photo-sensitive material is exposed to a light image before being brought together with the sheet d of developing paper, whereupon the sheets c and d are fed together between the pressure rollers e and f. As the lower roller e is rotated, the upper roller f pressed thereagainst is also rotated so that the sheet c of photo-sensitive material and the sheet d of developing paper are moved together while being pressed between the rollers e and f.

The apparatus a according to the prior art has the advantage of providing a relatively high printing speed by reason of the fact that the sheets of developing paper and photo-sensitive material are pressed together while being continuously transported or advanced by the rotated rollers e and f. However, in the known apparatus a, the rollers e and f act to press together the sheets c and d simultaneously along a stripe-like area extending across the entire width of the sheets. Therefore, in order to provide the requisite pressure at each increment of such stripe-like area for ensuring the rupture of those microcapsules that have not been fully hardened, and further for ensuring the transfer of the precursors of pigments from the ruptured microcapsules to the sheet of developing paper, a very large force must be provided to urge the roller f toward the roller e. For example, in order to rupture the unhardened microcapsules of the sheet of photo-sensitive material and to ensure adequate contact of the released pigment precursors with the developing substances on the sheet of developing paper, it is necessary that the sheet c of photo-sensitive material and the sheet d of developing paper be pressed together with a pressure of 30 to 40 $kg/mm^2$. In the case where, for example, a picture is to be printed on a sheet of developing paper of A4 size which has a width of 21 cm, and the rollers e and f employed for pressing together the sheets c and d each having a diameter of 50 mm, the force urging together the rollers has to be about 57 kg for each cm of roller length, that is, a total force of about b 1200 kg for rollers having lengths of 21 cm. The apparatus a, in order to be capable of applying such a large force for urging together the rollers e and f, must be massive and requires a high-powered motor and transmission mechanism for transmitting the torque the torque to the lower pressure roller e. As a result of the foregoing, the apparatus a is relatively expensive and difficult to assemble and maintain.

In order to overcome the foregoing disadvantages of the known apparatus a, an apparatus b has been proposed which, as shown in FIG. 2, comprises a fixed back-up member g defining an upwardly facing back-up surface g', and a pressing member h having a spherical ball i rotatably mounted at its lower end. The sheets c and d of photo-sensitive material and developing paper, respectively, are brought into contact with each other and transported intermittently across the back-up surface g' in a direction of sheet travel that is transverse to the length of the back-up surface g'. The pressing member h is mounted for reciprocal movements in the direction along the back-up surface g', that is, perpendicular to the direction of sheet travel, between terminal positions $h_1$ and $h_2$, shown in dot-lines of FIG. 2, and at which the pressing member h is situated laterally beyond the side edges of the sheets c and d. During its movements between the terminal positions $h_1$ the back-up surface g', the pressing member h is urged downwardly so that the ball i exerts pressure for urging together the sheets c and d against the back-up surface g' progressively along a narrow pressing region extending across the entire width of the contacting sheets c and d. The described pressing step is effected repetitively with intervening sheet transporting steps during each of which the sheets c and d are incrementally advanced.

Since the ball i of the pressing member h acts, at any time, against only a very small area of the contacting sheets c and d, the requisite pressure for ensuring the rupture of the unhardened microcapsules and the transfer of the released pigment precursors into adequate contact with the developing substances can be achieved with only a moderate force urging the pressing member h toward the back-up surface g'. Thus, the apparatus b can be relatively compact and light in weight. However, the apparatus b is disadvantageous in that its printing speed is low because the developing of the picture is effected by alternating the movements of the pressing member h across the contacting sheets c and d and the intermittent transporting of the sheets c and d of the photo-sensitive material and the developing paper. Furthermore, as shown on FIG. 3A, the contact pressure between the ball i of the pressing member h and the back-up surface g' is not uniform across the width w of the pressing area, as indicated by the pressure distribution curve j. As will be apparent from such curve j, the contact pressure between the ball i and the back-up surface g is highest at the center of the ball and is reduced therefrom toward the opposite sides of the pressing area.

Therefore, the pressure urging together the sheet c of photo-sensitive material and the sheet d of developing paper d is highest at the center of the pressing area and is progressively reduced towards the opposite margins of such area. Therefore, for any particular degree of exposure, more of the microcapsules will be ruptured for releasing the respective pigment precursors along the center of the pressing area than along the opposite side margins thereof. Thus, the concentration of development on the sheet d of developing paper is highest at the center of each of the stripe-like pressing regions and is gradually reduced or diminished toward the opposite edges of each such pressing region or area, as indicated by the successive concentration distribution curves k on FIG. 3B. If the sheets c and d are intermittently transported through an incremental distance or pitch equal to the width w of the stripe-like area of contact of the ball i with the sheet d of developing paper, the printed or developed picture will have a striped pattern resulting from the irregular concentration of development.

Of course, if the incremental movements of the intermittently transported sheets c and d are reduced, for example, if each incremental movement of the sheets c and d is made equal to about one half the width w of the stripe-like area of contact of the ball i with the sheet d of developing paper, the pressing member h will act on the sheets c and d along overlapping pressing areas with the result that the developed or printed picture will have a more uniform concentration of development on the sheet d of developing paper, as indicated by the concentration distribution curves k on FIG. 3C. However, such reduction of the incremental movements of the sheets c and d will very substantially increase the printing or developing time and thereby considerably reduce the printing speed.

In order to reduce the force that needs to be exerted for pressing together the sheets c and d, as compared with the apparatus a of FIG. 1, while increasing the width of the pressing area along which the sheets c and d are pressed together during each stroke or scan across the width thereof, as compared with the apparatus b of FIG. 2, it has been proposed, for example, as in the pending U.S. patent application identified by Curtis, Morris & Safford U.S. Ser. No. 248,373, and corresponding to Japanese Patent Application No. P270758/87, filed Oct. 27, 1987 and having a common assignee herewith, to replace the pressing member h having a rotatable ball i for contact with the sheet d of developing paper, by a rotatable roller 1 (FIG. 4) disposed in opposing relation to the back-up surface g' and having an axis of rotation extending parallel to the direction of travel of the sheets c and d across the back-up surface g'. The roller 1 has a cylindrical peripheral surface and is mounted for bodily movements relative to the back-up member g parallel to the back-up surface g' in directions perpendicular to the direction of intermittent sheet travel, and during such movements of the roller 1, the latter is urged toward the back-up surface g' with the sheets c and d of photo-sensitive material and developing paper being in contact with each other between the roller 1 and the back-up surface g' so as to be pressed together thereby. By reason of the cylindrical peripheral surface of the roller 1, the width of the stripe-like pressing area along which the sheets c and d are pressed together sufficiently to uniformly develop the picture can be substantially increased. Therefore, the printing or developing speed can be increased relative to that of the apparatus b of FIG. 2.

In the apparatus of FIG. 4, during each incremental movement of the sheets c and d, the roller 1 is moved off the contacting sheets c and d to a standby position on the back-up surface g' at one side or the other of the sheets c and d, as shown on FIG. 5. At the completion of each incremental movement of the sheets c and d, the roller 1 is moved from its standby position on the back-up surface g' at one side of the path of travel of the sheets c and d laterally across the contacting sheets in a pressing step to a standby position on the back-up surface g' adjacent the opposite sides of the sheets c and d, whereupon an incremental movement of the sheets c and d is effected in another sheet transporting step. Thus, the sheet pressing and transporting steps are alternately performed in a repetative manner and, due to the relatively wide area along which the roller 1 can exert the requisite pressure against the contacted sheets c and d during each pressing step, a sufficiently high printing or developing speed can be realized. However, the contacting sheets c and d have a substantial thickness and, as shown on FIG. 5, the opposite side edges of the contacting sheets extend upwardly from the back-up surface g' at the standby positions of the roller 1. Therefore, each time the roller 1 is rolled onto or off the contacting sheets c and d from or to, respectively, a standby position of the roller on the back-up surface g', the roller 1, in effect, rolls over a step and thereby generates objectionable noise. Further, there is the likelihood that, in moving from a standby position on the back-up surface g' onto the contacting sheets c and d, the roller 1 will damage the side edges of the developing paper and the photo-sensitive material, or even that the roller 1, in colliding with the raised side edges of the sheets c and d, will have its rolling movement halted thereby.

OBJECTS AND SUMMARY OF THE INVENTION

Accordingly, it is an object of the present invention to provide an improved developing apparatus which avoids the above described disadvantages of the prior art.

More specifically, it is an object of this invention to provide an apparatus for developing a picture on a sheet of developing paper from a sheet of photo-sensitive material by pressing together the sheets and which permits the apparatus to be of relatively small size and low cost while reliably achieving developing of the picture at an acceptably high speed.

Another object of the invention is to provide a developing apparatus, as aforesaid, which provides a uniform developing concentration.

Still another object of this invention is to provide a developing apparatus, as aforesaid, which prevents damage to the sheets of developing paper and photo-sensitive material, and which further avoids the generation of objectionable noise during operation of the apparatus.

It is still another object of this invention to provide a developing apparatus, as aforesaid, in which the sheets of developing paper and photo-sensitive material in contact with each other are intermittently transported in a predetermined direction of sheet travel across a back-up surface and, during each interval when the sheets are at rest on the back-up surface, a rotatable roller is transported along the back-up surface at a substantial angle to the direction of sheet travel while being urged toward the back up surface for pressing together the sheets between the roller and back-up surface, and in which the back-up surface has raised guide shoulders at its opposite ends for guiding the adjacent side edges of the sheets and thereby preventing relative shifting thereof during the pressing together of the sheets or the intermittent transport thereof.

Still another object of this invention is to provide a developing apparatus, as aforesaid, in which two contacting sheets, for example, of developing paper and photo-sensitive material, respectively, which are of different hardness or rigidity, can be transported, in contact with each, across a curved back-up surface without being displaced relative to each other.

Still another object of this invention is to provide a developing apparatus, as aforesaid, in which the pressure exerted on the contacting sheets of developing paper and photo-sensitive material between a back-up surface and a roller transported there-across is substantially uniformly distributed so as to achieve clear development of a picture without irregular concentrations of the development thereof.

It is a further object of this invention to provide a developing apparatus, as aforesaid, in which self-alignment is achieved in respect to the back-up surface and roller between which the contacting sheets of developing paper and photo-sensitive material are pressed together, thereby reducing the accuracy required in the assembly and adjustment of the respective parts.

It is a further object of this invention to provide a developing apparatus, as aforesaid, in which a force required for pressing together the sheets of developing paper and photo-sensitive material against a back-up surface is minimized so as to make possible the provision of a relatively low cost apparatus that is compact and light in weight.

It is a still further object of this invention to provide a developing apparatus, as aforesaid, which minimizes the frictional resistance to the intermittent transportation of the sheets of developing paper and photo-sensitive material across a back-up surface so as to avoid irregular movements of the sheets that adversely affect uniform development.

In accordance with an aspect of this invention, in an apparatus for developing a picture on a sheet of developing paper from a sheet of photo-sensitive material by pressing together the sheets, and in which the sheets of developing paper and photo-sensitive material are intermittently transported in contact with each other in a predetermined direction of sheet travel across a back-up surface, and a rotatable roller disposed in opposing relation to the back-up surface and having its axis of rotation extending substantially at right angles to a longitudinal median of the back-up surface is transported relative to the back-up surface in directions parallel to the longitudinal median thereof while the roller is urged toward the back-up surface with the sheets of developing paper and photo-sensitive material therebetween so as to be pressed together at a relatively narrow stripe-like area defined by the rolling path of the peripheral surface of the roller; standby surfaces extend from the opposite ends of the back-up surface and are raised relative to the latter for defining shoulders therebetween by which the sheets are guided in being transported across the back-up surface, and the roller is situated on one or the other of the standby surfaces during the transporting of the sheets and, when the sheets are at rest, the roller rolls smoothly from one to the other of the standby surfaces and across the contacting sheets therebetween.

In accordance with a feature of this invention, the sheet of photo-sensitive material which is more rigid or harder than the sheet of developing paper is arranged to contact the back-up surface while the roller which exerts the pressure rolls across the relatively soft sheet of developing paper in being transported from one to another of the standby surfaces.

In accordance with another feature of this invention, the back-up surface and the roller are configured so that, during the transporting of the roller across the back-up surface from one to another of the standby surfaces, the contact pressure between the peripheral surface of the roller and the back-up surface is smaller at the opposite margins of such peripheral surface than at any other portions of the latter between such margins.

In accordance with still another feature of this invention, at least one of the back-up surface and the peripheral surface of the roller is formed with minute concave and convex surface irregularities distributed thereover so that the force urging the roller toward the back-up surface causes contact pressure to be applied to the sheets of developing paper and photo-sensitive material at the localized areas defined by the convex surface irregularities. Thus, the requisite, relatively high contact pressures can be achieved by only moderate forces urging the roller toward the back-up surface.

In accordance with a further feature of this invention, first and second rotatable rollers are assembled together in tandem so that such rollers successively press together the sheets of developing paper and photo-sensitive material between the rollers and the back-up surface across which the sheets of developing paper and photo-sensitive material are intermittently transported.

In accordance with yet a further feature of this invention, either the back-up member defining the back-up surface or the roller or assembly of rollers is provided with a self-aligning mounting for automatically attaining a desired attitude of the peripheral surface of each roller relative to the back-up surface.

The above, and other objects, features and advantages of the present invention, will be apparent in the following detailed description of preferred embodiments thereof which is to be read in conjunction with the accompanying drawings wherein corresponding elements and parts are identified by the same reference numerals in the several views of the drawings.

BRIEF DESCRIPTION OF THE DRAWINGS

FIG. 13 is a block diagram of a circuit used for controlling the the developing apparatus of FIGS. 6-12;

FIG. 14 is elevational view similar to that of FIG. 5, which reference will be made in explaining the advantageous operations of the developing apparatus of FIGS. 6-13;

FIG. 39 is an enlarged schematic sectional view illustrating the manner in which the back-up surface of FIG. 38 is effective to concentrate the application of pressure to the sheets; and FIG. 40 is a fragmentary perspective view similar to that of FIG. 38, but showing a back-up member with a back-up surface thereon in accordance with still another embodiment of the invention.

DETAILED DESCRIPTION OF THE PREFERRED EMBODIMENTS

Figure 7:
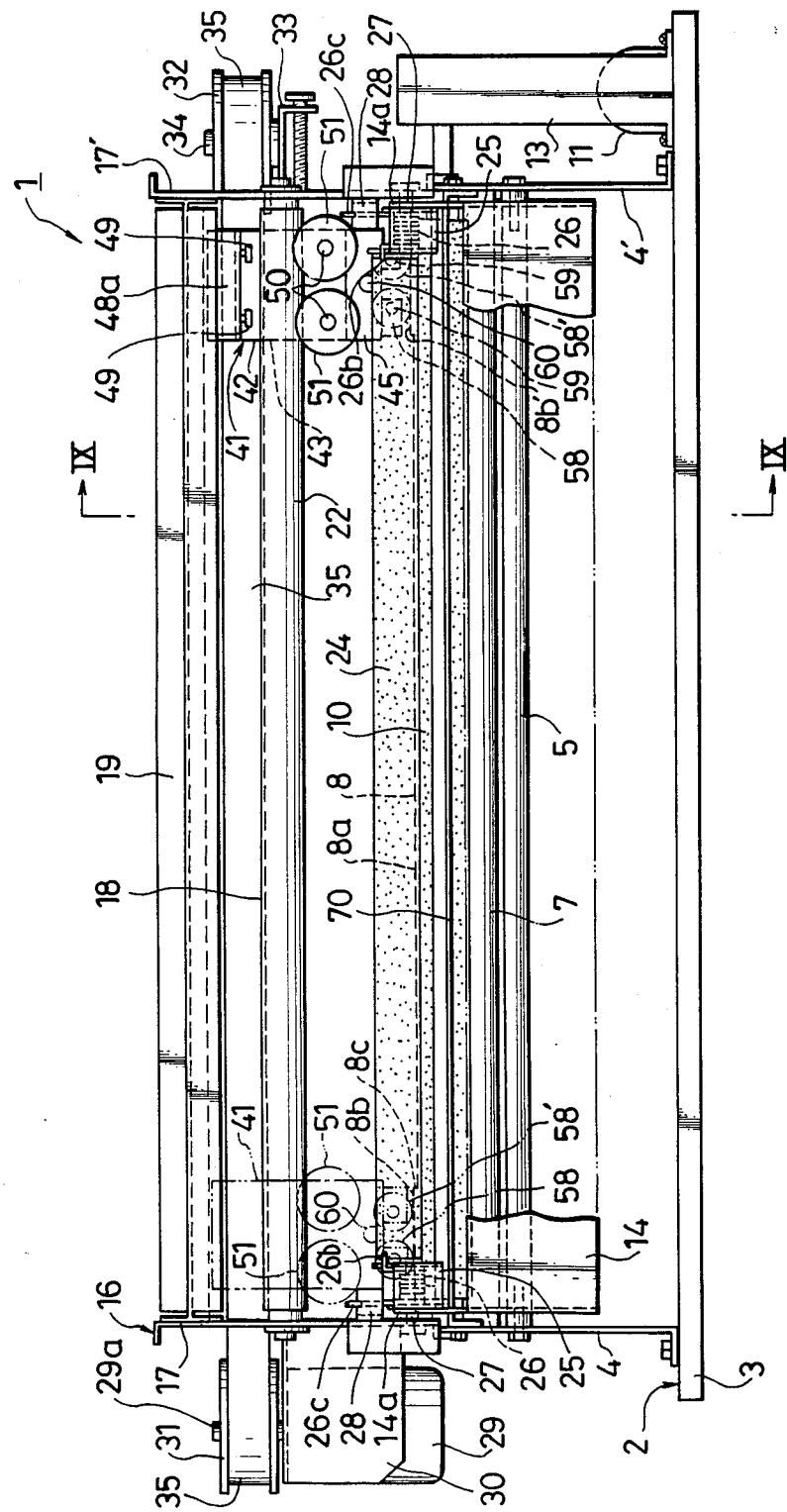
FIG. 7 is a front elevational view of the developing apparatus of FIG. 6.
Figure 8:
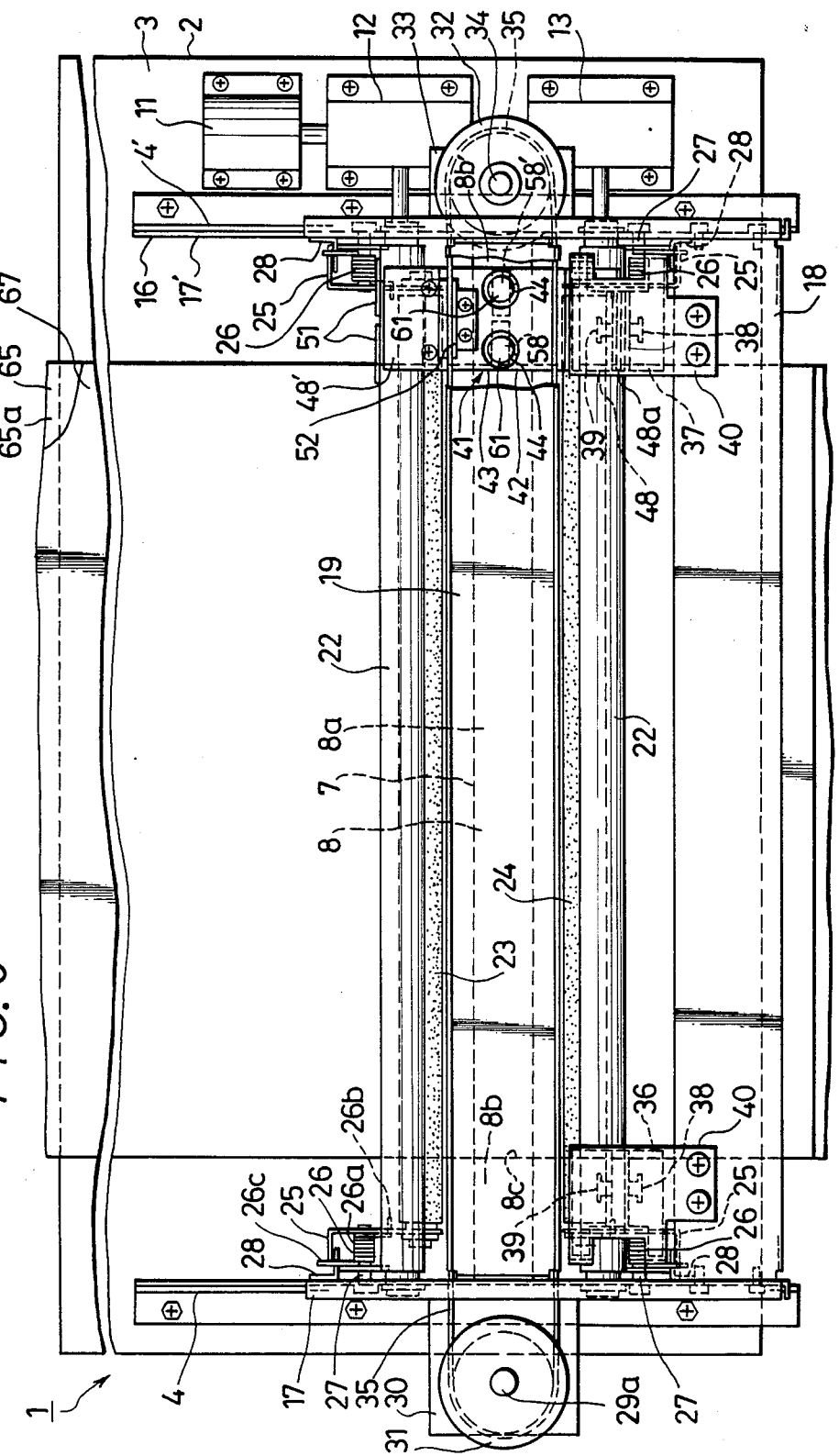
FIG. 8 is a top plan view of the apparatus of FIGS. 6 and 7.
Figure 9:
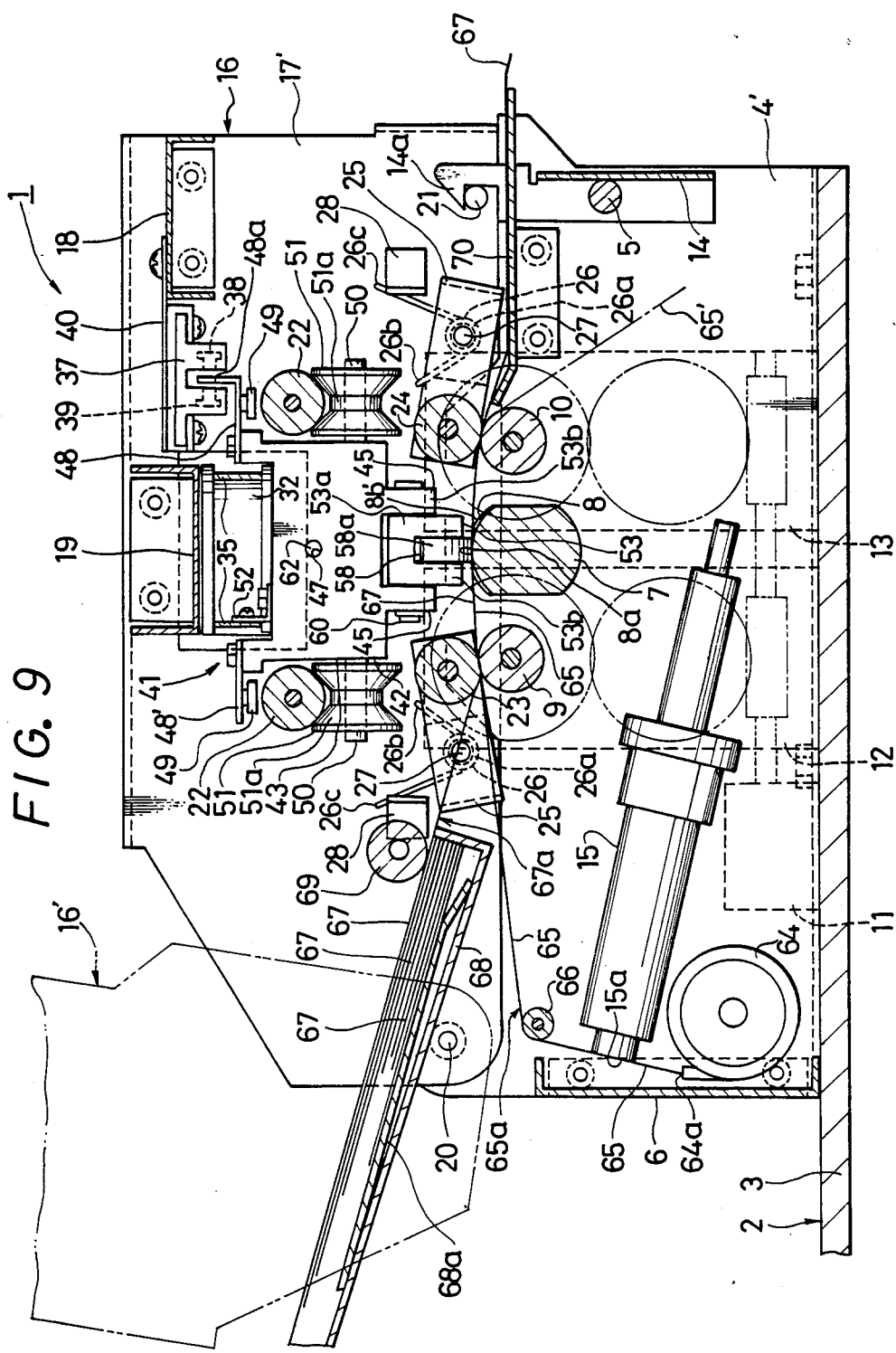
FIG. 9 is a sectional view taken along the line IX—IX on FIG. 7.

Referring to the drawings in detail, and initially to FIGS. 7, 8 and 9 thereof, it will be seen that a developing apparatus or printer 1 according to an embodiment of the present invention generally comprises a lower frame structure 2 formed of a base plate 3 of substantially rectangular shape and side walls 4 and 4' extending upwardly from the opposite side portions of the base plate 3. A cylindrical bar 5 extends horizontally between and connects front end portions of the side walls 4 and 4' at a vertical position that is approximately ⅔ the distance from the base plate 3 to the upper edges of the side walls 4 and 4', and a rear wall 6 of the frame structure 2 extends between and connects the rear end portions of the side walls 4 and 4' (FIG. 9).

An elongated back-up member 7 of a relatively hard metal extends laterally between, and is suitably fixed at its ends to the side walls 4 and 4' of the frame structure 2. The back-up member 7 is shown to be located at a level near the top of the lower frame structure 2 and is positioned intermediate the front and back of the latter.

Figure 6:
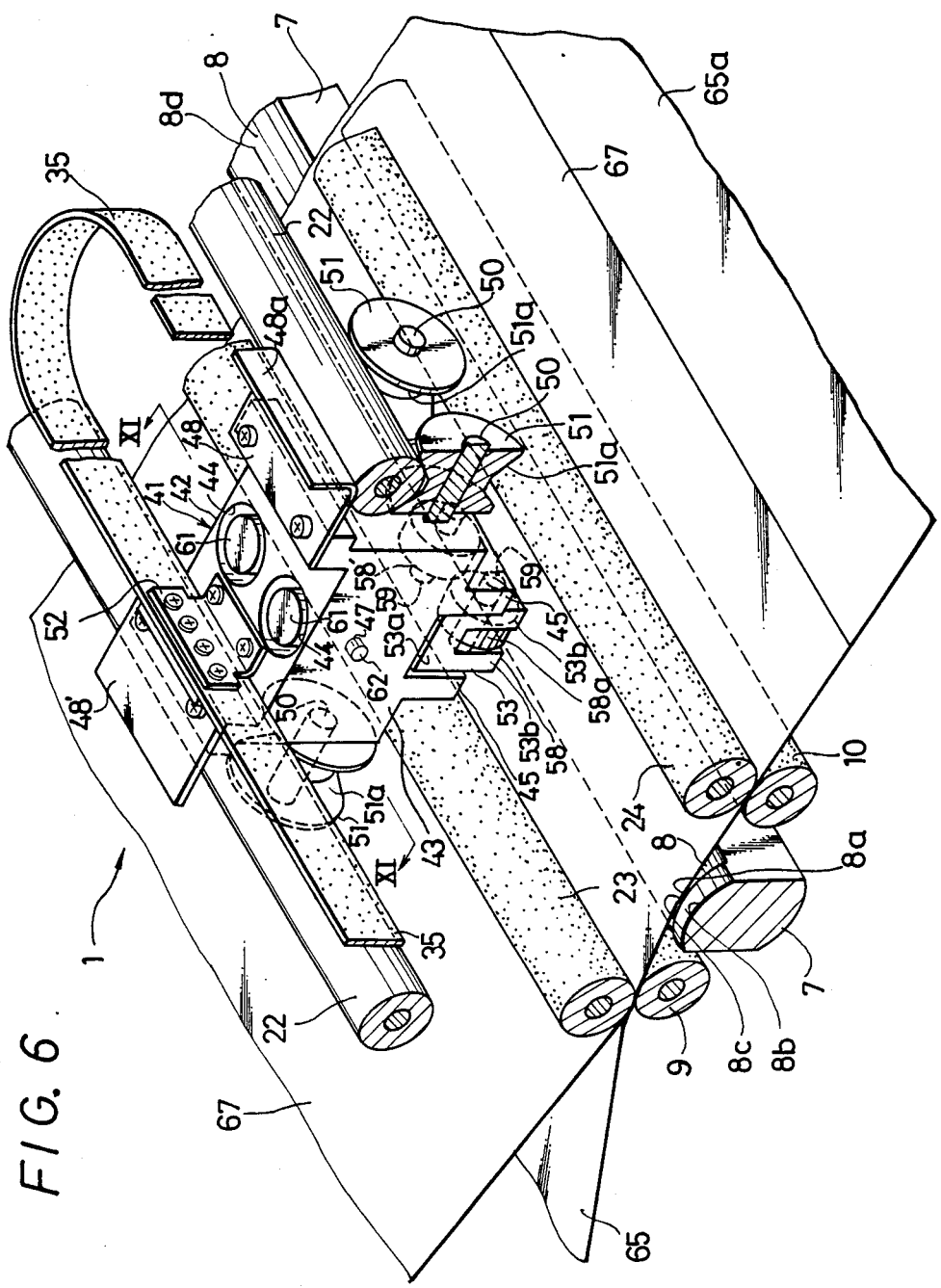
FIG. 6 partly cut-away perspective view of the major components of a developing apparatus in accordance with a first embodiment of the present invention.

As shown on FIGS. 6 and 9, the back-up member 7 desirably has a vertically elongated cross-section so as to form a beam that is strongly resistant to flexing under loads applied from above. Such vertically elongated cross-section may be substantially eliptical or, as shown in FIGS. 6 and 9, at least an upper surface 8 of the back-up member 7 is upwardly convex and has a rectilinear generatrix extending parallel to the longitudinal axis of the back-up member 7. More specifically, the upper surface 8 may be defined by a circular arcuate portion of the cross-section of the member 7 which is highest at the longitudinal median 8d (FIG. 6) of the back-up member 7 and which may, for example, have a radius of curvature of about 10 mm.

In accordance with the present invention, the upper surface 8 of the back-up member 7 is divided to provide a back-up surface 8a having a length, measured in the lateral direction of the apparatus 1, corresponding to the width of the sheets of developing paper and photo-sensitive material to be employed in the apparatus, and standby surfaces 8b extending from the opposite ends of the back-up surface 8a and being raised relative to the latter for defining guide shoulders 8c at the ends of the back-up surface 8a, as particularly shown on FIG. 14. The height of the guide shoulders 8c at the opposite ends of the back-up surface 8a is preferably selected to be approximately equal to the combined thickness of the developing paper and photo-sensitive material to be pressed together against the back-up surface 8a.

A drive or feed roller 9 extends parallel to the back-up member 7 in back of the latter with a relatively small spacing therebetween and with the top of the feed roller 9 being located below the upper surface 8 of the back-up member 7. A tension roller 10 is similarly disposed in front of the back-up member 7, and the feed and tension rollers 9 and 10 are rotatably supported at their respective ends by the side walls 4 and 4'. The rollers 9 and 10 are driven to rotate at predetermined times, as hereinafter described in detail, in the clockwise direction, as viewed on FIG. 9, by means of a sheet transporting motor 11 mounted on the base plate 2 and connected with the rollers 9 and 10 through suitable speed reduction mechanisms 12 and 13 (FIGS. 8 and 9). During each of the intermittent or incremental operations of the sheet transporting motor 11, the feed roller 9 is rotated at a slightly slower speed than the tension roller 10 so that sheets of developing paper and photo-sensitive film or material being transported by the rollers 9 and 10 are slightly tensioned therebetween.

A locking member 14 (FIGS. 7 and 9) extends between side walls 4 and 4' at the front of the lower frame structure 2 and has end flanges pivotably supported on the cylindrical bar 5 and terminating at their upper ends, in locking claws 14a for a purpose described below.

A light source 15, which is desirably formed of a bundle of numerous optical fibers and hereinafter referred to as an "FOT" (FIG. 9), is suitably mounted within the lower frame structure 2 in back of and below the back-up member 7 and has a light-emitting surface 15a facing rearwardly for use in exposing a sheet or frame of photo-sensitive film or material as hereinafter described in detail.

The apparatus 1 is further shown to comprise a movable upper frame structure 16 (FIGS. 7–9) composed of opposite side walls 17 and 17' spaced apart laterally by substantially the same distance as the side walls 4 and 4' of the lower frame structure 2, and cross members 18 and 19 which extend between, and connect upper portions of the side walls 17 and 17'. The side walls 17 and 17' are rotatably mounted, at their lower back ends, on pivots 20 extending from side walls 4 and 4' at the upper back ends of the latter. Thus, the upper frame structure 16 is pivotally movable between the horizontal operative position shown in full lines on FIG. 9 and the upwardly pivoted open position indicated in dot-lines at 16' on FIG. 9. Locking pins 21 extend inwardly from the side walls 17 and 17' adjacent the lower front portions thereof (FIG. 9) and are engageable by the locking claws 14a of the locking member 14 for securing the upper frame structure 16 in its operative horizontal position.

Figure 12:
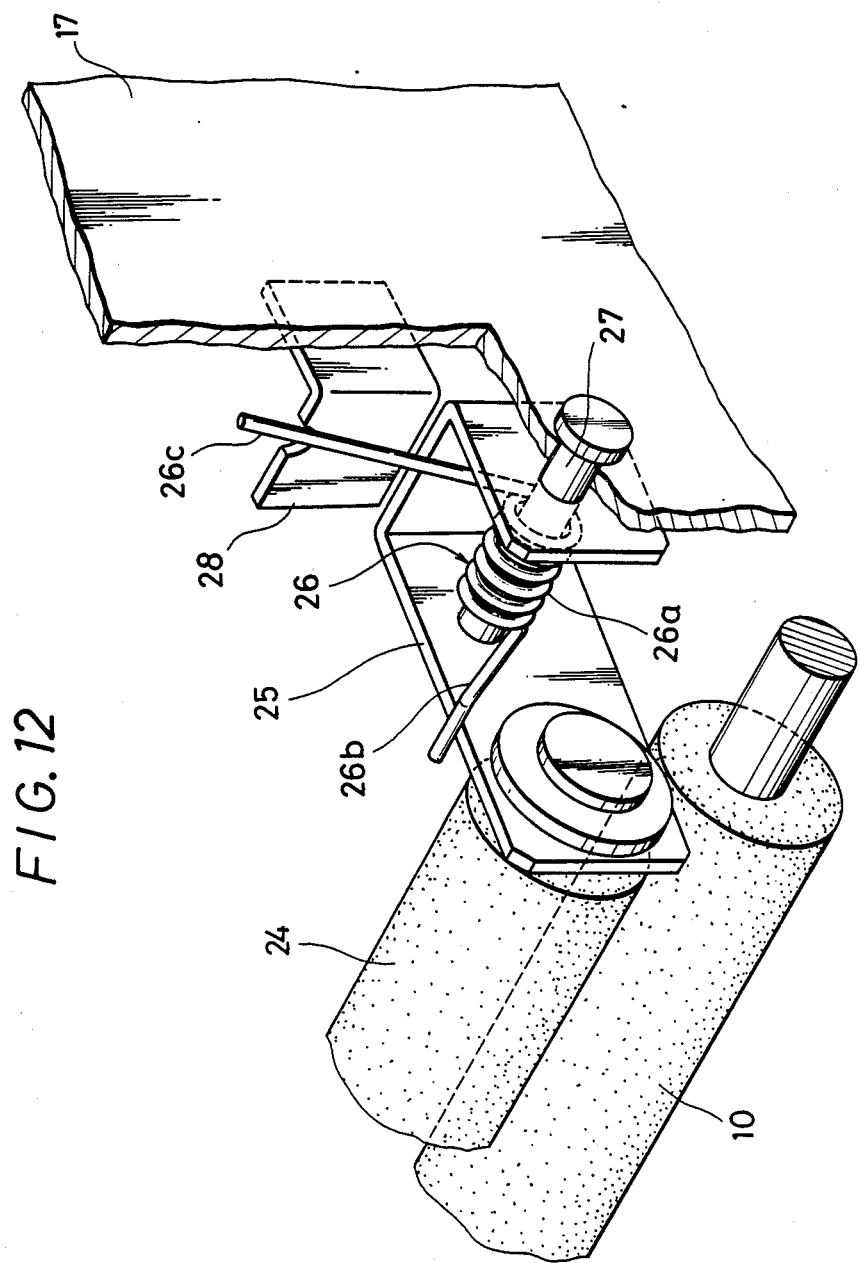
FIG. 12 is an enlarged, fragmentary perspective view showing detail mounting of sheet feed rolls in the developing apparatus of FIGS. 6-11.

Cylindrical guide shafts 22 extend parallel to each other laterally across the upper frame structure 16 and are suitably mounted, at their opposite ends, on the side walls 17 and 17'. The guide shafts 22 are spaced apart and located so that, in the operative position of the movable upper frame structure 16, the guide shafts 22 will be disposed equal distances in front and in back of a vertical plane extending through the longitudinal median of the back-up member 7. The upper frame structure 16 also has mounted therein two follow-up or sheet-guiding rollers 23 and 24 which are mounted, as hereinafter described in detail, so as to press downwardly from above on the feed roller 9 and the tensioning roller 10, respectively, when the frame structure 16 is in its operative position. As shown particularly on FIGS. 9 and 12, the opposite ends of the rollers 23 and 24 are rotatably carried by free end portions of respective support arms 25 which are, in turn, pivoted on support pins 27 extending from the adjacent side walls 17 and 17'. A torsion spring 26 is associated with each of the support arms 25 and includes a coil portion 26a mounted on the respective pin 27 and spring arms 26b and 26c which respectively bear against the associated support arm 25 and a spring abutment 28 extending from the adjacent side wall 17 or 17'. Each torsion spring 26 is effective to angularly urge the respectiv support arm 25 in the direction for urging the mounted roller 23 or 24 downwardly toward the underlying roller 9 or 10, respectively.

A reversible motor 29 is supported, with its shaft 29a extending vertically upward, in a mounting bracket 30 directed outwardly from the side wall 17 of the movable frame structure 16. A drive pulley 31 is secured to the upper end of the motor shaft 29a and, as shown on FIG. 8, is positioned approximately midway between the axes of the guide shafts 22, but at a level slightly higher than the latter. A driven pulley 32 is rotatably mounted on a shaft 34 which is carried by a support bracket 33 extending outwardly from the side wall 17' and which is substantially in lateral alignment with the motor shaft 29a. An endless drive belt 35 extends around the pulleys 31 and 32 for transporting a carriage and roller assembly 41 along the guide shafts 22, that is, in directions parallel to the longitudinal axis of the back-up member 7, as hereinafter described in detail.

Sensors 36 and 37 (FIG. 8) are mounted on the cross member 18 of the movable frame structure 16 adjacent the side walls 17 and 17', respectively, for detecting when the carriage and roller assembly 41 has attained the opposite extreme end positions within its range of travel between the side walls 17 and 17'. Each of the sensors 36 and 37 has a light-emitting element 38 and a light receiving element 39 positioned opposite each other and carried by a support member 40 suitably secured to a respective end portion of the cross member 18.

Figure 10:
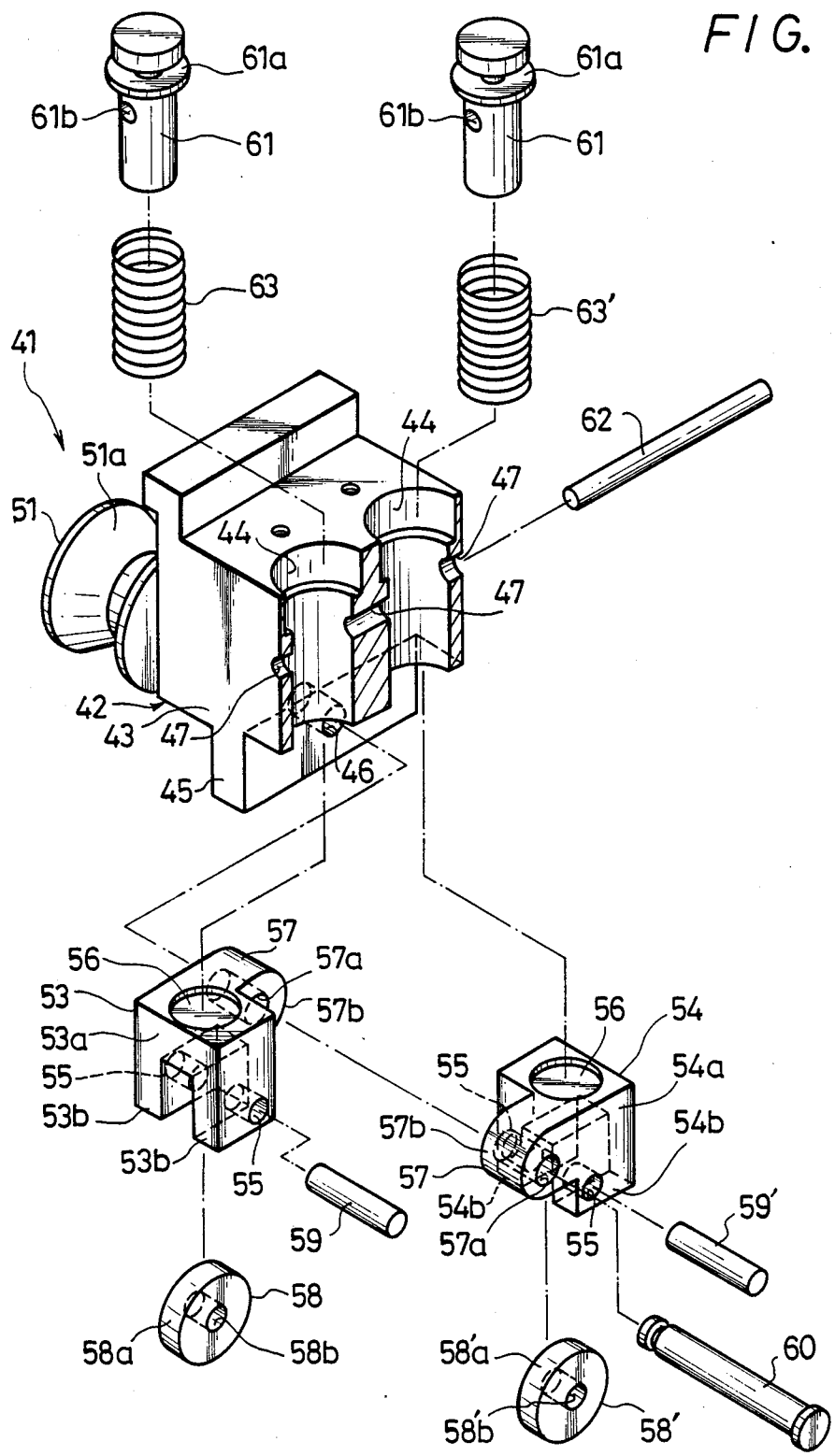
FIG. 10 is a partly cut-away, exploded perspective view of a carriage and roller assembly included in the apparatus of FIGS. 6-9.
Figure 11:
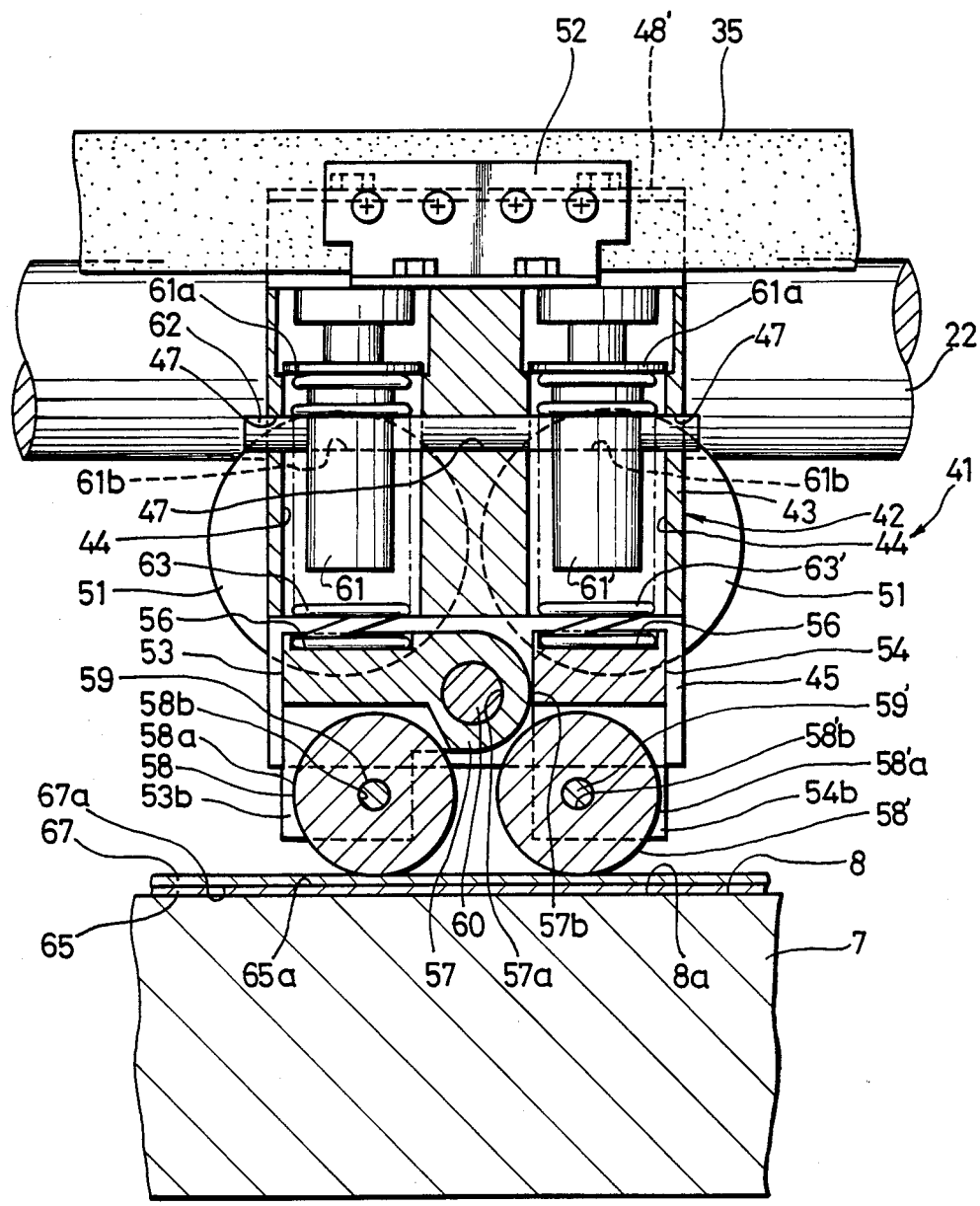
FIG. 11 is an enlarged sectional view of the carriage and roll assembly taken along the line XI—XI on FIG. 6.

The carriage and roller assembly 41 is shown on FIGS. 10 and 11 to include a carriage 42 comprised of a generally block-shaped body 43 having parallel, spaced apart flanges 45 depending from the bottom of the body 43, and a pair of through-bores 44 extending vertically through the mid-portion of the body 43 between the flanges 45 and being arranged in tandem parallel to the direction in which the flanges 45 extend. The spaced apart flanges 45 have aligned holes 46 extending therethrough at locations midway along the lengths of the flanges 45. Further, a through hole 47 is bored through the body 43 in the direction at right angles to the holes 46 and at a location to diametrically intersect the bores 44 at locations approximately midway between the open upper and lower ends of the bores 44.

As shown on FIG. 9, cover members 48 and 48' extend forwardly and rearwardly from the top of the body 43 of the carriage 42 and are dimensioned to extend over the guide shafts 22 when the body 43 is situated between the shafts 22. Projections 49 depend from the cover members 48 and 48' so as to be positioned above the guide shafts 22 with a small clearance therebetween when the carriage and roller assembly 41 is mounted within the frame structure 16. The cover member 48 extending forwardly from the carriage body 43 has an integral flange 48a directed upwardly therefrom to form a light shield which cooperates with the sensors 36 and 37, as hereinafter described.

As shown particularly on FIGS. 6 and 7, pairs of parallel spaced apart axles 50 extend forwardly and rearwardly, respectively, from the carriage body 43, and guide rollers 51 are rotatably mounted on such axles 50 and have relatively deep, V-shaped peripheral grooves 51a which engage, from below, the guide shafts 22 disposed in front and in back of the carriage body 43.

Thus, the carriage 42 is free to move laterally, that is, in directions parallel to the longitudinal axis of the back-up member 7 with the guide rollers 51 being engageable, from below, with the guide shafts 22, and with the projections 49 of the cover members 48 and 48' opposing the upper surfaces of the guide shafts 22 with a small clearance therebetween. Further, a connecting member 52 is secured to the top surface of the carriage body 43 and is connected to a run of the belt 35 between the pulleys 31 and 32 so that the carriage 42 is moved laterally in one direction or the other in response to operation of the motor 29 for rotating its shaft 29a in either a forward or reverse direction.

As shown particularly on FIGS. 10 and 11, the carriage and roller assembly 41 further includes roller support arms 53 and 54 having block-shaped major portions 53a and 54a, respectively. These major portions 53a and 54a of the roller support arms are formed with respective downwardly opening central cutouts so as to divide the lower parts of the major portions 53a and 54a into bifurcated depending parts 53b and 54b, respectively, which are formed with aligned holes 55 extending therethrough. The top-surfaces of the block-shaped major portions 53a and 54a are formed with shallow circular recesses 56. Further, the major portions 53a and 54a of the roller support arms 53 and 54, respectively, have oppositely offset, integral projections 57 extending therefrom and formed with through holes 57a parallel with the previously mentioned holes 55. Each of the projections 57 has a semi-cylindrical end surface portion 57b which is coaxial with the respective through hole 57a. The support arms 53 and 54 are dimensioned so that the major portions 53a and 54a thereof can fit between the depending flanges 45 of the carriage 42 with the projections 57 of the support arms 53 and 54 being arranged side by side and having their through holes 57a axially aligned with each other and with the holes 46 in the flanges 45. A single shaft 60 extends through the holes 46 in the flanges 45 and through the holes 57a in the projections 57 of the support arms 53 and 54 so as to pivotally mount the support arms 53 and 54 for rocking about the axis of the support shaft 60.

Pressing rollers 58 and 58' of disk shape are provided with a thickness or axial dimension about ¼ the width of the back-up surface 8a, for example, a width of about 4 mm, and are made of a metal of substantially high hardness. The outer peripheries 58a and 58'a of the pressing rollers 58 and 58' are cylindrical, that is, each of the peripheral surfaces 58a and 58'a has a rectilinear generatrix extending parallel to the axis of the respective roller. The pressing rollers 58 and 58' are further formed with central, axially extending bores 58b and 58'b which rotatably receive respective axles 59 and 59'. With the pressing rollers 58 and 58' located between the bifurcated lower portions 53b and 54b, respectively, of the roller support arms 53 and 54, the axles 59 and 59' are press fitted in the holes 55 and extended loosely through the bores 58b and 58'b of the pressing rollers 58 and 58'. Therefore, the pressing rollers 58 and 58' are rotatably supported by the arms 53 and 54 with the axes of rotation of the rollers 58 and 58' being spaced apart at opposite sides of the pivoting axis defined by the shaft 60, and with the resulting tandem-arranged rollers 58 and 58' having their lower portions projecting downwardly from the support arms 53 and 54 for rolling engagement with sheets backed-up by the surface 8a of the back-up member 7, as hereinafter described.

Substantially cylindrical spring bearings 61 and 61' are provided, near their upper ends, with flanges 61a, and are loosely received in the holes 44 through the open upper ends of the latter. The spring bearings 61 and 61' extending therethrough below the flanges 61a. Helical compression springs 63 and 63' are arranged around the spring bearings 61 and 61', respectively, and bear at their upper ends against the flanges 61a on the respective spring bearings 61 and 61', while the lower ends of the springs 63 and 63' seat in the circular recesses 56 in the top surfaces of the roller support arms 53 and 54, respectively. A single support pin 62 passes through the diametrical bores 61b in the spring bearings 61 and 61' and is press fitted in the holes 47 provided in the body 43 of the carriage 42, thereby fixedly positioning the spring bearings 61 and 61' within the respective holes 44. Such positioning of the spring bearings 61 and 61' is effective to compress the springs 63 and 63' so that the latter urge the roller support arms 53 and 54 to rock downwardly about the shaft 60, and thereby urge the pressing rollers 58 and 58' =downwardly against the upper surface 8 on the back-up member 7. The main portions 53a and 54a of the roller support arms 53 and 54 desirably are provided with stop members (not shown) projecting from their confronting surfaces for limiting downward swinging movements of the support arms 53 and 54 when such movements are not limited by engagement of the rollers 58 and 58' with the back-up member 7. Thus, for example, when the movable upper frame structure 16 is in its raised inoperative position, the stop member extending from each of the support arms 53 and 54 is engageable with the confronting surface of the other of such support arms for limiting the swinging movements of the arms 53 and 54 by the springs 63 and 63', and thereby preventing inadvertent downward ejection of the springs 63 and 63' from the respective holes 44.

When the upper frame structure 16 is moved downwardly from its inoperative position indicated at 16' on FIG. 9, the pressing rollers 58 and 58' depending from the carriage 42 are engaged with the upper surface 8 of the back-up member 7 prior to the arrival of the frame structure 16 at its operative horizontal position. Thus, during the final increment of swinging movement of the frame structure 16 downwardly to its operative position at which it is locked by the engagement of the locking claws 14a with the locking pins 21, the support arms 53 and 54 are displaced angularly upward relative to the body 43 of the carriage 42 against the force of the compression springs 63 and 63'. Therefore, with the upper frame structure 16 locked in its operative horizontal position, the pressing rollers 58 and 58' are pressed downwardly by the springs 63 and 63' against the upper surface 8 of the back-up member 7 and, in reaction thereto, the carriage 42 is urged upwardly so that the guide rollers 51 are pressed against the lower sides of the guide shafts 22. Of course, during the movement of the carriage 42 laterally along the guide shafts 22 by the belt 35 in response to the operation of the motor 29 in one direction or the other, the pressing rollers 58 and 58' roll in tandem, that is, one after the other, along the upper surface 8 of the back-up roller 7 with the longitudinal median 8d (FIG. 6) of the upper surface 8 of the back-up member being centered in respect to the width of the peripheral surfaces 58a and 58'a of the pressing rollers and at right angles to the axes of rollers 58 and 58'

When the carriage and roller assembly 41 reaches a position at one end of its movable range, that is, a position adjacent the side wall 17 of the upper frame structure 16, the light shield 48 extending from the carriage 42 is interposed between the light-emitting element 38 and the light-receiving element 39 of the sensor 36 and the resulting interruption of the reception of light by the element 39 is detected as an indication of the arrival of the carriage and roller assembly 41 at that one end position. Similarly, when the carriage and roller assembly 41 attains the other end position adjacent to the side wall 17' of the upper frame structure 16, the light shield 48 is then interposed between the light-emitting element 38 and the light-receiving element 39 of the sensor 37 and the resulting interruption in the reception of light by the element 39 of the sensor 37 is detected as an indication that the carriage and roller assembly 41 has attained its other end position.

In the apparatus 1 embodying this invention, the sheet of photo-sensitive material is shown to be in the form of a long photo-sensitive film 65 which is unwound from a reel within a film cassette 64 (FIG. 9) suitably disposed within the lower rear portion of the lower frame structure 2 with the axis of its reel extending laterally and with a film outlet 64a of the cassette directed upwardly. The photo-sensitive film 64 drawn out of the outlet 64a of the cassette 64 is directed upwardly past the light-emitting surface 15a of the FOT 15 and then around a film guide roller 66 and forwardly from the latter so as to pass in succession between the drive or feed roller 9 and the sheet-guiding roller 23, over the back-up surface 8a of the back-up member 7, and between the tension roller 10 and the sheet-guiding roller 24 prior to being directed downwardly and rewound on a take-up reel or spool (not shown).

As was earlier described in connection with the prior art, the photo-sensitive film 65 may be formed of an appropriate transparent film base with one side, indicated at 65a on FIG. 9 and hereinafter referred to as the exposure side, being coated with an infinite number of microcapsules or particles of a suitable resin which contain respective pigment precursors and which are optically hardened when exposed to light images of corresponding wavelengths. The hardened microcapsules are substantially indestructible even when subjected to substantial pressures, but those microcapsules which have not been hardened can be crushed or ruptured by pressure to release the corresponding color precursors which can then chemically react with developing substances or agents for providing the corresponding colors or pigments. The developing substances or agents are coated on one side 67a, hereinafter referred to as the developing side, of sheets 67 of developing paper on which color pictures or images are to be printed.

As will be seen on FIG. 9, the photo-sensitive film 65 has its exposure side 65a facing upwardly as the film travels forwardly from the guide roller 66 and into the nip between the feed roller 9 and sheet guiding roller 23.

On the other hand, the sheets 67 of developing paper which are rectangular and may have a width slightly larger than that of the photo-sensitive film 65, are stacked in a paper supply tray or magazine 68 with the developing sides 67a of the sheets 67 facing downwardly. The paper supply tray 68 is suitably mounted within the upper frame structure 16 above the pivoting axis of the latter defined by the pivots 20 and, in the operative position of the upper frame structure 16, the paper supply tray 68 is inclined downwardly in the forward direction. A paper supply roller 69 is suitably mounted above the forward end portion of the paper supply tray 68 and a resilent bottom member or sheet lifter 68a is provided within the tray 68 below the stack of sheets 67 therein for urging such stack upwardly and thereby causing frictional engagement of the topmost sheet 67 in the stack with the paper supply roller 69.

During a printing or developing operation of the apparatus 1, the paper supply roller 69 is suitably driven so that the sheets 67 of developing paper are delivered one at a time from the tray 68 in a path converging with the path of the photo-sensitive film 65 extending forwardly from the guide roller 66. Thus, each supplied sheet 67 has its downwardly facing developing side 67a contacted with the upwardly facing exposure side 65a of the film 65 for feeding with the latter between the feed or drive roller 9 and the sheet guiding roller 23 and onto the back-up surface 8a of the back-up member 7. After having been pressed together against the back-up surface 8a by means of the rollers 58a and 58'a, as hereinafter described in detail, the film 65 and a sheet 67 of developing paper are fed together between the tensioning roller 10 and the respective sheet guiding roller 24 whereupon the film 65 is diverted downwardly, for example, as indicated schematically at 65' while the sheet 67 having the developed or printed color image or picture thereon is suitably stripped from the film and passed out of the apparatus 1 along a paper discharge guide plate 70 at the front of the apparatus.

Referring now to FIG. 13, it will be seen that a circuit for controlng the operations of the motor 11 for intermittently transporting the photo-sensitive film 65 and the successive sheets 67 of developing paper and of the motor 29 for effecting movements of the carriage and roller assembly 41 laterally along the back-up member 7 generally comprises monostable multi-vibrators 71L and 71R which are triggered in response to the reception of detection signals from the sensors 36 and 37, respectively. In other words, the monostable multi-vibrators 71L and 71R are selectively operative to produce pulses of a predetermined pulse width 36 and 37, respectively. Such signal of logic level [1] is obtained from the sensor 36 or 37 when the latter detects the arrival of the carriage and roller assembly 41 at the respective one of its end positions at which the rollers 58 and 58' are situated on the respective one of the stand-by surfaces 8b of the back-up member 7, and thus are removed from the sheet 67 and film 65 carried by the back-up surface 8a. The pulse of a predetermined pulse width from the monostable multi-vibrator 71L or 71R is transmitted through an OR circuit 72 to a motor drive circuit 73 for the motor 11. Thus, the sheet transporting motor 11 is operated for a period of time determined by the width of a pulse from the monostable multi-vibrator 71L or 71R and, during such period of time, the motor 11 causes transport of the photo-sensitive film 65 and the developing paper sheet 67 through a predetermined increment of movement.

As earlier noted, each of the sensors 36 and 37 produces a signal of logic level [1] for triggering the respective monostable multi-vibrator 71L or 71R when the light shield 48a on the carriage 42 is interposed between the light-emitting and light-receiving elements 38 and 39 of the respective sensor 36 or 37, that is, when the carriage and roller assembly 41 reaches the respective end position in its range of movements. On the other hand, the sensors 36 and 37 output a signal of logic level [0] whenever the light shield 48a is removed from between the light-emitting and light-receiving elements 38 and 39 of the respective sensor.

The control circuit of FIG. 13 is further shown to include an OR circuit 74 which is supplied with the outputs from the sensors 36 and 37 and has its output connected to the input of a flip-flop circuit 75 which has its output supplied to a motor drive circuit 76 for the motor 29 by across the film 65 and sheet 67 on the back-up surface 8a from one to the other of the opposite end positions of the assembly 41. The flip-flop circuit 75 provides an output which is alternatively positive or negative polarity for causing forward or reverse operation, respectively, of the motor 29 in response to successive outputs from the OR circuit 74. In other words, in response to each output of logic level [1] from the OR circuit 74, the polarity of the output from the flip-flop circuit 75 is changed. The flip-flop circuit 75 is also shown to be supplied with a start/stop signal. Thus, a start signal is supplied to the flip-flop circuit 75 when the apparatus 1 is to perform a printing or developing operation and, in response to such start signal, the flip-flop circuit 75 provides an output to the motor drive circuit 76 with the polarity of such output reversed in response to successive outputs from the OR circuit 74. On the other hand, when the flip-flop circuit 75 receives a stop signal for halting the printing or developing operation by the apparatus 1, the flip-flop circuit 75 provides no output to the motor drive circuit 76 with the result that the motor 29 is maintained in an inoperative condition. FIG. 13 further shows that the output of the OR circuit 72 is also supplied to the motor drive circuit 76 as a disabling signal for the latter. In other words, in response to an output from the OR circuit 72 for causing an incremental operation of the motor 11 by which a sheet 67 and the film 65 are transported, the motor drive circuit 76 is inhibited from operating the motor 29 so that the carriage and roller assembly 41 will remain in one or the other of its end positions with the rollers 58 and 58' resting on a stand-by surface 8b during each incremental movement or transport of the film 65 and sheet 67.

The operation of the apparatus 1 embodying this invention will now be described:

At the initiation of a printing or developing operation of the apparatus 1, the carriage and roller assembly 41 is disposed at one or the other of its end positions and waits at such end position with its rollers 58 and 5840 resting on the respective one of the stand-by surfaces 8a, while the photo-sensitive film 65 is intermittently transported by the drive roller 9 and associated guiding roller 23 and by the tension roller 10 and associated guiding roller 24. During such intermittent transport of the film 65 past the FOT 15, the exposure side 65a of the film 65 is exposed line-by-line to light passing through the transparent base of the film so as to provide an exposure of the desired picture on a prescribed area or frame of the film 65 constituting a frame thereof.

As the exposed frame of the film 65 nears the nip between the rollers 9 and 23, a sheet 67 of developing paper is supplied from the tray 68 so as to overlap the exposed frame of the film 65 in correct registration therewith and to be fed together with the film 65 between the rollers 9 and 23 and onto the back-up surface 8a of the back-up member 7.

The arrival of the leading end of the exposed frame of the photo-sensitive film 65 at the top or longitudinal median 8d of the back-up surface 8a is detected by a suitable sensor (not shown) to provide a start signal by which the flip-flop circuit 75 causes the motor drive circuit 76 to effect operation of the motor 29 in the direction for moving the carriage and roller assembly 41 away from the end position at which it resided while awaiting the arrival of the exposed frame of the film. In response to such operation of the motor 29, the pressing rollers 58 and 58', while pressing together the sheet 67 of back-up surface 8a of the member 7, roll in one or the other lateral direction, that is, a direction perpendicular or at least at a substantial angle to the direction of feeding movement or transport of the film 65 and sheet 67, so that the rollers 58 and 58' scan across the sheet 67 of developing paper and the photo-sensitive film 65 in the direction of the width of the latter. Accordingly, a stripe band-shaped area extending across the width of the sheet 67 of developing paper and the photo-sensitive film 65 is subjected to pressure between the pressing rollers 58 and 8' and the back-up surface 8a for causing developing of the corresponding band-shaped area of the exposed color picture on the sheet 67.

When the carriage and roller assembly 41 has moved completely across the width of the sheet 67 and film 65 and reaches its other end position with the rollers 58 and 58' resting on the respective stand-by surface 8b, the sensor 36 or 37 detects the arrival of the assembly 41 at such other end position and provides a signal of logic level [1] through the OR circuit 74 to the flip-flop 75 for inverting the polarity of the output from the flip-flop circuit. However, at the same time, the signal of logic level [1] from the sensor 36 or 37 triggers the respective monostable multi-vibrator 71L or 71R, and the resulting output pulse from the triggered monostable multi vibrator is passed through the OR circuit 72 to the motor drive circuit 76 for inhibiting any operation of the motor 29 for the duration of such pulse. Thus, for the duration of any pulse from the monostable multi-vibrator 71L or 71R, the carriage and roller assembly 41 remains at rest at one or the other of its end positions, while the motor drive circuit 73 responds to such pulse for causing operation of the motor 11 by which a further increment of movement of the sheet 67 together with the film 65 is effected. At the completion of such incremental movement determined by the width of the pulse from the monostable multi-vibrator 71L or 71R, and which is no greater than the width of the previously mentioned band-shaped pressing area, the absence of any pulse fed from the OR circuit 72 to the motor drive circuit 76 enables the latter to effect renewed operation of the motor 29 in the direction corresponding to the polarity of the output then being received by the motor drive circuit 76 from the flip-flop circuit 75. Thus, the carriage and roller assembly 41 is moved laterally or returns to its original end position and, during such movement, the rollers 58 and 58' press together the sheet 67 of developing paper and the photo-sensitive film 65 against the back-up surface 8a in another band-shaped pressing area that abuts or partially overlaps the band-shaped area in which the sheet 67 and film 65 were previously pressed together.

It will be appreciated from the foregoing that the intermittent transportation of a sheet 67 of developing paper and the photo-sensitive film 65 and the movement or transportation of the rollers 58 and 58' laterally across the sheet 67 and film 65 while supported on the back-up surface 8a are alternately performed in a repetitive manner. Each time the pressing rollers 58 and 58' move across the sheet 67 and film 65 against the back-up surface 8a, the microcapsules of pigment precursors of the photo-sensitive film 65 in the band-shaped pressing area which have not been exposed to light by the FOT 15 are ruptured or crushed so as to transfer the respective pigment precursors to the developing surface 67a of the sheet 67 of developing paper thereby to provide the respective pigment or color on the sheet 67. Thus, each traverse of the sheet 67 and film 65 by the rollers 58 and 58' causes a band-shaped part of the image or picture to be printed or developed on the sheet 67.

Figure 1:
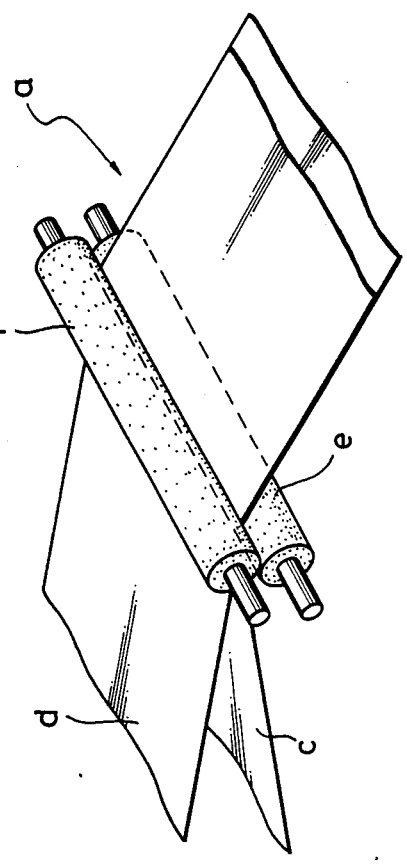
FIG. 1 is a perspective view of a pressure type developing apparatus in accordance with the prior art.
Figure 5:
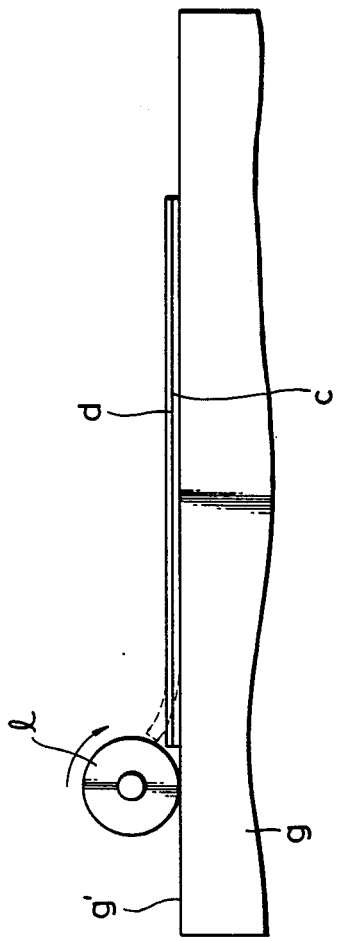
FIG. 5 is a schematic front elevational view of the main components of the apparatus of FIG. 4, and to which reference is made in explaining the problems encountered therewith.

Since the pressing rollers 58 and 58' press together a band-shaped area of the photo-sensitive film 65 and the sheet 67 of developing paper against the back-up surface 8a by rolling there across in the direction of the width of the film 65, the area at which each of the rollers 58 and 58' contacts the sheet 67 at any one time is very small so that the force exerted by each of the springs 63 and 63' may be as small as 2 to 3 kg, as compared with the force of 1,000 to 1,500 kg required to press together the rollers e and f in the prior art arrangement of FIG. 1.

Furthermore, by reason of the stand-by surfaces 8b being raised relative to the back-up surface 8a on the back-up member 7, there is not a large difference in height between the top surface of the sheet 67 of developing paper superposed on the photo-sensitive film 65 against the back-up surface 8a and the stand-by surfaces 8b. Therefore, the pressing rollers 58 and 58' can roll relatively smoothly between the stand-by surfaces 8b and the surface of the sheet 67 of developing paper for avoiding damage to the side edges of the superposed film 65 and sheet 67, and also for avoiding the generation of objectionable noise when moving on and off the opposite side edges of the sheet 67 and film 65. Furthermore, since the side edges of the superposed sheet 67 and film 65 do not project substantially above the stand-by surfaces 8b, there is no danger that the rollers 58 and 58', in moving off the stand-by surfaces 8b will collide with the side edges of the film 65 and sheet 67 and be stopped thereby.

It is also to be noted that, since the two pressing rollers 58 and 58' in rolling, in tandem, across a band-shaped area of the superposed sheet 67 and film 65 against the back-up surface 8a successively scan the same incremental regions of such band-shaped area, any non-hardened microcapsules of the film 65 that were not ruptured or crushed by the action of the first roller 58 or 58' is very likely to be ruptured or crushed by the pressure of the second roller 58' or 58, respectively. Thus, a more uniform concentration of development is likely to be provided.

Furthermore, since the pressure exerted by each of the two rollers 58 and 58' can be reduced without sacrificing the uniformity of the development concentration, damage to the photo-sensitive film 65 and the sheet 67 of developing paper, such as, tearing and wrinkling thereof, can be substantially prevented.

Figure 15:
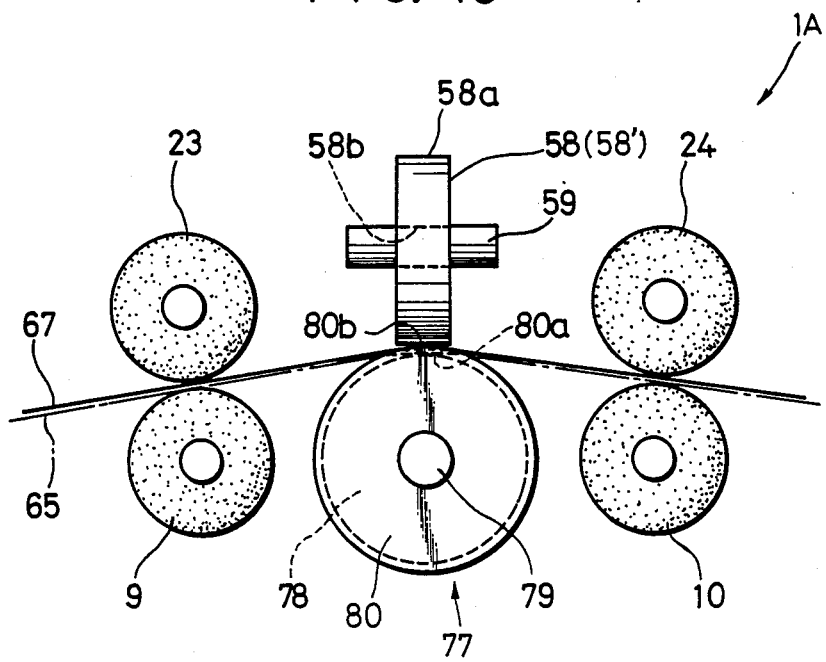
FIG. 15 is a schematic side elevational view of the main components of a developing apparatus according to another embodiment of this invention.
Figure 16:
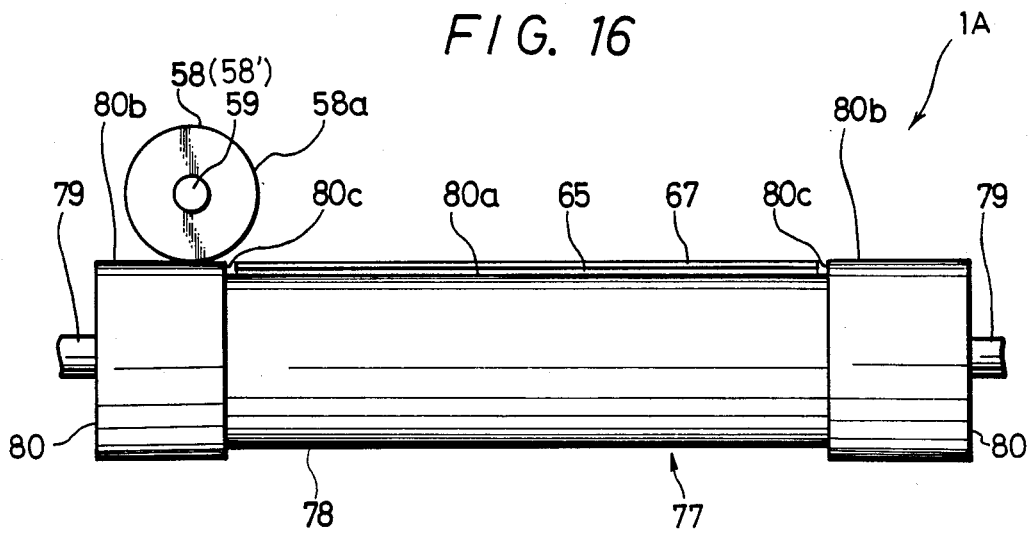
FIG. 16 schematic front elevational view of a portion of the apparatus of FIG. 15.

Referring now to FIGS. 15 and 16, it will be seen that, in a developing apparatus 1A according to another embodiment of this invention, and which is otherwise similar to the apparatus 1 previously described, the back-up member 7 which defines a fixed back-up surface 8a is replaced by a cylindrical back-up member 77 including a rotatable, cylindrical body portion 78 mounted on a shaft 79 and having an axial length substantially corresponding to the width of the sheet 67 of developing paper and the photo-sensitive film 65, and fixed opposite end portions 80 each having a diameter slightly larger than the diameter of the rotatable cylindrical body portion 78 so that the fixed end portions 80 define stand-by surfaces 80b at their peripheries and guide surfaces or shoulders 80c at the opposite ends of the back-up surface 80a.

The apparatus 1A operates similarly to the previously described operation of the apparatus 1 with the exception that, during the rolling movements of the roller 58 or of rollers 58 and 58' laterally across the superposed sheet 67 and film 65 against the back-up surface 80a from one to the other of the stand-by surfaces 80b, the cylindrical body portion 78, which defines the back-up surface 80a, is desirably held against rotation by a suitable locking means (not shown). On the other hand, during each interval or increment of movement of the superposed film 65 and sheet 67, the cylindrical body portion 78 is similarly angularly displaced or turned while the roller 58 or rollers 58 and 58' are disposed on one or the other of the fixed stand-by surfaces 80b. Thus, during the intermittent transportation of the film 65 and each sheet 67, the back-up surface 80a does not give rise to any frictional resistance to such movements of the web 65 and sheet 67. Thus, relative displacements or shifting of the film 65 and sheet 67 are avoided to ensure the clear development of the desired picture. The difference between the diameter of the rotatable cylindrical body-portion 78 and the diameter of the fixed end members 80 is selected so that the guide shoulders 80c preferably have a radial dimension approximately equal to the combined thicknesses of the film 65 and sheet 67. Thus, the apparatus 1A has the previously described advantages in avoiding damages to the edges of the film 65 and sheet 67, and also in avoiding the generation of noise when the roller 58 or rollers 58 and 58' move between the stand-by surfaces 80b and the upper surface of the sheet 67.

Although the apparatus 1 is described and illustrated as having two pressing rollers 58 and 58' arranged in tandem, it will be appreciated that the described advantages of providing the stand-by surfaces 8b or 80b raised relative to the back-up surface 8a or 80a, respectively, can also be achieved when only a single roller 58 is employed, as shown on FIG. 16. Furthermore, if desired, three or more pressing rollers may be arranged similarly in tandem to further ensure that the pressure successively applied by such three or more pressing rollers in rolling across the superposed sheet 67 and film 65 against the back-up surface will crush or rupture all of the microcapsules of the film 65 which are non-hardened.

Although each of the pressing rollers 58 and 58' is shown to be moved across the superposed sheet 67 and film 65 in directions perpendicular to the direction of travel of the photo-sensitive film 65 and the sheet 67 of developing paper during the intermittent transport thereof, it should be appreciated that the movements of the rollers 58 and 58' may be oblique in respect to the direction of sheet travel.

Furthermore, although the embodiments of this invention described above have referred to the photo-sensitive film 65 as being coated with the photo-sensitive microcapsules of pigment precursors which are exposed to light and then pressed against the sheet of developing paper containing the developing agents or substances for providing the desired image or picture on the sheet of developing paper, it will be appreciated that the invention can be applied to other image forming systems which are responsive to the application of pressure. Thus, for example, the invention may be similarly applied to a developing apparatus which employs a developing paper having both the photo-sensitive pigment precursors and the developing agents provided thereon and which is pressed against a sheet of copy paper on which the image is to be produced. As another example, the invention may be applied to a developing apparatus of the kind in which a photo-sensitive toner is used for printing and is pressed against and fixed on a copy paper by means of the apparatus embodying this invention. Thus, it will be appreciated that the developing apparatus in accordance with this invention may be applied to any arrangement in which a photo-sensitive material and a developing paper are moved together in face-to-face contact with each other and pressed against a back-up surface for providing the desired image or picture.

In the embodiments of this invention described above with reference to FIGS. 6-14 and FIGS. 15 and 16, respectively, the peripheral surface 58a or 58'a of the pressing roller 58 or 58', respectively, is cylindrical and has a rectilinear generatrix extending parallel to the axis of rotation of the respective pressing roller, while the back-up surface 8a or 80a is outwardly or upwardly convex and has a rectilinear generatrix extending parallel to the longitudinal median of the back-up surface, that is, parallel to the directions in which the rollers 58 and 58' are transported with the carriage 42 in the direction along the guide shafts 22. In other words, the back-up surface 8a or 80a and the peripheral surface 58a or 58'a of each of the rollers 58 and 58' are shaped to diverge relative to each other from the median of the peripheral surface 58a or 58'a toward the opposite margins of such peripheral surface. By reason of such diverging, each of the rollers 58 and 58' exerts a pressure on the superposed sheet 67 and film 65 against the underlying back-up surface 8a or 80a which is substantially concentrated near the median of the peripheral surface of the pressing roller. In order to spread the pressure distribution or make the same more nearly uniform across the width of the peripheral surface of each of the pressure rollers 58 and 58', each of such pressing rollers may be given the configuration of the roller 158 in FIGS. 17 and 18. Each pressing roller 158 has a peripheral surface 158a which is outwardly concave between its margins. Such outwardly concave peripheral surface 158a has a radius of curvature $R_1$ *which is slightly larger than the radius of curvature $R_2$ of* the upwardly convex back-up surface 8a of the back-up member 7. For example, the radius of curvature $R_1$ may be 1mm, while the radius of curvature $R_2$ is 10 mm. By reason of the described difference between the radii of curvature, the surfaces 158a and 8a still diverge slightly from the longitudinal median of the back-up surface 8a so that the contact pressure is larger at the median of the peripheral surface 158a than at the margins thereof.

Figure 18:
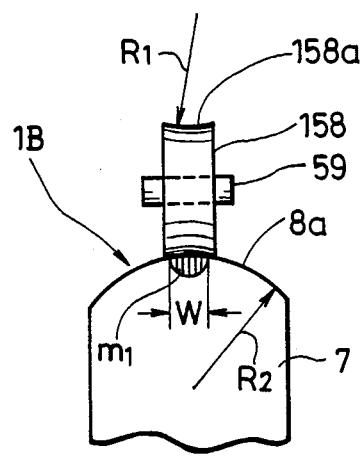
FIG. 18 is a side elevational view of the main components of a developing apparatus employing the roller of FIG. 17.

However, it will be apparent that the pressure distribution curve $m_l$, as shown on FIG. 18, tends to more nearly equalize the distribution of pressure across the width w of the peripheral surface of the roller 158 than would be the case for the previously described rollers 58 and 58' when used with the back-up member 7. It will be appreciated that the apparatus 1B shown on FIG. 18 and employing the roller 158 in association with the back-up member 7 may be otherwise the same as the apparatus 1 or 1A previously described herein, so that only the details of the characteristic pressing roller 158 have been illustrated and described.

FIGS. 19 and 20 and FIGS. 21 and 22 illustrate other cooperative arrangements of the pressing roller and the back-up surface by which the pressure distribution across the width of the pressing roller can be desirably influenced.

Figure 19:
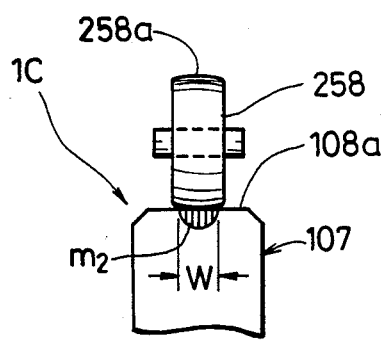
FIG. 19 schematic side elevational view similar to that of FIG. 18, but illustrating the main components of a developing apparatus according to still another embodiment of this invention.
Figure 20:
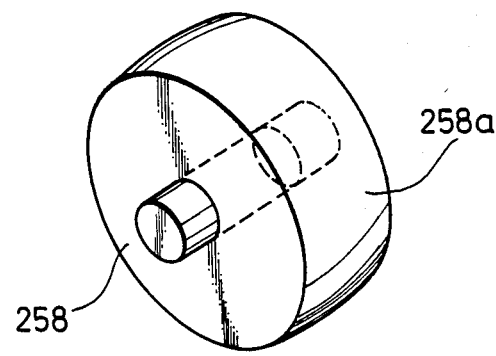
FIG. 20 is an enlarged perspective view of a roller included apparatus of FIG. 19.

In the apparatus 1C of FIGS. 19 and 20, each pressing roller 258 has a peripheral surface 258a which is outwardly convex between the margins of the peripheral surface and is associated with a back-up member 107 having a flat back-up surface 108a extending along the top thereof. By suitably selecting the radius of curvature of the outwardly convex peripheral surface 258a of each roller 258, the pressure distribution exerted by the roller 258 on a superposed sheet of developing paper and a photo-sensitive film against the flat back-up surface 108a can be made substantially uniform across the width w of the pressing roller, but with the exerted pressure decreasing gradually near to the opposite margins of the peripheral surface 258a, as indicated by the pressure distribution curve $m_2$ on FIG. 19.

Figure 21:
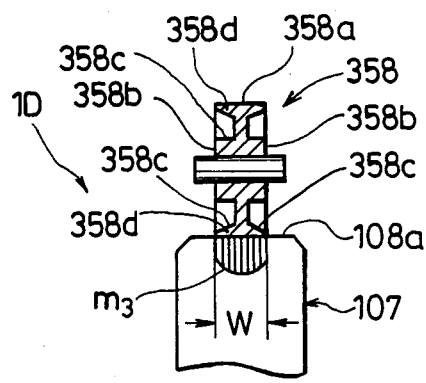
FIG. 21 is a schematic side elevational view similar to that of FIG. 18 but illustrating still another embodiment of this
Figure 22:
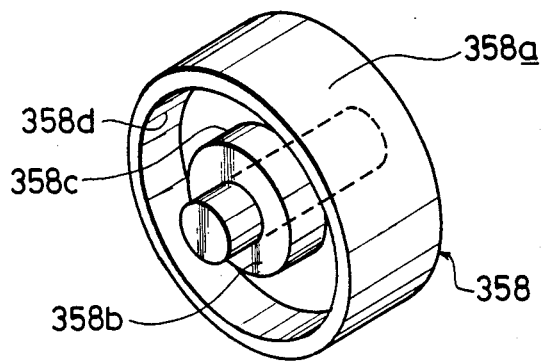
FIG. 22 is an enlarged perspective view of a roller included in the apparatus of FIG. 21.

In the apparatus 1D of FIGS. 21 and 22 which also employs a back-up member 107 with a flat back-up surface 108a extending across the top thereof, each pressing roller 58 has a cylindrical peripheral surface 358a with a rectilinear generatrix extending parallel to the axis of rotation of the roller 358. However, the opposed flanks 58b of the roller 358 are formed with annular recesses 358c which are concentric with the axis of rotation of the roller. Such annular recesses 358c are shaped so that the rim 358d of the roller 358 tapers in thickness from the center toward its opposite sides so that the rim 358d has less rigidity at the opposite margins of the peripheral surface 358a than at a median portion of the peripheral surface intermediate such margins. Therefore, when the roller 358 of the apparatus 1D presses a superposed sheet of developing paper and a photo-sensitive film against the flat back-up surface 108a, the pressure distribution across the width w of the pressing roller is substantially as indicated at $m_3$ on FIG. 21, that is, there is obtained a substantially uniform pressure distribution with some diminishing of the pressure near the opposite margins of the peripheral surface of the roller. The foregoing may be distinguished from the pressure distribution indicated at m on FIG. 4 for the prior art arrangement employing a flat back-up surface g' and a pressing roller 1 with a cylindrical peripheral surface having a rectilinear generatrix parallel to the axis of rotation of the roller. In such arrangement from the prior art, there is the danger that, when the roller 1 is urged downwardly toward the flat back-up surface g' with a relatively soft sheet of developing paper d and a photo-sensitive film c in contact with each other therebetween, the pressure distribution m will provide the highest contact pressures at the opposite margins of the peripheral surface of the roller which has the same rigidity thereacross.

As distinguished from the foregoing, all of the heretofore described embodiments of this invention employ a back-up surface and a pressing roller or rollers which are shaped relative to each other so that, during transporting of each roller across the back-up surface from one to another of the stand-by surfaces, the contact pressure between the peripheral surface of each roller and the back-up surface is smaller at the opposite margins of the peripheral surface than at any other portions of the peripheral surface between such margins. Such pressure distribution is achieved by shaping at least one of the back-up surface and the peripheral surface of each roller so as to diverge relative to the other of such surfaces from the median of the peripheral surface toward the opposite margins thereof, for example, as in the embodiments of FIGS. 6-14, FIGS. 15 and 16, FIGS. 17 and 18, and FIGS. 19 and 20, or by providing each pressing roller with a rim having less rigidity at the margins of the peripheral surface than at the median thereof, as in the embodiment of FIGS. 21 and 22.

Figure 3A:
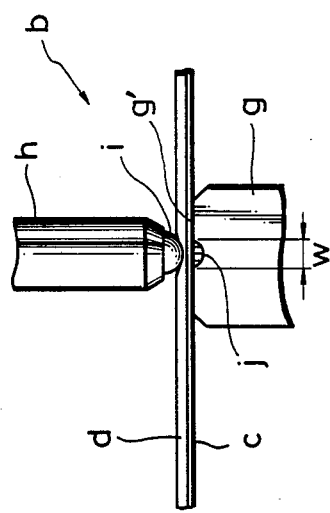
FIG. 3A is an enlarged, schematic side elevational view showing the elements of the developing apparatus of FIG. 2.
Figure 3B:
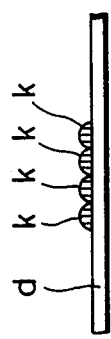
FIGS. 3B and 3C are schematic diagrams illustrating developing concentrations achieved with the apparatus of FIG. 2 for different incremental movements of the sheets of developing paper and photo-sensitive material during the intermittent transportation thereof.
Figure 3C:
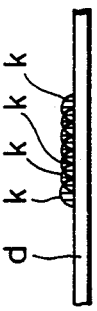
Figure 2:
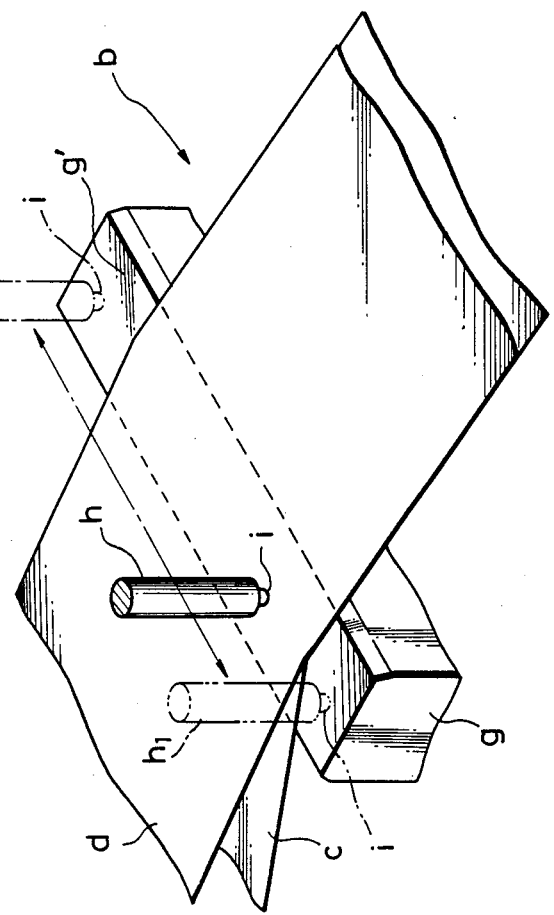
FIG. 2 is perspective view of another pressure type printer or developing apparatus in accordance with the prior art.

In each of the described instances, the stripe or band-shaped area along which the sheet 67 and film 65 are pressed together against the back-up surface by each pressing roller rolling thereacross is made relatively wide, as compared with the narrow area of contact provided by the ball i of the pressing member h in the prior-art arrangement of FIG. 3A, so that the increments of the intermittent transportation of the sheet 67 and film 65 can be relatively increased for correspondingly increasing the developing or printing speed, without the danger that the contacting pressures under the margins of the peripheral surface of the pressing roller will be abnormally increased with resulting damage to the sheet of developing paper and/or to the photo-sensitive film.

Figure 17:
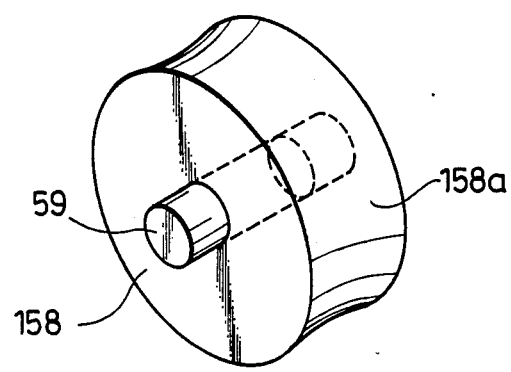
FIG. 17 is an enlarged perspective view of a roller that is used in a developing apparatus according to still another of this invention.

The embodiment of the invention shown in FIGS. 17 and 18 has the further advantage that the combination of the pressing roller 158 having an outwardly concave peripheral surface 158a with the upwardly convex back-up surface 8a tends to stabilize the pressing roller 158 during its movement along the back-up surface 8a with the result that relative shifting of the sheet of developing paper and the photo-sensitive film is avoided.

Figure 23:
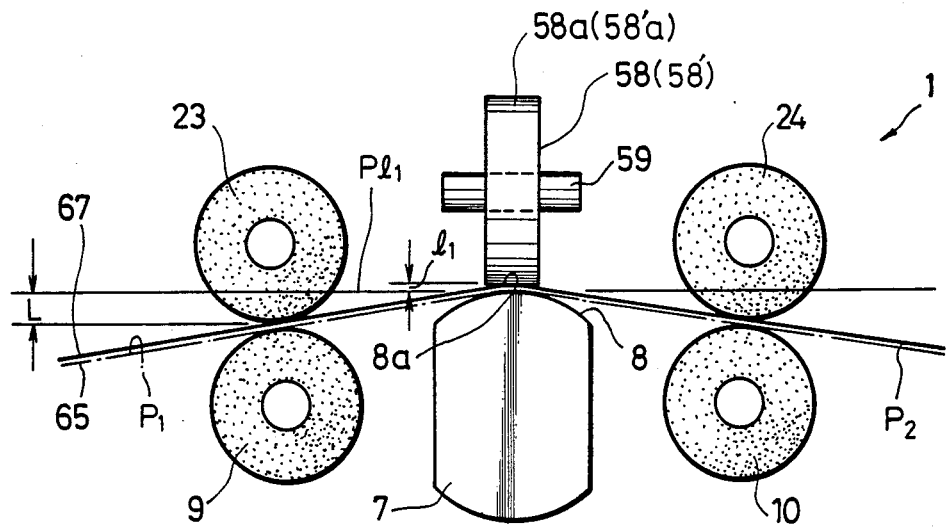
FIG. 23 a is a schematic side elevational view of a developing apparatus according to the present invention in which the sheets are fed to and from a back-up surface along preferably arranged paths.

Referring now to FIG. 23, it will be seen that, in the apparatus 1 embodying this invention, and in which each pressing roller has a cylindrical peripheral surface 58a or 58'a with a rectilinear generatrix parallel to its axis of rotation and is associated with a back-up surface 8a on the member 7 which is upwardly convex and has a rectilinear generatrix extending parallel to the directions in which the roller 58 is transported, the feed roller 9 in association with the tape guiding roller 23 and the tensioning roller 10 in association with the tape guiding roller 24 constitute guide means disposed before and after, respectively, the back-up surface 8a considered in respect to the direction of travel of the sheet 67 of developing paper and the photo-sensitive film 65 across the back-up surface. By providing the nip between the rollers 9 and 23 and the nip between the rollers 10 and 24 at a distance L below the plane $P1_1$ which is tangential to the back-up surface 8a at its longitudinal median along which the roller 58 is made to roll, the rollers 9 and 23 and the rollers 10 and 24 guide the superposed sheet 67 and film 65 along paths $P_1$ and $P_2$ extending to and from, respectively, the back-up surface 8a and which converge and diverge, respectively, in respect to the plane $P1_1$. It will be noted that the distance L is selected so that the paths $P_1$ and $P_2$ are disposed between the plane $P1_1$ and the back-up surface $8a$ and are spaced from the latter at the opposed margins of the back-up surface.

The optimum value of the distance L between the plane $P1_1$ tangential to the back-up surface $8a$ at the area of contact of the pressing roller 58 therewith and the lines of contact between the rollers 9 and 23 and the rollers 10 and 24 is determined in accordance with the axial width of each of the pressing rollers 58 and 58'. If the distance L is too small, for example, if the paths $P_1$ and $P_2$ are horizontal or nearly so, there is the danger that the pressing rollers 58 and 58' will damage the upper surface of the sheet 67 of developing paper by digging or cutting into the sheet at the marginal edges of the peripheral surfaces $58a$ and $58'a$ of the rollers. On the other hand, if the distance L is too large, it is difficult to initially load the photo-sensitive film 65 and the sheet 67 of developing paper onto the back-up surface 8. Further, as the distance L is increased, the wrapping angle of the film 65 and sheet 67 about the arcuate back-up surface $8a$ is increased and this causes excessive stretching of the sheet 67 which is at the outside of the resulting curve. Moreover, the frictional resistance to intermittent travel of the film 65 across the back-up surface $8a$ is increased. Accordingly, when the pressing rollers 58 and 58' have a width in the range of 5 to 6 mm, the distance L is preferably selected so as to provide a spacing $l_1$ of about 0.2 to 0.5 mm between the peripheral surface of the roller 58 or 58', at each margin thereof, and the underlying surface of the sheet 67 of developing paper in the path $P_1$ or $P_2$.

Figure 24:
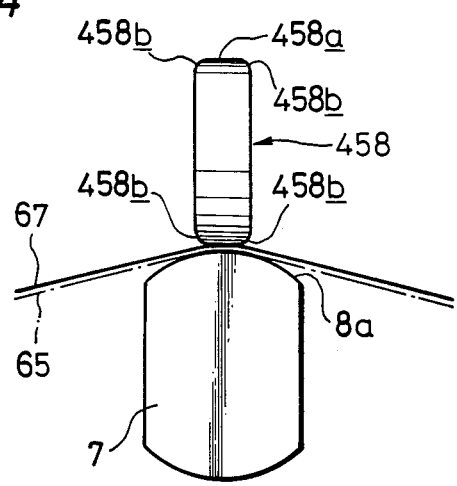
FIG. 24 is a schematic side elevational view similar to a portion of FIG. 23, but in which a pressing roller is provided with a preferred configuration.
Figure 25:
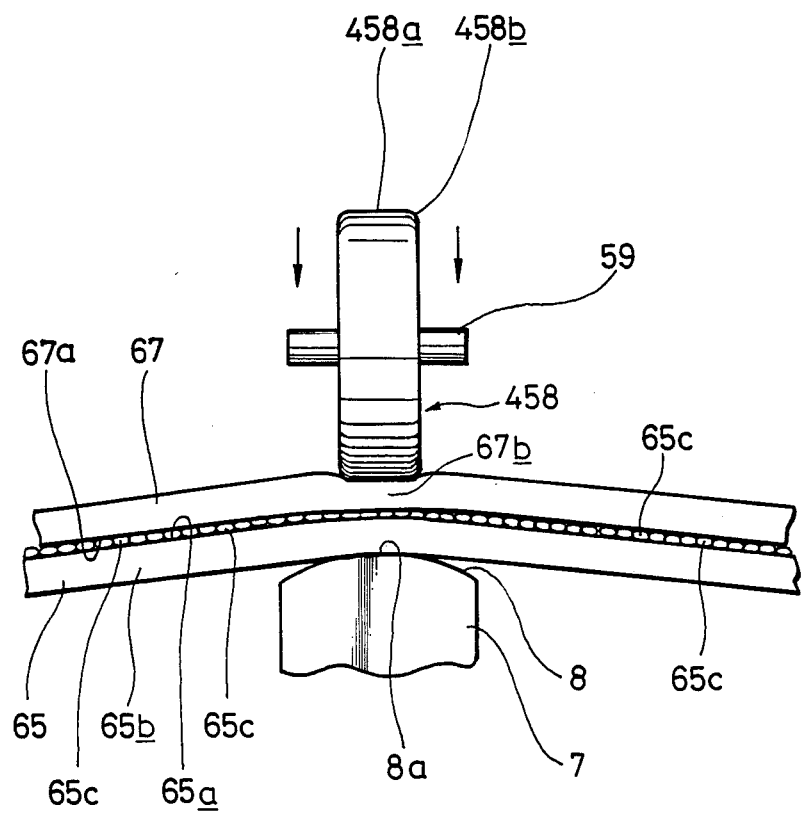
FIG. 25 is an schematic side elevational view, similar to that 24, and to which reference will be made in advantages of the roller configuration and sheet feeding paths preferred in accordance with the invention.

In order to permit the distance L to be made relatively small while avoiding scratching of the upper or outer surface of the sheet 67 of developing paper by the edges or margins of the peripheral surface of the pressing roller or rollers, each pressing roller, as indicated at 458 on FIGS. 24 and 25, may be provided with a cylindrical peripheral surface $458a$ with rounded or beveled edges $458b$ at the opposite margins of the peripheral surface. Since the peripheral surface $458a$ is cylindrical between its rounded or beveled edges $458b$, the back-up surface $8a$ can be upwardly convex, as shown, without undesirably decreasing the width of the band-shaped area at which each pressing roller 458 presses together the sheet 67 of developing paper and the photo-sensitive film 65 against the back-up surface $8a$. By reason of the upwardly convex curvature of the back-up surface $8a$, the opposite marginal portions of the back-up surface are spaced from the photo-sensitive film 65 passing thereover, as is clear on FIG. 25. It will be appreciated that the arrangement shown on FIGS. 24 and 25 differs from that indicated on FIG. 23 only in respect to the configuration of the pressing roller 458 and the possibility such configuration offers for reducing the distance L on FIG. 23 and, in consequence thereof, reducing the curvature of the back-up surface $8a$. However, in the embodiment of FIGS. 24 and 25, as well as in the embodiment of FIG. 23, the positioning of the guiding rollers 23 and 24 before and after, respectively, the back-up member 7 so that the paths $P_1$ and $P_2$ extending to and from the back-up surface $8a$ converge and diverge, respectively, in respect to the plane $P1_1$ ensures that the sheet 67 of developing paper and the underlying photo-sensitive film 65 will be held tightly against the back-up surface $8a$, and thus cannot rise from such back-up surface, when the pressing roller 58 or 458 rolls along the back-up surface. In other words, by reason of the slight wrapping of the sheet 67 and film 65 about the curved back-up surface $8a$, the tension in the sheet 67 and film 65 between the rollers 9 and 23 and the rollers 10 and 24 acts to hold the film 65 and sheet 67 tightly against the back-up surface.

Although the paths $P_1$ and $P_2$ are established, in FIG. 23, by the guiding rollers 23 and 24 cooperating with the feed roller 9 and the tensioning roller 10, respectively, the requisite paths $P_1$ and $P_2$ can be established by other guiding means, for example, by guiding rollers which are apart from the rollers cooperating with the feed roller 9 and tensioning roller 10 for transporting the film 65 and sheet 67.

It is further to be noted that FIG. 25 specifically illustrates the photo-sensitive film 65 as including a transparent film base $65b$ coated, at its exposure side $65a$, with an infinite number of microcapsules or particles $65c$ of a suitable resin which contain respective pigment precursors and which are optically hardened, for example, when irradiated with ultraviolet light of respective wavelengths. Further, each sheet 67 of developing paper is shown to have a developing side $67a$ which is coated with a developing substance or agent capable of chemically reacting with the pigment precursors released by the crushed microcapsules $65c$ for providing the corresponding colors or pigments on the developing surface $67a$ of the sheet 67.

In accordance with this invention, the photo-sensitive film 65 and the sheet 67 of developing paper are arranged in respect to the back-up member 7 so that the photo-sensitive film 65 which is relatively harder and more rigid than the sheet 67 of developing paper will be in contact with the back-up surface $8a$ of the member 7. By reason of the foregoing, when the contacting film 65 and sheet 67 are pressed together by a pressing roller 58, 158, 258, 358 or 458, the resulting reduction in thickness of the sheet 67, as at $67b$ on FIG. 25, will not cause wrinkling of the underlying photo-sensitive film 65. On the other hand, if the positions of the sheet 67 and film 65 were reversed, that is, if the film 65 was on top so as to be contacted by the pressing roller while the sheet 67 engaged the back-up surface $8a$, the deforming or reduction in thickness of the relatively softer sheet 67 under the film 65 would cause wrinkling or buckling of the latter under the pressure exerted by the pressing roller, and such wrinkling would result in shifting or displacement of the stripe-shaped increments of the developed picture and also irregular concentrations of the development. Furthermore, since the film base $65b$ of the photo-sensitive film 65 is smoother than the sheet 67 of developing paper, the arrangement of the film 65 in contact with the fixed back-up surface $8a$ serves to reduce the frictional resistance to the movement of the film 65 across the back-up surface. Therefore, the intermittent transport of the film 65 and the sheet 67 of developing paper can be effected smoothly for again avoiding relative displacements or shifting of the stripe-shaped increments of the developed picture and irregular concentrations of the development.

Of course, the above described arrangement of the film 65 and sheet 67 of developing paper presumes that the photo-sensitive film 65 is harder and has the greater rigidity. However, in the event that the sheet of developing paper 67 has the higher rigidity and hardness, for example, as when the sheet 67 of developing paper is formed of overhead projector (OHP) film, such OHP film can be arranged under the photo-sensitive film 65, and thus be in contact with the back-up surface $8a$.

Further, in accordance with the present invention, self-aligning means are provided for automatically attaining a desired attitude of the peripheral surface of each pressing roller relative to the back-up surface during the transporting of the pressing roller along the back-up surface.

Figure 26:
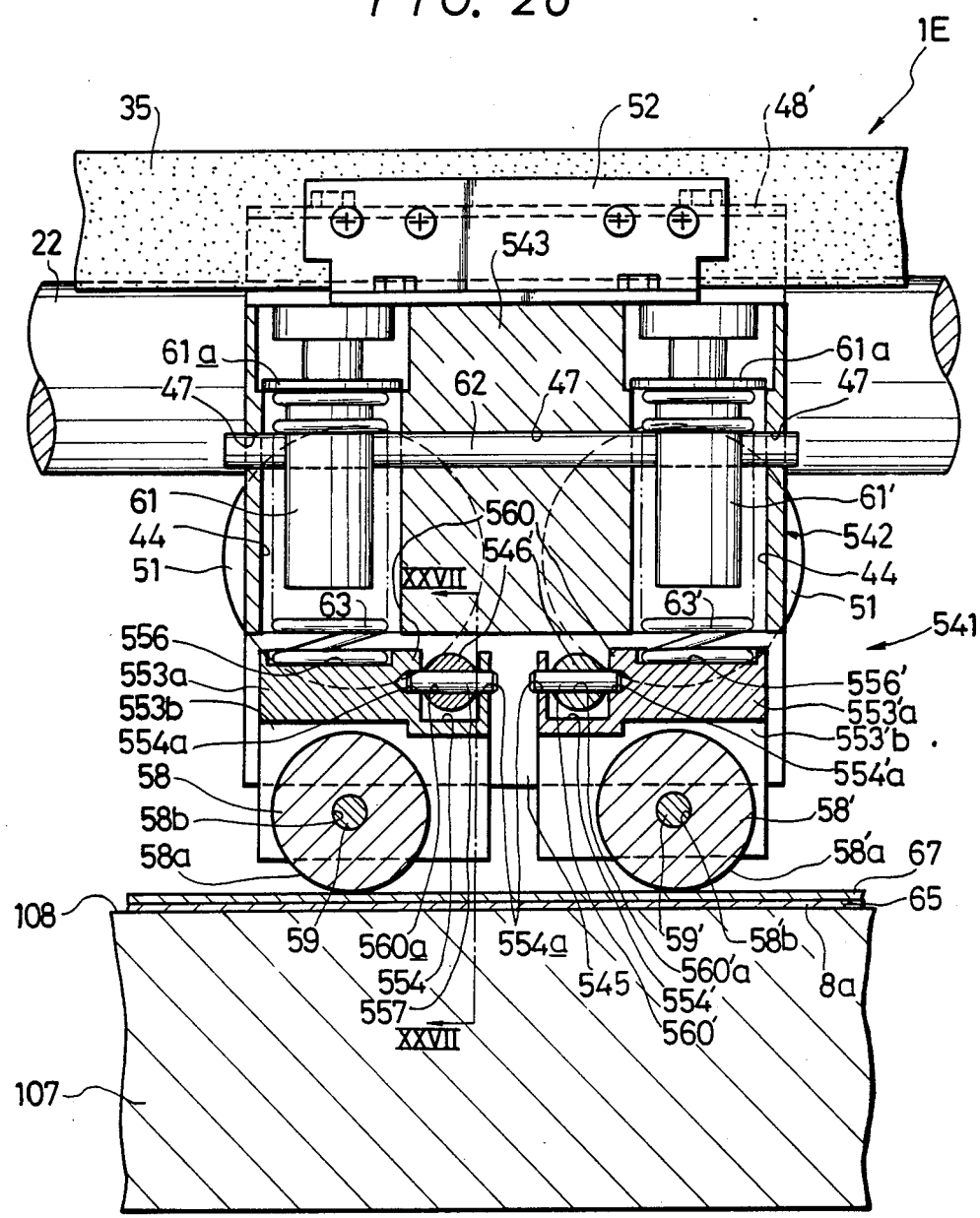
FIG. 26 is a sectional view similar to that of FIG. 11, but showing a carriage and roller assembly of a developing apparatus according to still another embodiment of this invention.

More specifically, and as shown on FIGS. 26 and 27, in a developing apparatus 1E according to the present invention, and which is otherwise generally similar to the apparatus 1 described with reference to FIGS. 6–14 and has its corresponding parts identified by the same reference numerals, the desired attitude of the peripheral surfaces 58a and 58'a of the rollers 58 and 58' relative to the back-up surface 108a is achieved by providing a carriage and roller assembly 541 with self-aligning mountings for the rollers 58 and 58' in respect to the carriage 542. The carriage 542 is shown to include a generally block-shaped body 543 which is similar to the previously described body 43 in having parallel, spaced apart flanges 545 depending from the body 543. However, the spaced apart flanges 545 have aligned holes 546 and 546' extending therethrough at locations that are symmetrically arranged at opposite sides of the mid-position along the length of the flanges 545.

In the carriage and roller assembly 541, the pressing rollers 58 and 58' are respectively supported by roller support arms 553 and 553' having block-shaped major portions 553a and 553'a, respectively. These major portions 553a and 553'a of the roller support arms are formed with respective downwardly opening central cutouts so as to divide the lower parts of the major portions 553a and 553'a into bifurcated depending parts 553b and 553'b, respectively, which are formed with aligned holes 555 and 555' extending therethrough. The pressing rollers 58 and 58' have cylindrical outer peripheral surfaces 58a and 58'a, and are further formed with central, axially extending bores 58b and 58'b which rotatably receive respective axles 59 and 59'. With the pressing rollers 58 and 58' located between the bifurcated lower portions 553b and 553'b, respectively, of the roller support arms 553 and 553', the axles 59 and 59' are press fitted in the holes 555 and 555' and extended loosely through the bores 58b and 58'b of the pressing rollers. Thus, the pressing rollers 58 and 58' are rotatably supported by the arms 553 and 553' with the lower portions of the rollers 58 and 58' projecting downwardly from the respective support arms 553 and 553'.

Figure 28:
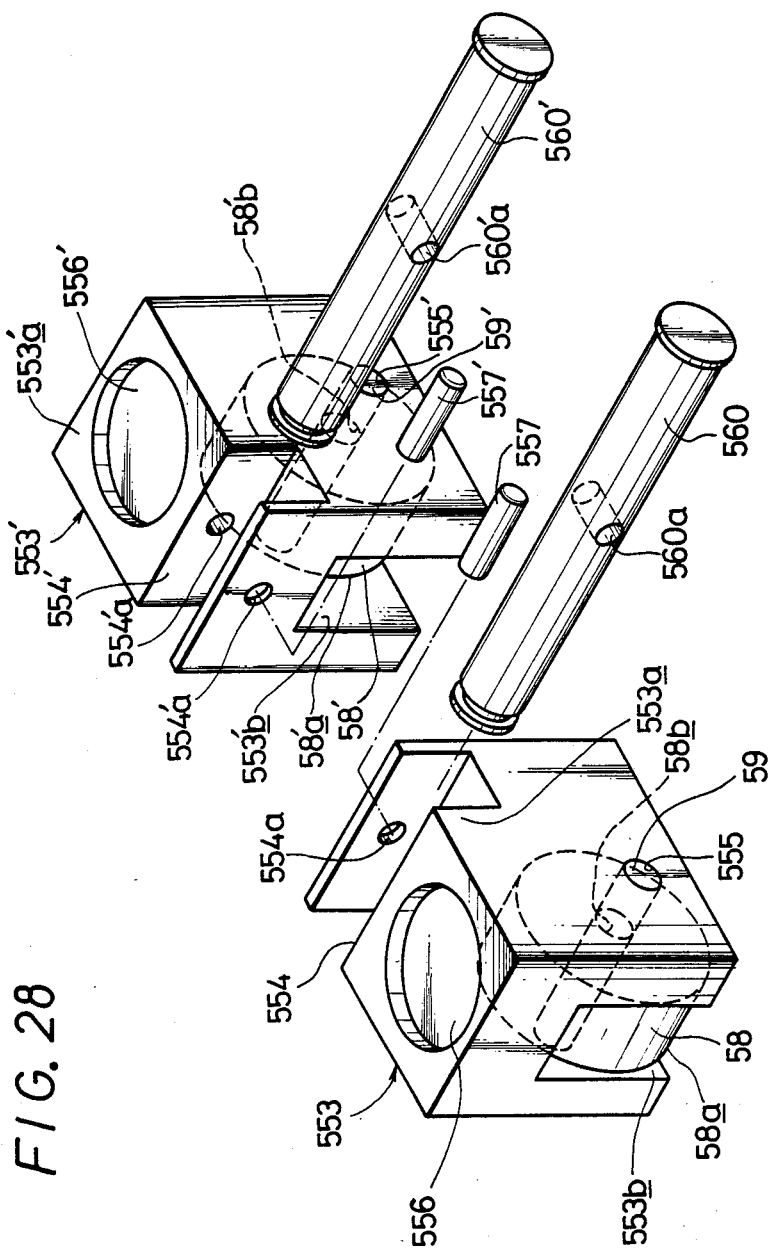
FIG. 28 is an exploded perspective view illustrating parts included in the carriage and roller assembly of FIGS. 26 and 27.

As shown particularly on FIG. 28, the roller support arms 553 and 553' further have channels 554 and 554' opening upwardly, and extending laterally across their respective upper portions, and being parallel and offset in respect to the axles 59 and 59' on which the respective pressing rollers are rotatable. The channels 554 and 554' are dimensioned to loosely receive on support shafts 560 and 560', respectively, which are extended through the holes 546 and 546', respectively, formed in the flanges 545. Midway along their lengths, the support shafts 560 and 560' have diametrically extending bores 560a and 560'a formed therethrough for alignment with apertures 554a and 554'a formed in support arms 553 and 553' at opposite sides of the middle portions of the channels 554 and 554', respectively. Self-aligning shafts 557 and 557' are press-fitted in the diametrically extending bores 560a and 560'a and turnably received in the apertures 554a and 554'a, respectively. Finally, the upper surfaces of the main portions 553a and 553'a of the roller support arms 553 and 553' are formed with shallow circular recesses 556 and 556' in which the lower ends of the compression springs 63 and 63' are respectively seated.

It will be apparent from the above that the pressing rollers 58 and 58' are rotatably supported by the arms 553 and 553' with the rollers 58 and 58' being arranged in tandem and movable independently of each other substantially in the vertical direction relative to the carriage body 543 by means of pivoting of the support arms 553 and 553' about the axes of the support shafts 560 and 560', respectively. Further, the support arms 553 and 553' are mounted for angular displacements independently of each other relative to the respective support shafts 560 and 560' about the axes of the self-aligning shafts 557 and 557', respectively. By reason of such angular displacement of the support arms 553 and 553' about the axes of the self-aligning shafts 557 and 557', respectively, the pressing rollers can be individually inclined in one direction or the other relative to the back-up surface on the member 107, as indicated by the dot-dash lines on FIG. 27, for thereby automatically attaining a desired attitude of the peripheral surface of each pressing roller relative to the back-up surface.

As in the previously described apparatus 1, the spring bearings 61 and 61' are positioned to compress the springs 63 and 63' so that the latter urge the roller support arms 553 and 553' to rock downwardly about the shafts 560 and 560' and thereby urge the pressing rollers 58 and 58' downwardly against the upper surface 108 of the back-up member 107 when an upper frame structure of the apparatus 1E corresponding to the previously described frame structure 16 is similarly locked in its operative position.

Figure 27:
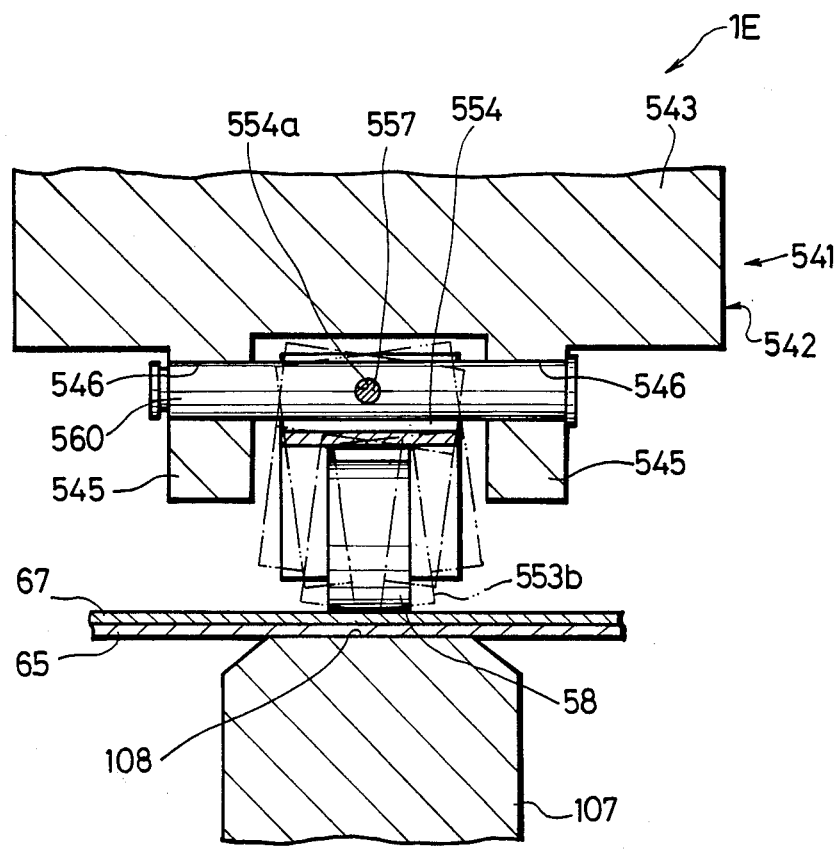
FIG. 27 is a detailed sectional view taken along the line XXVII—XXVII on FIG. 26, for particularly showing the manner in which the rollers of the respective carriage and roller assembly are for self-alignment in respect to the back-up surface.

It will be understood that, when the outer peripheral surfaces 58a and 58'a of the pressing rollers 58 and 58' are cylindrical, that is, are each defined by a rectilinear generatrix parallel to the rotational axis of the respective roller, and the back-up surface 108 is flat, as particularly shown on FIG. 27, the springs 63 and 63' acting on the support arms 553 and 533' urge the latter to shift angularly about the shafts 557 and 557' so as to stabilize the attitudes of the pressing rollers 58 and 58' in positions where the pressure resulting from the springs and 63' is applied to the back-up surface 108 uniformly across the width of each of the rollers 58 and 58' in a direction precisely perpendicular to the surface 108. Therefore, regardless of the parallelism between the back-up surface 108 and the axes of the support shafts 560 and 560', or between the axes of the support shafts 560 and 560' and the axles 59 and 59' of the pressing rollers 58 and 58', the attitudes of the pressing rollers 58 and 58' are automatically adjusted by the relative contact between the pressing rollers and the back-up surface in such a manner that the pressures exerted by the compression springs 63 and 63' are applied to the back-up surface in directions perpendicular to such back-up surface. Such automatic adjustment or self-alignment of the pressing rollers 58 and 58' in respect to the back-up surface 108 makes it unnecessary to maintain absolutely precise accuracy in the manufacture and assembly of the various parts of the apparatus 1E and thereby reduces the cost of its manufacture while ensuring its satisfactory operation.

Figure 29:
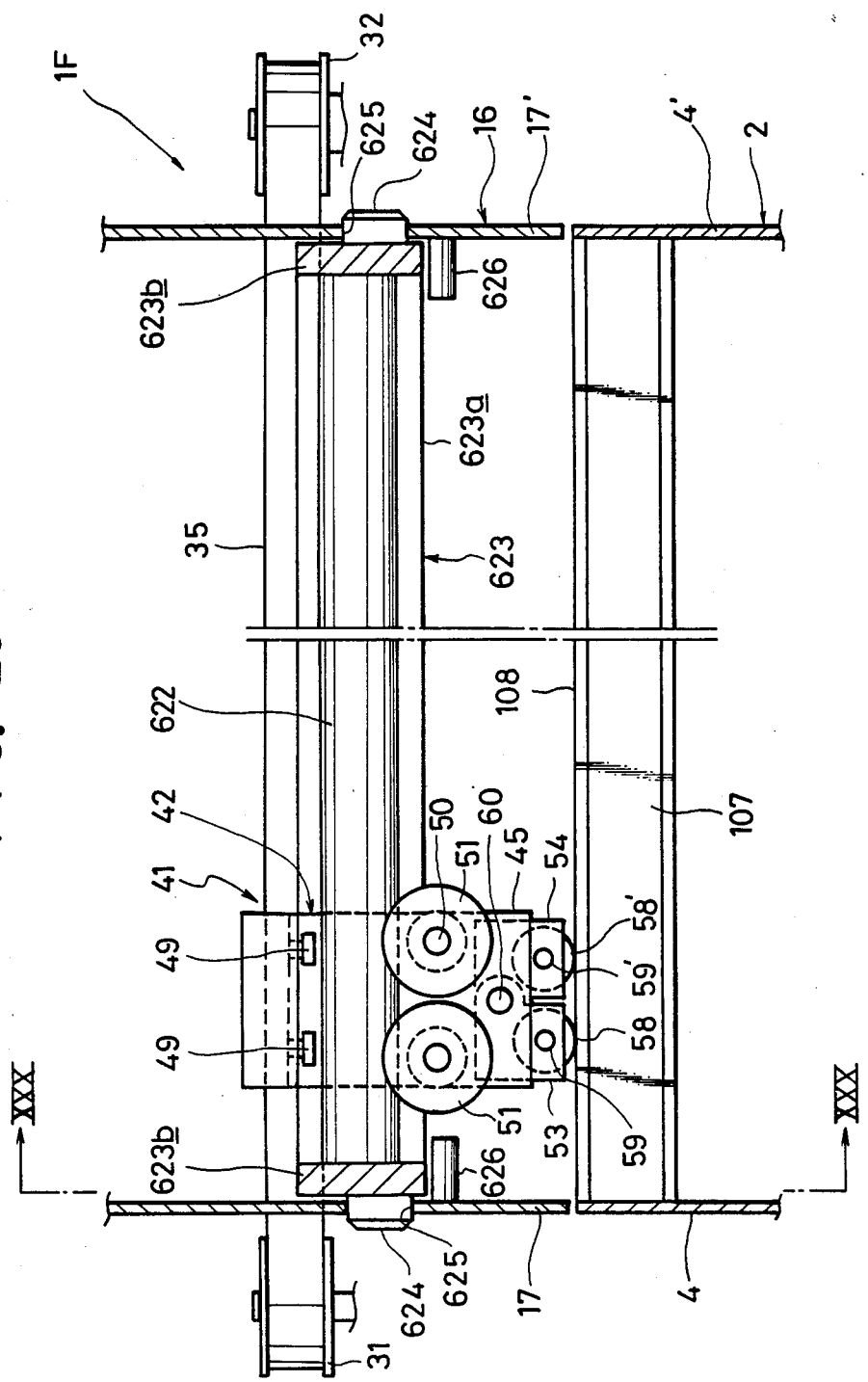
FIG. 29 is a front elevational view of a developing apparatus according to still another embodiment of this invention having an arrangement for effecting self-alignment of the rollers in respect to the back-up surface.
Figure 30:
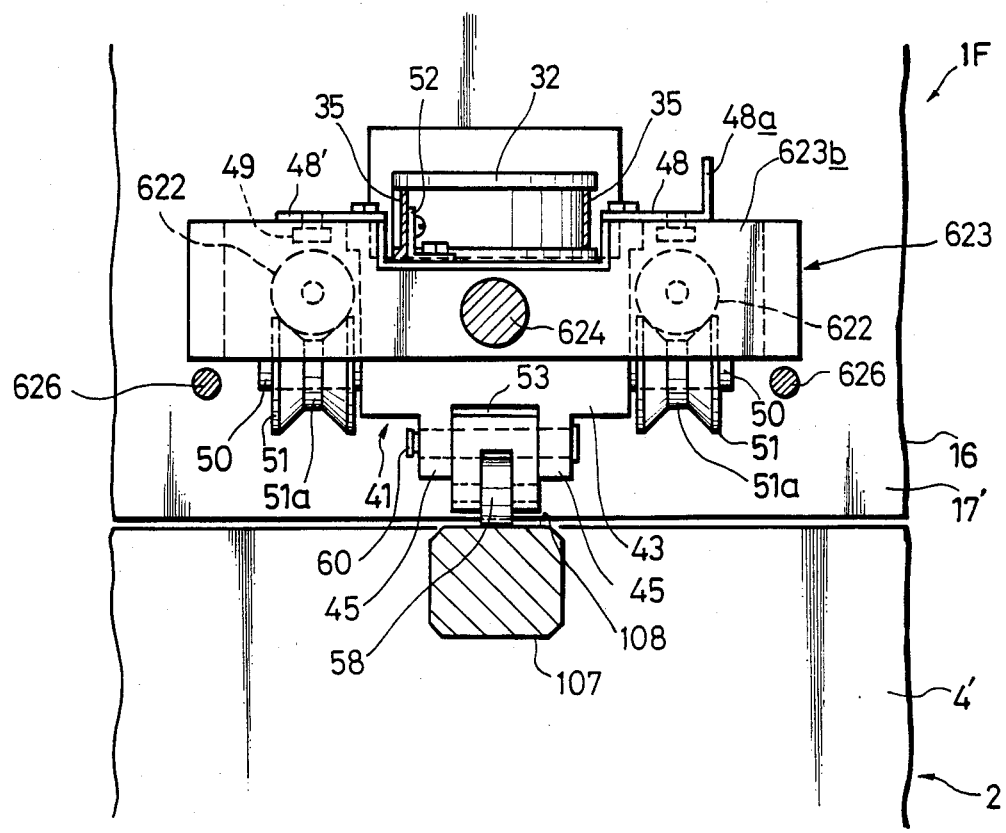
FIG. 30 is a sectional view taken along the line XXX—XXX on FIG. 29.
Figure 31:
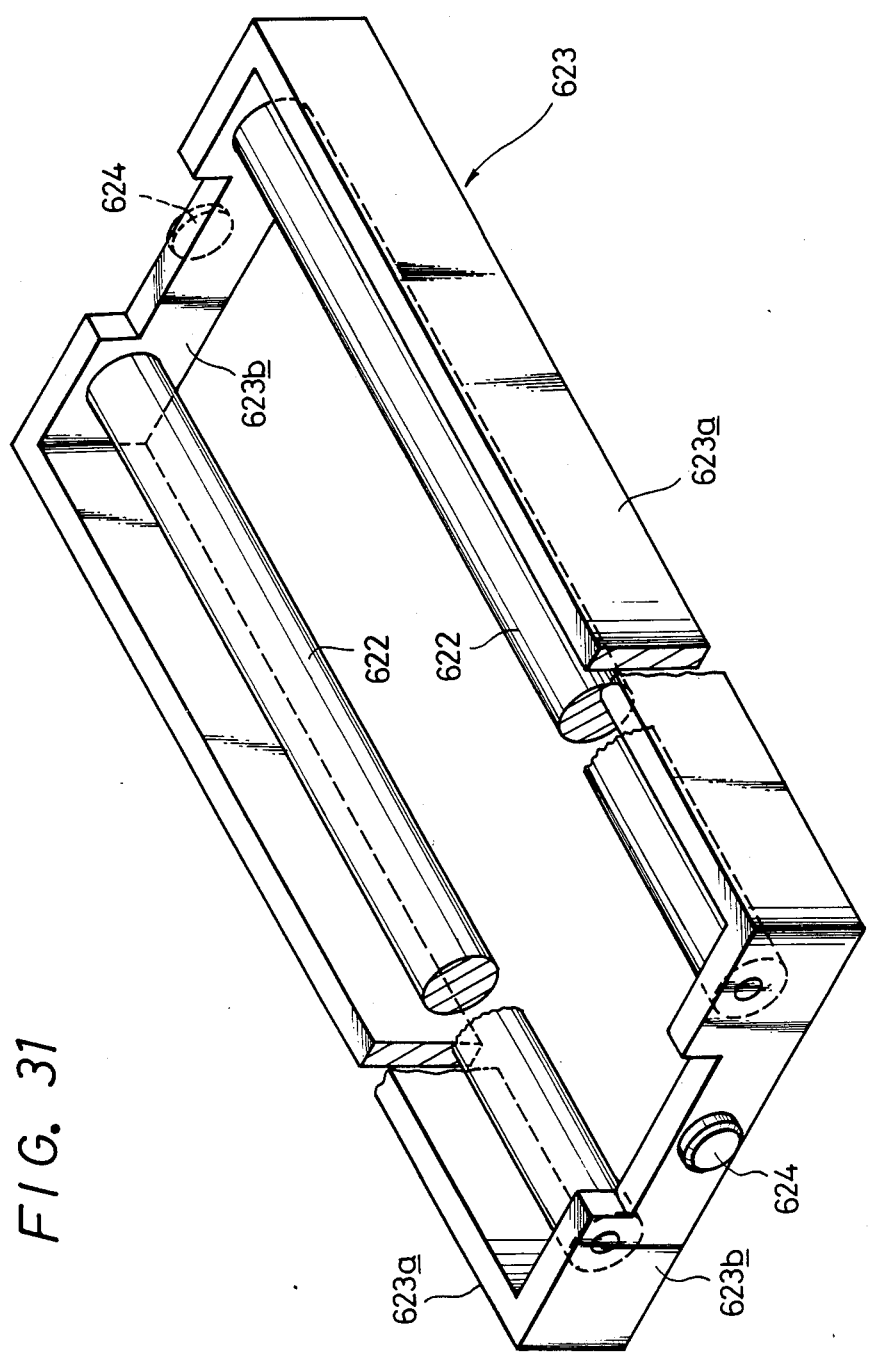
FIG. 31 is a perspective view illustrating a pivoted frame included in the apparatus of FIGS. 29 and 30 for achieving self-alignment.

Another embodiment of this invention which is capable of achieving the self-alignment of the pressing rollers 58 and 58' in respect to the back-up surface 108 on a back-up member 107 will now be described with reference to FIGS. 29, 30 and 31. The developing apparatus 1F shown on FIGS. 29, 30 and 31 is similar to the apparatus 1 previously described in detail with reference to FIGS. 6-14 and differs substantially therefrom only in respect to the structural provisions for achieving the self-alignment. More specifically, in the apparatus 1F, the guide shafts 22, which are fixed at their ends to the side walls 17 and 17′ of the upper frame structure 16 in the apparatus 1, are replaced by similar guide shafts 622 extending parallel to each other within a tiltable frame 623. More specifically, as shown on FIG. 31, the frame 623 is rectangular and elongated in the lateral direction, that is, in the direction parallel to the longitudinal axis of the back-up member 107. The frame 623 is shown to include elongated, parallel side members 623a connected, at their ends, to cross members 623b to which the ends of the guide shafts 622 are attached. Pivot pins 624 extend centrally from the cross members 623b and are turnably received in suitable bearings 625 (FIG. 29) provided in the side walls 17 and 17′ of the frame structure 16. Thus, the frame 623 is tiltable about an axis parallel to the longitudinal axis or median of the back-up surface 108, and such tilting of the frame 623 may be suitably limited by stop pins 626 projecting inwardly from the side walls 17 and 17′ below the cross members 623b and being engageable by the latter upon a predetermined inclination of the frame 623 from the horizontal.

In the apparatus 1F, the carriage and roller assembly 41 may again be similar to that described in detail with reference to the apparatus 1 and is guided by its grooved guide rollers 51 for movements along the guide shafts 622.

It will be appreciated that, when the upper frame structure 16 is locked in its horizontal operative position relative to the lower frame structure 2, the pressing rollers 58 and 58′ are spring urged against the back-up surface 108 and, in reaction thereto, the carriage 42 is spring biased upwardly for maintaining the guide rollers 51 in rolling contact with the guide shafts 622. In response to the resilient urging of the pressing rollers 58 and 58′ against the back-up surface 108, the tiltable frame 623 is angularly adjusted about the axis defined by the pivot pins 624 so as to achieve the desired attitude of the rollers 58 and 58′ relative to the back-up surface 108. In other words, the tiltable frame 623 is automatically urged to a position in which the peripheral surfaces of the pressing rollers 58 and 58′ apply pressure uniformly to the back-up surface 108 across the width of each of the pressing rollers and in a direction perpendicular to the back-up surface 108.

Another example of a self-aligning means in a developing apparatus 1G embodying this invention will now be described with reference to FIGS. 32 and 33. The apparatus 1G differs from the apparatus 1 described with reference to FIGS. 6-14 in that the shafts 59 and 59′ of the pressing rollers 58 and 58′ may be mounted directly in suitable holes in the depending flanges 745 of the body 743 of the carriage 742. Thus, the carriage and roller assembly 741 of the apparatus 1G is merely guided by the guide shafts 22 (not shown on FIGS. 32 and 33) and no springs are present within the assembly 741 for urging the pressing rollers 58 and 58′ downwardly relative to the carriage body 743.

Figure 32:
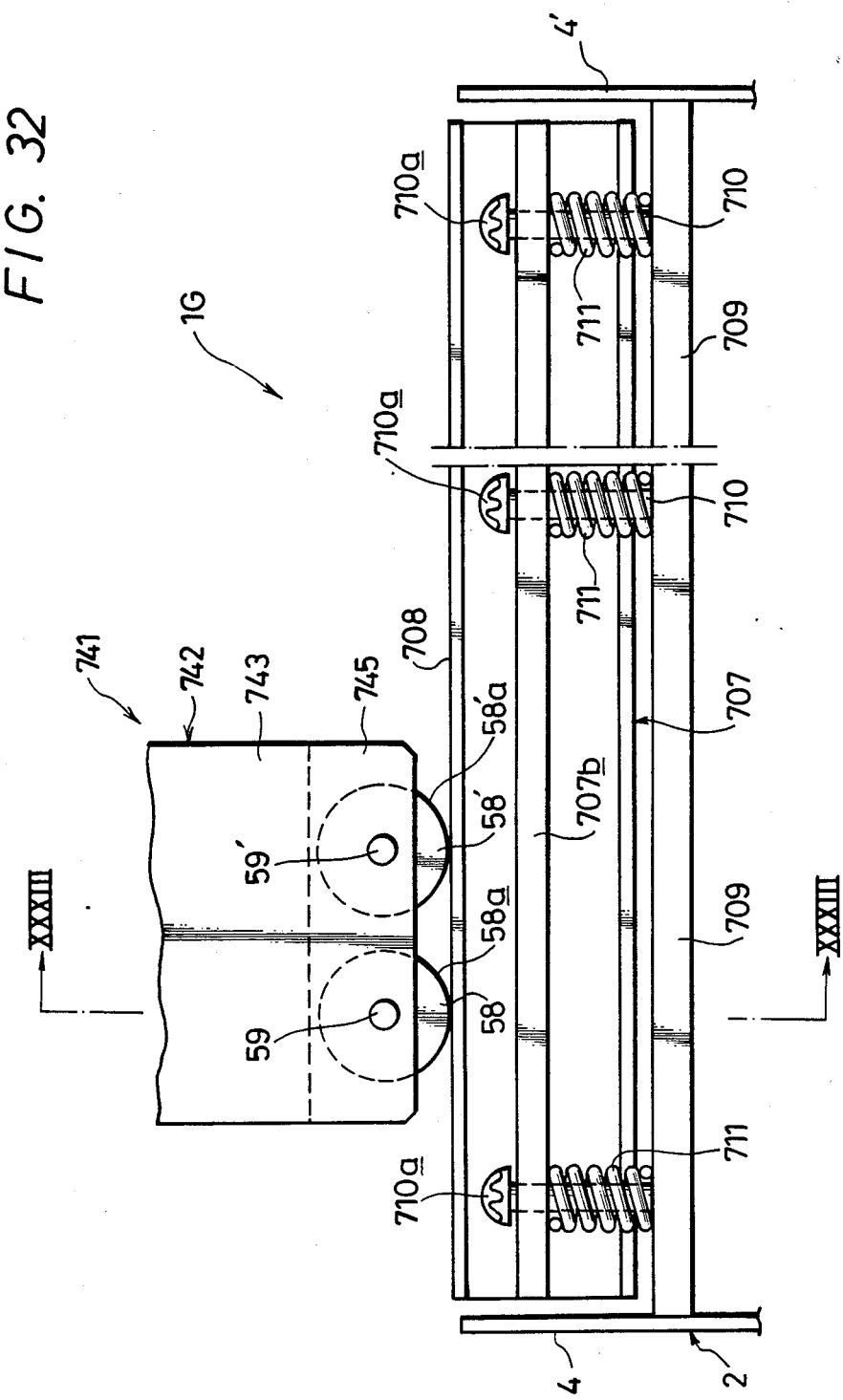
FIG. 32 is a schematic front elevational view illustrating a developing apparatus according to still another embodiment of this invention.
Figure 33:
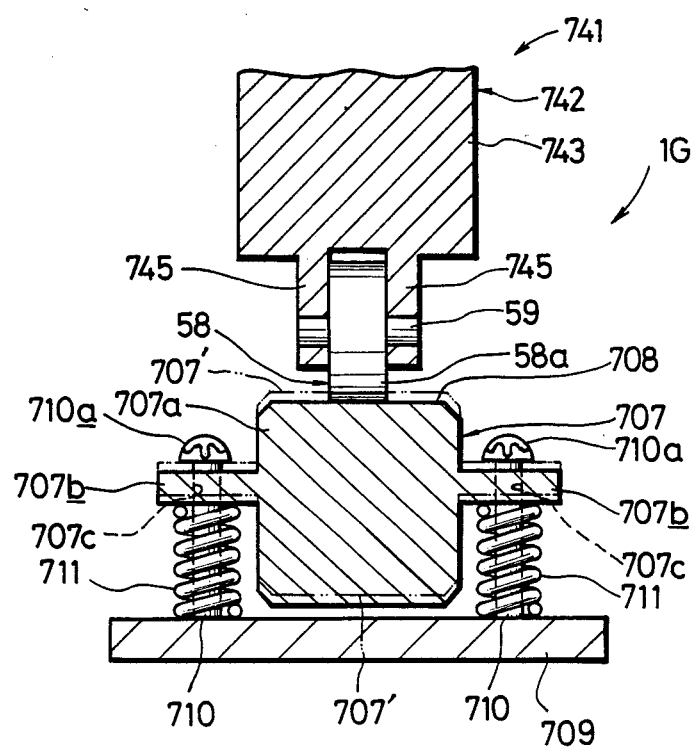
FIG. 33 is a sectional view taken along the line XXXIII—XXXIII on FIG. 32.
Figure 34:
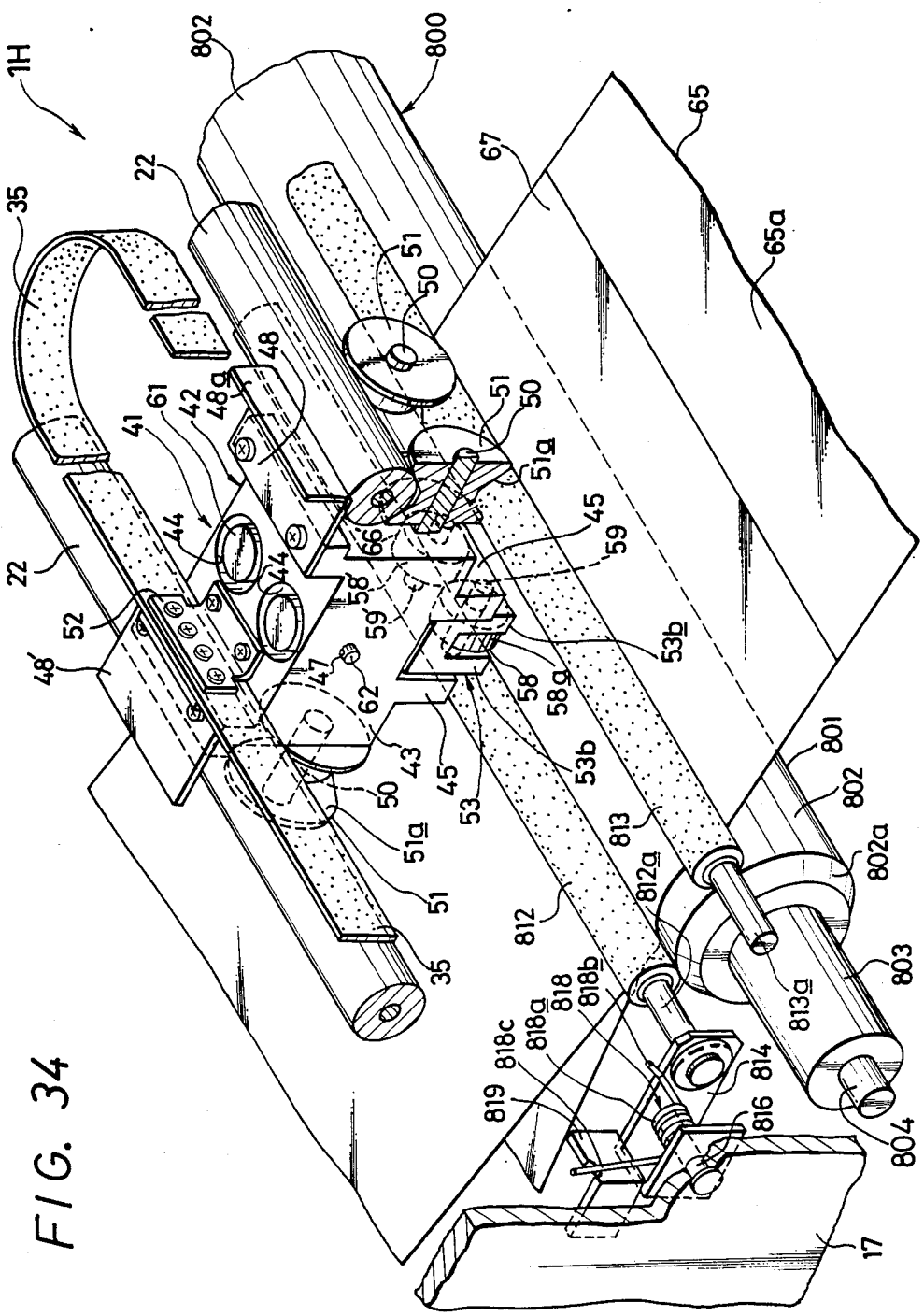
FIG. 34 is a partly cut-away perspective view similar to that of FIG. 6, but showing a developing apparatus according to a further embodiment of the present invention.

Further, in the apparatus 1G of FIGS. 32 and 33, the fixed back-up member 7 of the apparatus 1 is replaced by a floating back-up member 707 which is spring urged upwardly against the peripheries 58a and 58′a of the pressing rollers. More specifically, the floating back-up member 707 has a hard metal body 707a provided with an approximately square cross section for high rigidity and formed with flanges 707b projecting laterally along its opposite sides. A rigid, elongated support plate 709 extends laterally between the side walls 4 and 4′ of the lower frame structure 2 and is securely attached thereto. Guide pins 710 with heads 710a at their upper ends extend from the support plate 709 in uniformly spaced apart rows at opposite side of the body 707a of the floating back-up member 707. The flanges 707b are provided with suitably spaced apart holes 707c through which the guide pins 710 loosely extend with the heads 710a situated above the flanges 707b. Finally, helical compression springs 711 are provided around the guide pins 710 between the support plate 709 and the flanges 707b so as to urge the back-up member 707 to a raised position shown in dot-dash lines at 707′ on FIG. 33, and at which the flanges 70b abut against the heads 710a of the guide pins.

The various parts of the apparatus 1G are dimensioned so that, when the movable upper frame structure thereof (not shown) which corresponds to the frame structure 16 of the apparatus 1, is locked in its horizontal operative position, the pressing rollers 58 and 58′ act against the back-up surface 708 at the top of the back-up member 707 so as to push the latter downwardly a small distance, for example, to the position indicated in full lines on FIG. 33, against the forces of the springs 711. Accordingly, the back-up surface 708 is continuously urged, by the forces of the springs 710, against the peripheries 58a and 58′a of the pressing rollers 58 and 58′. By reason of the loose fit of the guide pins 710 within the holes 707c of the flanges 707b, the back-up member 707 is free to be urged to any attitude in which there will be uniform pressure distribution between the back-up surface 708 and the peripheral surfaces 58a and 58′a of the pressing rollers across the entire axial widths of such rollers.

It will be appreciated that each apparatus 1E, 1F or 1G, by reason of its described self-aligning feature, ensures that, as the rollers 58 and 58′ are moved across the superposed sheet 67 of developing paper and photo-sensitive film 65 against the respective back-up surface, the pressure is applied uniformly to the sheet 67 and film 65 across the entire width of each pressing roller for thereby ensuring that irregular concentration of development will be avoided. Furthermore, by reason of the self-aligning feature, the desired contact between the back-up surface and the peripheries of the pressing rollers is reliably achieved without requiring extreme accuracies and care in the manufacture and assembly of the apparatus.

Referring now to FIGS. 34-37, it will be seen that a developing apparatus 1H in accordance with still another embodiment of this invention is there shown to be generally similar to the apparatus 1 described in detail with reference to FIGS. 6-14 and differs substantially therefrom only in respect to the structures provided in the apparatus 1H for defining a back-up surface to support the photo-sensitive film 65 and the sheet 67 of developing paper during the pressing together thereof, and the structure provided for effecting the intermittent transportion of the film 65 and sheet 67 across such back-up surface.

Those parts of the apparatus 1H which are substantially unchanged from the corresponding parts in the apparatus 1 are identified by the same reference numerals and will not be further described herein.

Figure 35:
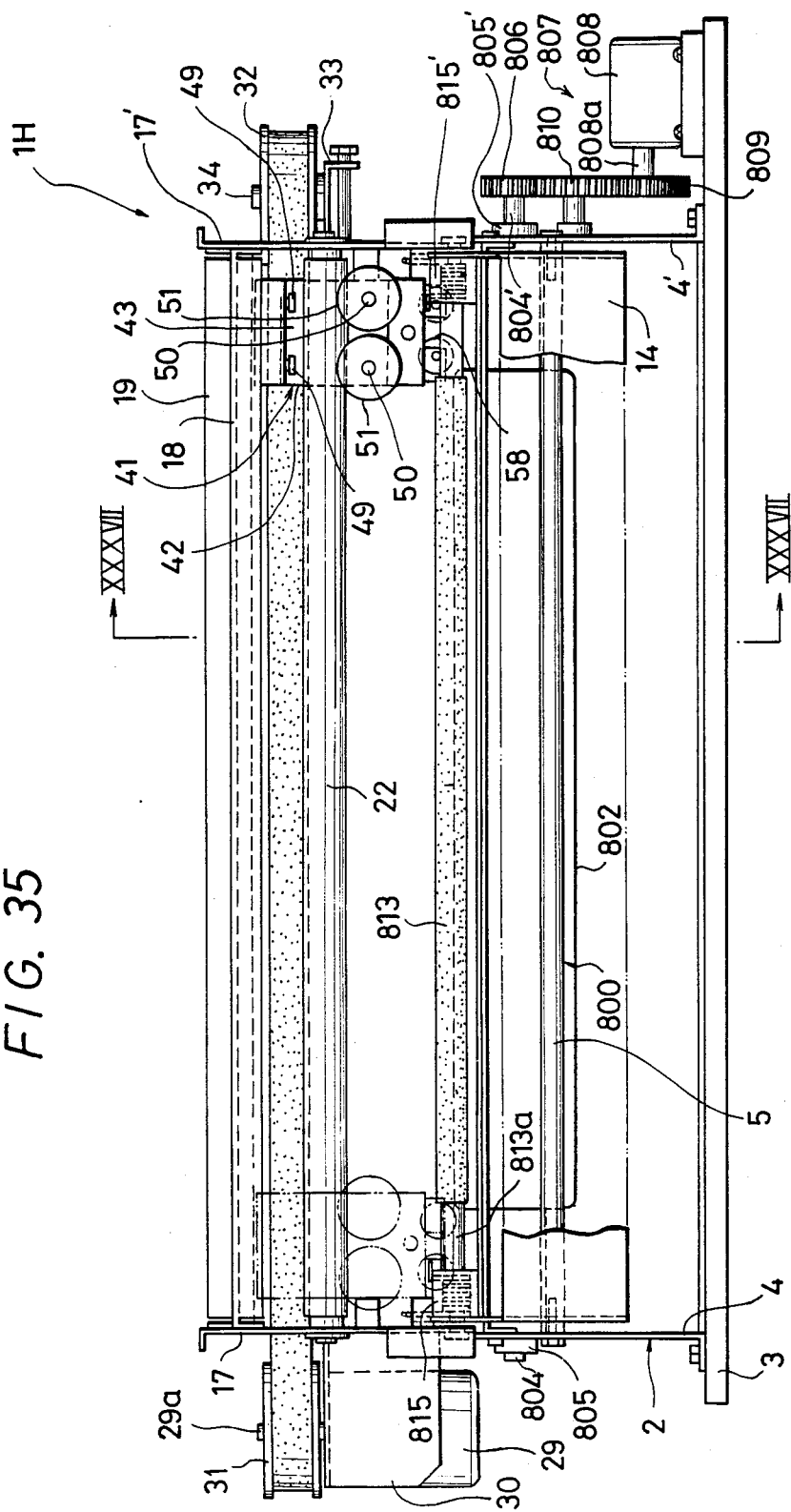
FIG. 35 front elevational view of the apparatus shown on FIG. 34.
Figure 36:
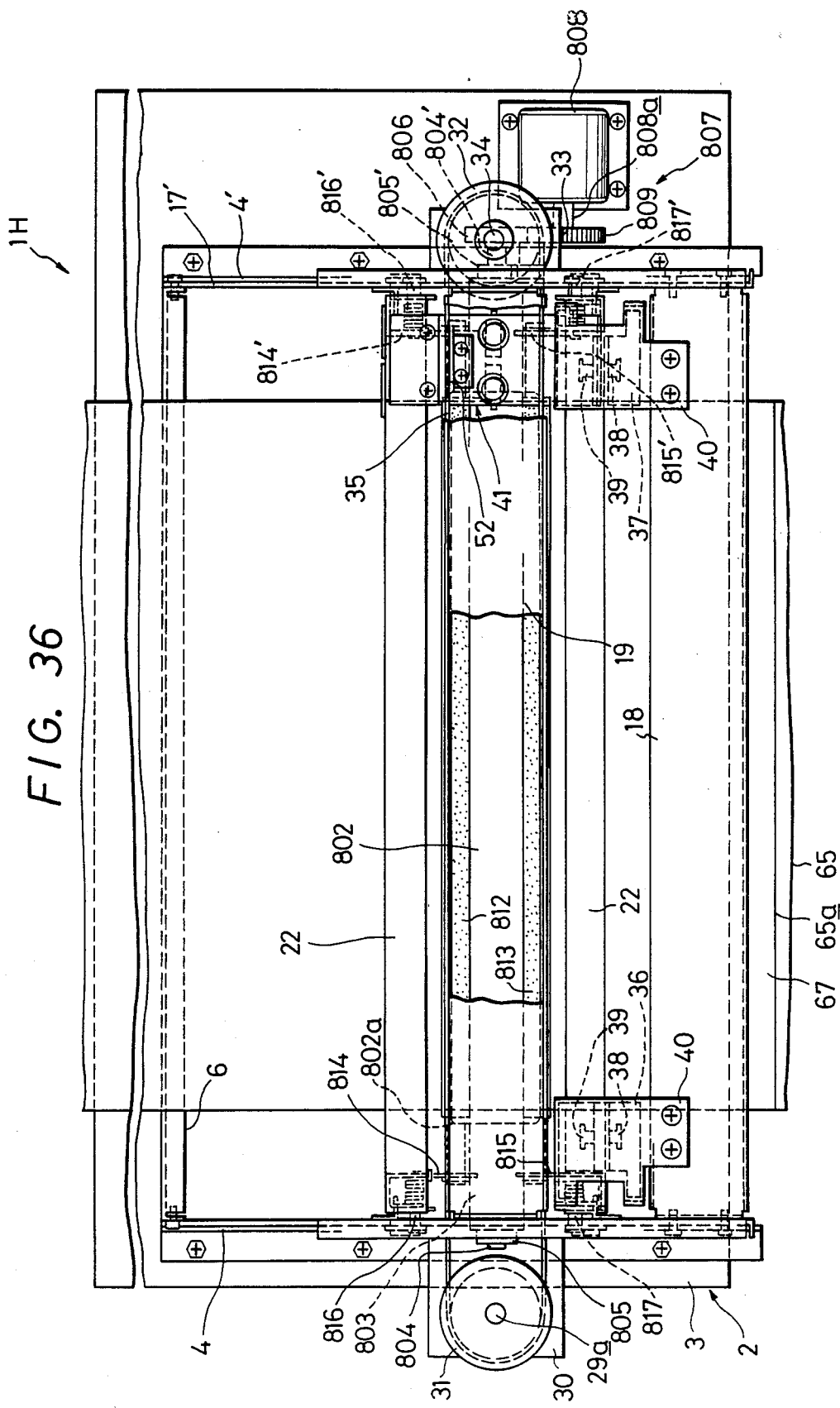
FIG. 36 is a top plan view of the apparatus of op plan view of the apparatus of FIGS. 34 and 35.

In the apparatus 1H, a back-up member 800 is provided in the form an elongated cylindrical body 801 which, at its periphery defines a cylindrical back-up surface 802 having an axial length slightly longer than the width of the photo-sensitive film 65 and the sheet 67 of developing paper which are to be pressed together between the pressing rollers 58 and 58' and the back-up surface 802. The back-up member 800, which also serves as part of structure for feeding the film 65 and sheet 67, as hereinafter described in detail, has reduced diameter end portions 803 extending axially from the opposite ends of the cylindrical body 801 and terminating in trunnions 804 and 804' which are journaled in bearings 805 and 805', respectively, fixedly supported by the side walls 4 and 4' of the lower frame structure 2 (FIG. 35). The bearings 805 and 805' are positioned so that the axis of the cylindrical back-up member 800 will extend horizontally in a vertical plane that substantially bisects the peripheral surfaces 58a and 58'a of the rollers 58 and 58' as the latter are movable with the carriage and roller assembly 41 along the guide shafts 22. The trunnion 804' received in the bearing 805' extends axially through the latter and has a driven gear 806 fixed thereto. A drive assembly 807 is provided for the cylindrical back-up member 800 and may include a so-called stepping motor 808 secured on the base 3 adjacent the side wall 4' and having a driving gear 809 fixed to the motor shaft 808a for meshing engagement with an intermediate gear 810 which is suitably rotatably mounted on the adjacent side wall 4' so as to also be in meshing engagement with the driven gear 806.

The reduced diameter end portions 803 of the cylindrical back-up member 800 are provided with axial dimensions substantially larger than the width of the carriage and roller assembly 41 and, as hereinafter described, provide stand-by positions for the assembly 41 during the intermittent advancements of the film 65 and sheet 67 across the back-up surface 802. Further, as is particularly shown on FIG. 34, the cylindrical back-up surface 802 on the member 800 has rounded edges 802a at the opposite ends thereof for a purpose hereinafter described in detail.

Figure 37:
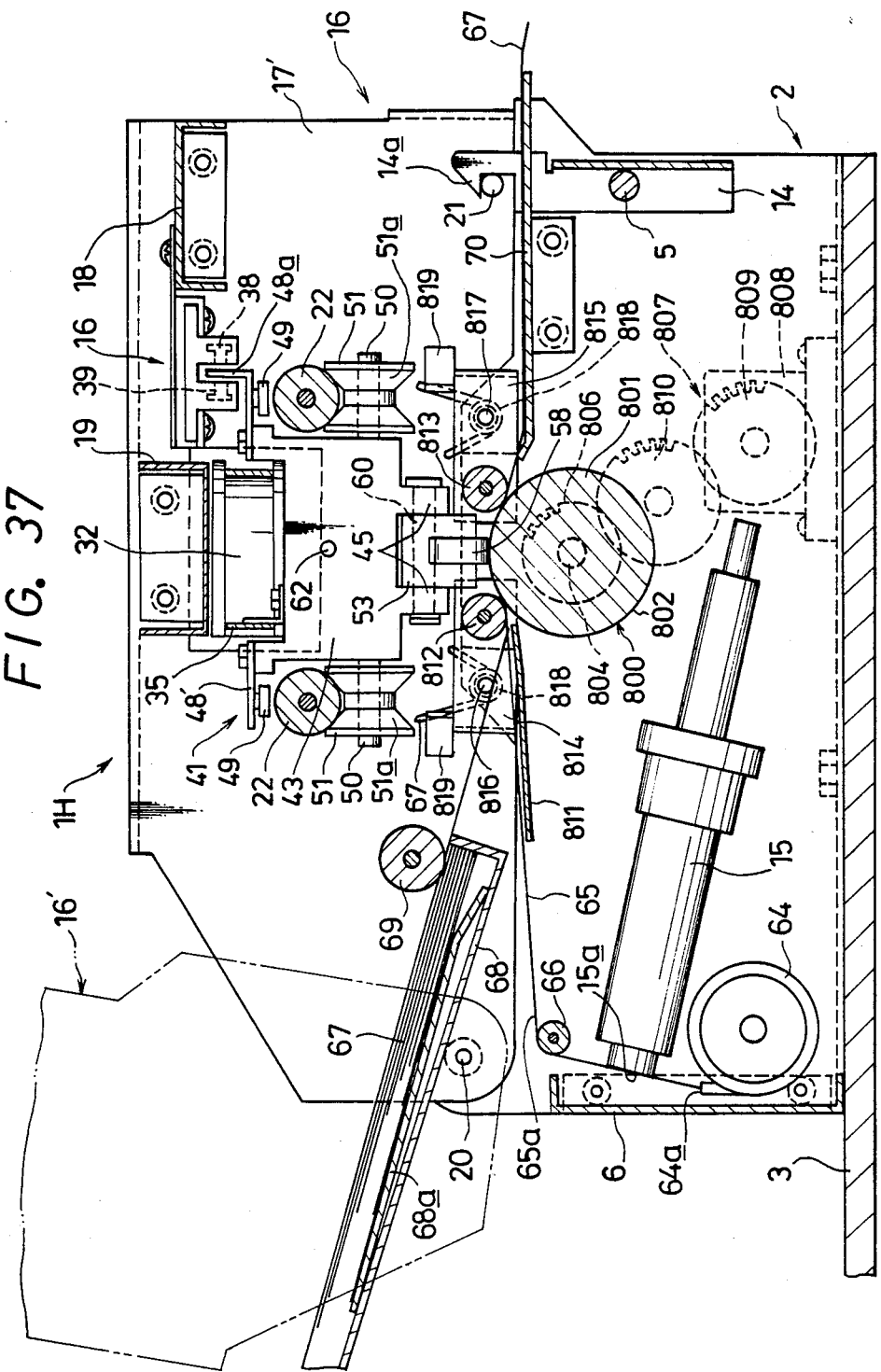
FIG. 37 is a sectional view taken along the line XXXVII—XXXVII on FIG. 35.

In the apparatus 1H, the paper discharge guide plate 70 extends forwardly from adjacent the cylindrical back-up surface 802 on the back-up member 800 in a substantially horizontal plane that is below the tangent to the surface 802 at the top thereof (FIG. 37). A paper and film feed guide plate 811 is also provided in the apparatus 1H and extends between, and is connected to the side walls 4 and 4' of the lower frame structure 2 in back of the cylindrical back-up member 800. As shown on FIG. 37, the feed guide plate 811 is disposed under the path of the photo-sensitive film 65 running forwardly from the guide roller 66 to the back-up surface 802 at a position below the top of the latter.

In the apparatus 1H, guiding or pinch rollers 812 and 813 are provided to cooperate with the cylindrical back-up surface 802 of the rotatable back-up member 800 for wrapping the photo-sensitive film 65 and the sheet of developing paper 67 in contact with each other about an upper portion of the circumference of the back-up surface 802, and for causing the intermittent transportation of the film 65 and sheet 67 across the back-up surface in response to the incremental or step-by-step rotation of the member 800. The guiding and pinching rollers 812 and 813 are shown to be of substantially the same length as the cylindrical body 801 of the member 800 and extend parallel to the axis of the latter in front and in back, respectively, of a vertical plane passing through the axis of the member 800, and equally distanced from that vertical plane. The rollers 812 and 813 are rotatable on shafts 812a and 813a, respectively, which project axially beyond the respective rollers, and which are supported, at their opposite ends by support arms 814 and 814' and support arms 815 and 815', respectively. The arms 814 and 814' extend substantially horizontally forward from pivot pins 816 and 816' which are carried by the side walls 17 and 17' of the upper frame structure 16 and which are located so that the roller 812 will be positioned to bear downwardly against the back-up surface 802 at a position in back of the vertical plane containing the axis of rotation of the member 800, and hence at a position below the summit or longitudinal median of the back-up surface 802 at the top of the cylindrical body 801. The support arms 815 and 815' are similar pivotably supported on, and extend substantially horizontally rearward from pivot pins 817 and 817' which are carried by the side walls 17 and 17', respectively. The pivot pins 817 and 817' are located at about the same level as the pivot pins 816 and 816' and positioned so that the roller 813 can bear downwardly against the back-up surface 802 in front of the vertical plane passing through the axis of the member 800 and slightly below the summit of the cylindrical back-up surface 802, that is, the longitudinal median of the effective back-up surface.

Each of the support arms 814, 814', 815 and 815' is urged downwardly about its respective pivot pin 816, 816', 817 and 817' by a respective torsion spring 818. As shown particularly on FIG. 34 in respect to the torsion spring 818 associated with the support arm 814, each of the torsion springs 818 has a coil portion 818a extended around the respective pivot pin 816, 816', 817 or 817', and angularly related arms 818b and 818c extending from the opposite ends of the coil portion 818a and being relatively resiliently urged by the latter so as to increase the angular distance between the arms 818b and 818c. The arm 818b of each of the torsion springs 818 engages the respective support arm 814, 814', 815 or 815', and the other arm 818c of each torsion spring acts against a respective spring anchor 819 which is suitably secured to the adjacent side wall 17 or 17'. It will be appreciated that, by reason of the torsion springs 818 urging the support arms 814 and 814' downwardly about the respective pivot pins 816 and 816' and similarly urging the support arms 815 and 815' downwardly about the respective pivot pins 817 and 817', rollers 812 and 813 are pressed downwardly against the back-up surface 802 when the movable upper frame structure 16 is displaced to its operative horizontal position shown in full lines on FIG. 37.

As earlier noted, the apparatus 1H, apart from the foregoing, is essentially similar to the apparatus 1 of FIGS. 6–14 and has its carriage and roller assembly 41 positioned by the guide shafts 22 so that the pressing rollers 58 will be pressed downwardly toward the back-up surface 802 at the longitudinal median line thereof midway between the guiding and pinch rollers 812 and 813, as clearly shown on FIG. 37. The apparatus 1H may also have its operations controlled by a circuit similar to that shown on FIG. 13, but in which the motor 11 provided for driving the feed roller 9 and the tensioning roller 10 of the developing apparatus 1 is replaced by the motor 808 of the drive mechanism 807 for the rotatable back-up member 800 in the apparatus 1H.

The operation of the apparatus 1H in accordance with this invention will now be described:

At the initiation of a printing or developing operation of the apparatus 1H, the carriage and roller assembly 41 is disposed at one or the other of its end or stand-by positions corresponding to the reduced diameter end portions 803 of the back-up member 800 so that the pressing rollers 58 and 58′ of the assembly 41 are than fully disengaged from any surface of the back-up member 800 to avoid any interference with turning of the latter. While the carriage and roller assembly 41 waits at one of its end or stand-by positions, the stepping motor 808 of the drive 807 is suitably operated for turning the back-up member 800 in the clockwise direction, as viewed on FIG. 37. As a result of the pressing of the rollers 812 and 813 against the back-up surface 802, the rollers 812 and 813 are frictionally driven in the counter-clockwise direction, as viewed on FIG. 37. As a result of the intermittent or stepping operation of the motor 808, the photo-sensitive film 65, which has been initially threaded between the roller 812 and the back-up member 800, and then between the roller 813 and the back-up member 800, is intermittently transported past the FOT 15 so that the exposure side 65a of the film is exposed line-by-line to light passing through the transparent base of the film so as to provide an exposure of the desired picture on a prescribed area or frame of the film 65.

As the exposed frame of the film 65 nears the nip between the roller 812 and the back-up surface 802 on rotatable back-up member 800, a sheet 67 of developing paper is supplied from the tray 68 so as to overlap the exposed frame of the film in correct registration therewith and to be fed together with the film 65 between the roller 812 and the back-up surface 802, and then toward the summit or longitudinal median of the back-up surface 802 which is vertically aligned with the axis of rotation of the member 800.

The arrival of the leading end of the exposed frame of the photo-sensitive film 65 at the longitudinal median of the back-up surface 802 is detected by a suitable sensor (not shown) to provide a start signal by which the flip-flop circuit 75 causes the motor drive circuit 76 to effect operation of the motor 29 in the direction for moving the carriage and roller assembly 41 away from the end or stand-by position at which it resided while awaiting the arrival of the exposed frame of the film. In response to such operation of the motor 29, the carriage and roller assembly 41 is moved parallel to the guide shafts 22, that is, parallel to the axis of the back-up member 800 so that the rollers 58 and 58′ move from a stand-by position free of the back-up member 800 onto the back-up surface 802. In the course of such movement onto the back-up surface 802, the tandem arranged pressing rollers 58 and 58′ roll over the rounded edge 802a at the respective end of the back-up surface 802, thereby to avoid excessive noise and resistance to the movement of the pressing rollers 58 and 58′ from the stand-by position thereof onto the back-up surface 802 where the pressing rollers 58 and 58′ roll parallel to the axis of the member 800 and thereby press together the sheet 67 of developing paper and the photo-sensitive film 65 against the back-up surface 802. In thus scanning across the sheet 67 of developing paper and the photo-sensitive film 65 in the direction of the width of the latter, the rollers 58 and 58′ cause a stripe or band-shaped area extending across the width of the sheet 67 and the film 65 to be subjected to pressure between the pressing rollers 58 and 58′ and the back-up surface 802 for causing developing of the corresponding band-shaped area of the exposed color picture on the sheet 67.

When the carriage and roller assembly 41 has moved completely across the width of the sheet 67 and film 65 and reaches its other end or stand-by position corresponding to a respective reduced diameter end portion 803 of the back-up member 800 so that the pressing rollers 58 and 58′ are again out of engagement with the member 800, the sensor 36 or 37 detects the arrival of the assembly 41 at such other end position and provides a signal of logic level [1] through the OR circuit 74 to the flip-flop 75 for inverting the polarity of the output from the flip-flop circuit. However, at the same time, the signal of logic level [1] from the sensor 36 or 37 triggers the respective monostable multi-vibrator 71L or 71R, and the resulting output from the triggered monostable multi-vibrator is passed through the OR circuit 72 to the motor drive circuit 76 for inhibiting any operation of the motor 29 for the duration of such pulse. Thus, for the duration of any pulse from the monostable multi-vibrator 71L or 71R, the carriage and roller assembly 41 remains at rest at one or the other of its stand-by or end positions, while the motor drive circuit 73 responds to such pulse for causing operation of the stepping motor 808 by which a further increment of movement of the sheet 67 together with the film 65 is effected in response to corresponding angular displacement of the back-up member 800. At the completion of the incremental movement of the film 65 and sheet 67 determined by the duration of the pulse from the monostable multi-vibrator 71L or 71R, and which is no greater than the width of the previously mentioned band-shaped pressing area, the absence of any pulse fed from the OR circuit 72 to the motor drive circuit 76 enables the latter to effect renewed operation of the motor 29 in the direction corresponding to the polarity of the output then being received by the motor drive circuit 76 from the flip-flop circuit 75. Thus, the carriage and roller assembly 41 is moved laterally or returns to its original end or stand-by position and, during such movement, the rollers 58 and 58′ again press together the sheet 67 of developing paper and the photo-sensitive film 65 against the back-up surface 802 in another band-shaped pressing area that abuts or partially overlaps the band-shaped area in which the sheet 67 and film 65 were previously pressed together.

It will be apparent from the foregoing that the intermittent transportation of a sheet 67 of developing paper and the photo-sensitive film 65 and the movement or transportation of the rollers 58 and 58′ laterally across the sheet 67 and film 65 while supported on the back-up surface 802 are alternately performed in a repetitive manner. Each time the pressing rollers 58 and 58′ move from a stand-by position across the sheet 67 and film 65 against the back-up surface 802 and then to the other end or stand-by position, the rollers 58 and 58′ roll onto and from the back-up surface 802 at the rounded edges 802a thereof.

Each time the pressing rollers 58 and 58′ move across the sheet 67 and film 65 against the back-up surface 802, the microcapsules of pigment precursors of the photo-sensitive film 65 situated in the band-shaped pressing area and which have not been exposed to light by the FOT 15 are ruptured or crushed so as to transfer the respective pigment precursors to the developing surface 67a of the sheet 67 thereby to react chemically with the developing agents on such surface for providing the respective pigment or color on the sheet 67. Thus, each traverse of the sheet 67 and film 65 by the rollers 58 and 58' causes a band-shaped part of the image or picture to be printed or developed on the sheet 67. Since the pressing rollers 58 and 58' successively press together the same band-shaped area of the photo-sensitive film 65 and the sheet 67 of developing paper against the back-up surface 802 by rolling thereacross in tandem, the area at which each of the rollers 58 and 58' contacts the sheet 67 at any one time is very small so that the force exerted by the springs 63 and 63' of the carriage and roller assembly 41 may be as small as 2 to 3 kg, as compared with the force of 1,000 to 1,500 kg required for pressing together the roller e and f in the prior art of FIG. 1.

Furthermore, since the sheet 67 of developing paper and the photo-sensitive film 65 are transported by rotation of the back-up member 800, no friction occurs between the sheet 67 and the film 65, and the back-up surface 802 on the rotated member 800 so that the sheet 67 and the film 65 are always transported through the correct incremental distance and with high accuracy. Since the incremental amount of movement of the sheet 67 and the film 65 is regular for the successive feeding periods, the successive band-shaped areas at which the pressing rollers 58 and 58' press together the sheet 67 and the film 65 against the back-up surface 802 are of regular width for ensuring clear and uniform development of the picture or image.

It is also to be noted that, since the rotatable back-up member 800 which defines the back-up surface 802 also forms part of the arrangement for effecting the intermittent transportation of the sheet 67 and the film 65, the number of parts to be assembled for providing the apparatus 1H is considerably reduced.

When the motor 808 for driving the rotatable back-up member 800 is a stepping motor, as described, the back-up member 800 is electro-magnetically locked against rotation in the intervals when the motor 808 is not operated, that is, when the carriage and roller assembly 41 is being laterally moved across the superposed sheet 67 and film 65 against the back-up surface 802. If some other type of motor is used for the motor 808, other means are provided for locking the back-up member 800 against rotation when the motor 808 is inoperative, for example, a worm gear mechanism may be interposed in the transmission between the motor 808 and the back-up member 800.

In accordance with another feature of this invention, either the peripheral surface of a pressing roller or a back-up surface between which a sheet of developing paper and a photo-sensitive film are pressed together is formed with minute concave and convex surface irregularities distributed thereover so that the force urging the pressing roller toward the back-up surface causes contact pressures to be applied to the sheet of developing paper and the photo-sensitive film primarily at the localized areas defined by the convex surface irregularities.

Figure 38:
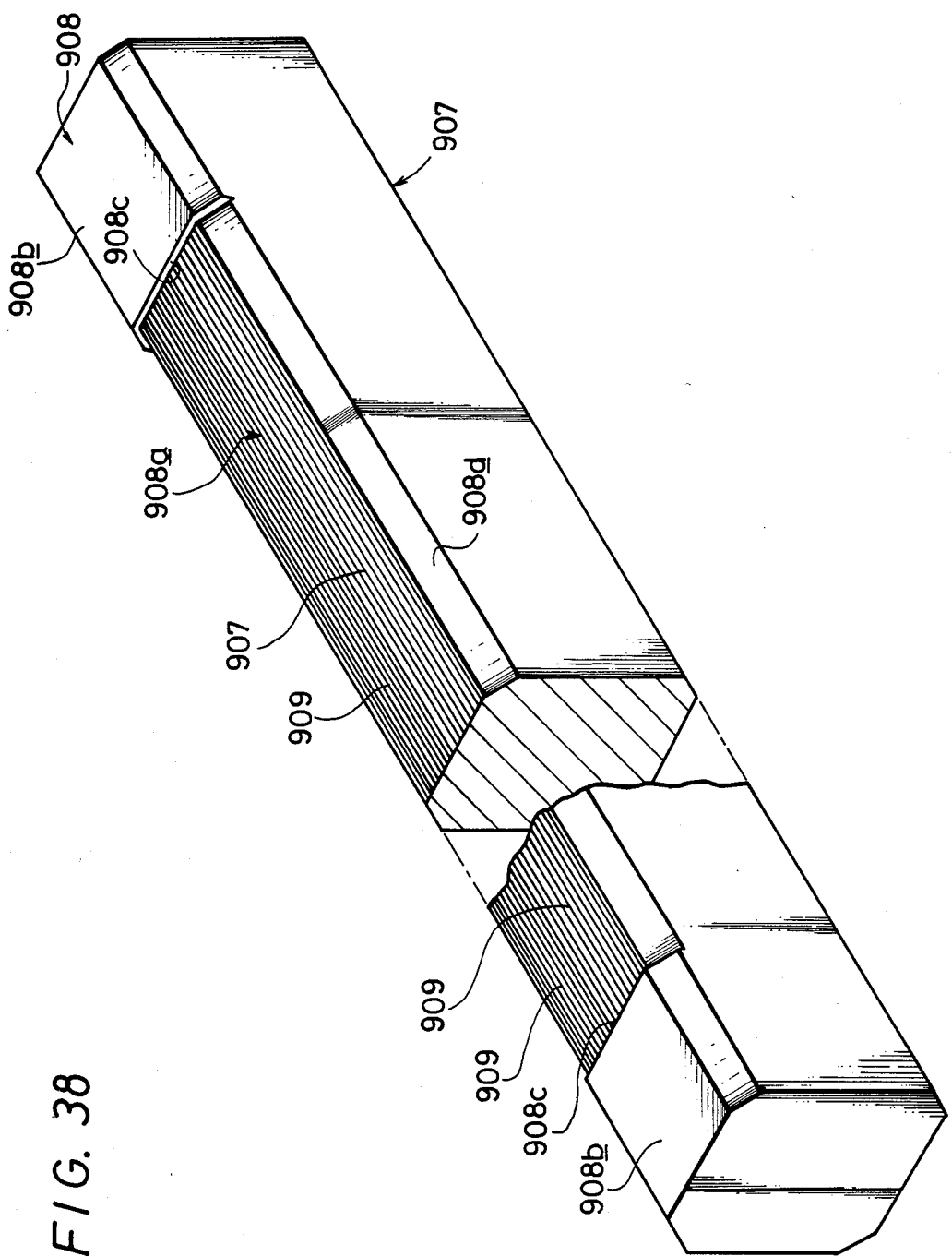
FIG. 38 is a fragmentary perspective view showing a back-up member which, in accordance with still another embodiment of the present invention, has a back-up surface formed to concentrate the application of pressure to sheets of developing paper and photo-sensitive material contacting each other on the back-up surface.

In respect to the foregoing, reference is made to FIGS. 38 and 39 in which there is illustrated a back-up member 907 that can be used in place of the back-up member 7 in the apparatus 1 of FIGS. 6–14. The back-up member 907 is similarly shown to have a top surface 908 divided to provide a back-up surface 908a having a length, measured in the lateral direction of the developing apparatus, corresponding to the widths of the sheets of developing paper and photo-sensitive film to be employed in the apparatus, and stand-by surfaces 908b extending from the opposite ends of the back-up surface 908a and being raised relative to the latter for defining guide shoulders 908c at the ends of the back-up surface 908a. However, in the embodiment illustrated by FIGS. 38 and 39, the top surface 908 of the back-up member 907 is generally flat and has beveled or rounded edges 908d extending along its opposite longitudinal margins. Furthermore, in accordance with this invention, the back-up surface 908a is formed with a large number of parallel grooves 909 extending lengthwise along the back-up surface 908a. Such grooves 909, which are desirably of V-shaped cross section, are of a size generally corresponding to the resolution of a picture to be developed, for example, from 100 μm to about 200 μm. For example, the grooves 909 may be provided with a pitch p of about 200 μm and with a depth of substantially twice the pitch p. Of course, if desired, the pitch p of the grooves 909 may be higher than 200 μm when the required resolution is not too high. Of course, the parallel V-shaped grooves 909 define protrusions 910 (FIG. 39) therebetween, and such protrusions 910 are of inverted V-shaped cross section. The described grooves 909 and the intervening protrusions 910 may be manufactured, for example, through the use of a laser beam.

It will be seen that the alternating grooves 909 and protrusions 910 form minute concave and convex surface irregularities distributed across the back-up surface 908a. Thus, when a pressing roller 58 or 58' having a cylindrical peripheral surface presses a sheet 67 of developing paper and an underlying photo-sensitive film 65 against the back-up surface 908a while rolling along the latter in the longitudinal direction of the back-up member 907, the resulting contact pressures are concentrated at the regions corresponding to the ridges of the protrusions 910. Accordingly, without increasing the force employed for urging the roller 58 or 58' against the back-up surface 908a, the pressure exerted on each of the microcapsules 65c of the film 65, which microcapsules correspond, in size, to the desired resolution, is very substantially increased so that the rupture of the non-hardened microcapsules is assured.

Figure 4:
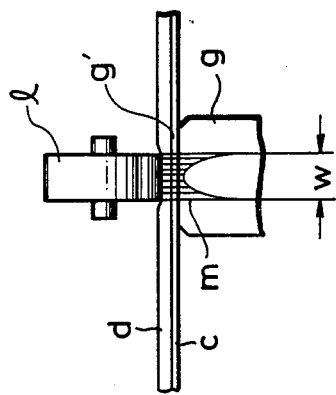
FIG. 4 is a schematic side elevational view, similar to that of FIG. 3A, but showing another previously proposed developing apparatus.

The back-up member 907 described with reference to FIGS. 38 and 39 is further advantageous as compared with a back-up member having a flat back-up surface, for example, as in the prior art illustrated by FIG. 4. In such prior art arrangement, if the back-up surface g' is not absolutely flat, the pressing roller 1 will concentrate the pressure applied to the sheet d and film c at those areas of the irregular surface g' that are relatively high. As distinguished from the foregoing, in the case of the back-up surface 908a embodying this invention, the contact pressure is concentrated at the peaks or ridges of the protrusions 910 distributed across the entire width of the back-up surface so that the sheet 67 and film 65 are uniformly pressed together across the entire width of the band-shaped pressing area for ensuring uniform concentration of the development.

Referring now to FIG. 40, it will be seen that the advantages of the back-up surface 908a described with reference to FIGS. 38 and 39 can be achieved by providing a back-up member 907' with a back-up surface 908'a having a multitude of small holes or pits formed, for example, by etching, in the surface 908'a and being randomly distributed thereover with a predetermined spacing, for example, of about 100 μm to 200 μm. Thus, the back-up surface 908'a again has minute concave and convex surface irregularities distributed thereover and defined by the holes or pits 909' and the spaces therebetween. Once again, when a pressing roller 58a rolls across the back-up surface 908'a with a sheet of developing paper and a photo-sensitive film in contact with each other therebetween, the pressure exerted by the roller 58 is concentrated at the localized areas defined by the convex surface irregularities, that is, by the surfaces between the holes 909'. By reason of such concentration or localizing of the exerted pressure, the microcapsules which have not been irradiated will surely be ruptured for releasing the respective pigment precursors.

Having described a number of preferred embodiments of the present invention by way of example, it will be apparent that the invention is not limited to those specific embodiments, and that many modifications and variations can be effected therein by one skilled in the art without departing from the scope of spirit of the invention as defined in the appended claims.

What is claimed is:

1. An apparatus for developing a picture on a sheet of developing paper from a sheet of photo-sensitive material of a type which develops said picture upon the pressing together of said sheets of developing paper and photo-sensitive material, said apparatus comprising:

a back-up member having a back-up surface and standby surfaces extending from the opposite ends of said back-up surface and being raised relative to the latter for defining guide shoulders at said ends of the back-up surface;

means for intermittently transporting said sheets of developing paper and photo-sensitive material in contact with each other across said back-up surface between said guide shoulders in a predetermined direction of sheet travel at a substantial angle to a longitudinal median of said back-up surface;

at least one rotatable roller disposed in opposing relation to said back-up surface and having an axis of rotation substantially at right angles to said longitudinal median of said back-up surface;

means mounting said roller for bodily movements relative to said back-up member toward and away from said back-up surface and parallel to the back-up surface in directions parallel to said longitudinal median thereof;

means for transporting said roller relative to said back-up member in said directions parallel to said longitudinal median from one to another of said standby surfaces while urging said roller toward said back-up surface with said sheets of developing paper and photo-sensitive material being in contact with each other between said roller and said back-up surface so as to be pressed together thereby; and control means for causing coordinate operations of said means for intermittently transporting the sheets and said means for transporting said roller so that said sheets are transported a predetermined incremental distance in said direction of sheet travel while said roller is situated on one of said standby surfaces and said sheets are at rest while said roller is transported along said back-up surface from one to another of said standby surfaces.

2. An apparatus according to claim 1; in which said standby surfaces are raised relative to said back-up surface by a distance approximately equal to the combined thicknesses of said sheets of developing paper and photo-sensitive material.

3. An apparatus according to claim 1; in which said sheet of developing paper is softer than said sheet of photo-sensitive material, and said sheets are arranged between said roller and back-up surface so that said sheet of photo-sensitive material contacts said back-up surface and said roller contacts said sheet of developing paper in being transported from one to another of said standby surfaces.

4. An apparatus according to claim 1; in which said back-up member and said roller are configured so that, during said transporting of said roller across said back-up surface from one to another of said standby surfaces, the contact pressure between the peripheral surface of said roller and said back-up surface is smaller at the opposite margins of said peripheral surface than at any other portions of the latter between said margins.

5. An apparatus according to claim 4; in which at least one of said back-up surface and said peripheral surface of said roller is shaped to diverge relative to the other of said back-up surface and peripheral surface from the median of said peripheral surface toward said opposite margins of the peripheral surface.

6. An apparatus according to claim 5; in which said peripheral surface is outwardly concave between said margins and said back-up surface is outwardly convex and has a rectilinear generatrix extending parallel to said directions in which said roller is transported; and in which said outwardly concave peripheral surface has a larger radius of curvature than said outwardly convex back-up surface.

7. An apparatus according to claim 5; in which said back-up surface is flat and said peripheral surface is outwardly convex between said margins.

8. An apparatus according to claim 5; in which said peripheral surface of said roller is cylindrical and has a rectilinear generatrix extending parallel to the axis of rotation of the respective roller, and said back-up surface is outwardly convex and has a rectilinear generatrix extending parallel to said directions in which said roller is transported.

9. An apparatus according to claim 4; in which said peripheral surface of said roller in cylindrical and has a rectilinear generatrix extending parallel to the axis of rotation of the roller, said back-up surface is flat, and said roller has opposed flanks with annular recesses therein concentric with said axis of rotation of the roller so that the rigidity of said roller at the opposite margins of said peripheral surface is less than the rigidity of the roller at a median portion of said peripheral surface intermediate said margins.

10. An apparatus according to claim 1; in which said back-up member is cylindrical and includes non-rotatable end portions having peripheral surfaces defining said standby surfaces, and a mid-portion between said end portions which is of smaller diameter than the latter to define said back-up surface and which is rotatable during said transporting of the sheets of developing paper and photo-sensitive material.

11. An apparatus according to claim 1; in which at least one of said back-up surface and the peripheral surface of said roller is formed with minute concave and convex surface irregularities distributed thereover.

12. An apparatus according to claim 11; in which said photo-sensitive material has a surface comprised of photo-sensitive microcapsules which are selectively hardened by exposure to a light image and which contain respective color-forming substances released for correspondingly coloring said developing paper when said sheets are pressed together between said roller and said back-up surface with sufficient pressure exerted at said minute concave and convex surface irregularities to rupture the microcapsules that have not been hardened.

13. An apparatus according to claim 12; in which said minute concave and convex surface irregularities substantially correspond in size to a predetermined resolution of the picture to be developed on said sheet of developing paper.

14. An apparatus according to claim 1; further comprising a second rotatable roller arranged in tandem in respect to the first mentioned roller so that said first and second rollers successively press together said sheets of developing paper and photo-sensitive material between said rollers and said back-up surface when said rollers are transported in said directions parallel to said longitudinal median of said back-up surface.

15. An apparatus according to claim 1; further comprising self-aligning means for automatically attaining a desired attitude of the peripheral surface of said roller relative to said back-up surface during said transporting of said roller relative to the back-up member.

16. An apparatus according to claim 15; in which said self-aligning means includes means mounting said roller for pivoting relative to said back-up member about an axis parallel to said directions in which said roller is transported.

17. An apparatus according to claim 15; in which said self-aligning means includes means mounting said back-up member for pivoting about an axis parallel to said directions in which said roller is transported.

18. An apparatus according to claim 1; in which said back-up member includes a rotatable cylinder having a periphery forming said back-up surface, and said means for transporting said sheets of developing paper and photo-sensitive material includes drive means for rotating said cylinder.

19. An apparatus according to claim 1; in which said back-up surface has opposed margins parallel to said directions in which said roller is transported, and said back-up surface is convex in the direction toward said roller and has a rectilinear generatrix extending parallel to said directions in which said roller is transported; and in which said means for transporting said sheets includes sheet guide means disposed before and after said back-up surface considered in respect to said direction of sheet travel, said sheet guide means defining paths for said sheets extending to and from said back-up surface and which converge and diverge, respectively, in respect to a plane tangential to said back-up surface at a region of the latter along which said roller is urged there against, said paths being disposed between said plane and said back-up surface and spaced from the latter at said opposed margins of the back-up surface.

20. An apparatus for developing a picture on a sheet of developing paper from a sheet of photo-sensitive material which is more rigid than said sheet of developing paper and of a type which develops said picture upon the pressing together of said sheets of developing paper and photo-sensitive material, said apparatus comprising:
means defining a back-up surface having a longitudinal median;
means for intermittently transporting said sheets of developing paper and photo-sensitive material in contact with each other across said back-up surface in a predetermined direction of sheet travel which is at a substantial angle to said longitudinal median thereof, and, with said sheet of photo-sensitive material contacting said back-up surface;
at least one rotatable roller disposed in opposing relation to said back-up surface and having an axis of rotation substantially at right angles to said longitudinal median of said back-up surface;
means mounting said roller for bodily movements toward and away from said back-up surface and parallel to the back-up surface in directions parallel to said longitudinal median thereof; and
means for transporting said roller relative to said back-up surface in said directions parallel to said longitudinal median while urging said roller toward said back-up surface with said sheets of developing paper and photo-sensitive material being in contact with each other between said roller and said back-up surface so as to be pressed together by said roller acting on the relatively less rigid sheet of developing paper.

21. An apparatus for developing a picture on a sheet of developing paper from a sheet of photo-sensitive material of a type which develops said picture upon the pressing together of said sheets of developing paper and photo-sensitive material, said apparatus comprising:
means defining a back-up surface having a longitudinal median;
means for intermittently transporting said sheets of developing paper and photo-sensitive material in contact with each other in a predetermined direction of sheet travel across said back-up surface;
at least one rotatable roller disposed in opposing relation to said back-up surface and having an axis of rotation extending at right angles to said longitudinal median;
means mounting said roller for bodily movements toward and away from said back-up surface and parallel to the back-up surface in directions parallel to said longitudinal median of the back-up surface; and
means for transporting said roller across said back-up surface in said directions parallel to said longitudinal median while urging said roller toward said back-up surface with said sheets of developing paper and photo-sensitive material being in contact with each other between said roller and said back-up surface so as to be pressed together thereby;
said back-up surface and said roller being configured so that, during said transporting of said roller across said back-up surface, the contact pressure between the peripheral surface of said roller and said back-up surface is smaller at the opposite margins of said peripheral surface than at any other portions of the latter between said margins.

22. An apparatus according to claim 21; in which at least one of said back-up surface and said peripheral surface of said roller is shaped to diverge relative to the other of said back-up surface and peripheral surface from the median of said peripheral surface toward said opposite margins of the peripheral surface.

23. An apparatus according to claim 22; in which said peripheral surface is outwardly concave between said margins and said back-up surface is outwardly convex and has a rectilinear generatrix extending parallel to said directions in which said roller is transported; and in which said outwardly concave peripheral surface has a larger radius of curvature than said outwardly convex back-up surface.

24. An apparatus according to claim 22; in which said back-up surface is flat and said peripheral surface is outwardly convex between said margins.

25. An apparatus according to claim 22; in which said peripheral surface of said roller is cylindrical and has a rectilinear generatrix extending parallel to the axis of rotation of the respective roller, and said back-up surface is outwardly convex and has a rectilinear generatrix extending parallel to said directions in which said roller is transported.

26. An apparatus according to claim 21; in which said peripheral surface of said roller in cylindrical and has a rectilinear generatrix extending parallel to the axis of rotation of the roller, said back-up surface is flat, and said roller has opposed flanks with annular recesses therein concentric with said axis of rotation of the roller so that the rigidity of said roller at the opposite margins of said peripheral surface is less than the rigidity of the roller at a median portion of said peripheral surface intermediate said margins.

27. An apparatus for developing a picture on a sheet of developing paper from a sheet of photo-sensitive material of a type which develops said picture upon the pressing together of said sheets of developing paper and photo-sensitive material, said apparatus comprising:
 means defining a back-up surface having a longitudinal median;
 means for intermittently transporting said sheets of developing paper and photo-sensitive material in contact with each other in a predetermined direction of sheet travel across said back-up surface at a substantial angle to said longitudinal median;
 at least one rotatable roller disposed in opposing relation to said back-up surface and having an axis of rotation extending substantially at right angles to said longitudinal median;
 means mounting said roller for bodily movements toward and away from said back-up surface and parallel to the back-up surface in directions parallel to said longitudinal median thereof;
 means for transporting said roller across said back-up surface in said directions parallel to said longitudinal median while urging said roller toward said back-up surface with said sheets of developing paper and photo-sensitive material being in contact with each other between said roller and said back-up surface so as to be pressed together thereby; and
 at least one of said back-up surface and the peripheral surface of said roller being formed with minute concave and convex surface irregularities distributed thereover.

28. An apparatus according to claim 27; in which said photo-sensitive material has a surface comprised of photo-sensitive microcapsules which are selectively hardened by exposure to a light image and which contain respective color-forming substances released for correspondingly coloring said developing paper when said sheets are pressed together between said roller and said back-up surface with sufficient pressure exerted at said minute concave and convex surface irregularities to rupture the microcapsules that have not been hardened.

29. An apparatus according to claim 28; in which said minute concave and convex surface irregularities substantially correspond in size to a predetermined resolution of the picture to be developed on said sheet of developing paper.

30. An apparatus according to claim 27; in which said back-up surface has an array of parallel grooves therein extending parallel to said directions in which said roller is transported and which define said concave and convex irregularities.

31. An apparatus according to claim 27; in which said back-up surface has an array of pits therein defining said concave and convex irregularities.

32. An apparatus for developing a picture on a sheet of developing paper from a sheet of photo-sensitive material of a type which develops said picture upon the pressing together of said sheets of developing paper and photo-sensitive material, said apparatus comprising:
 a back-up cylinder defining a peripheral back-up surface with rounded edges at the opposite ends of said back-up surface;
 means for intermittently turning said cylinder and thereby transporting said sheets of developing paper and photo-sensitive material in contact with each other in a predetermined direction of sheet travel across said back-up surface;
 at least one rotatable roller disposed in opposing relation to said back-up surface and having an axis of rotation extending parallel to said predetermined direction of sheet travel;
 means mounting said roller for bodily movements relative to said back-up cylinder toward and away from said back-up surface and parallel to the back-up surface in directions perpendicular to said predetermined direction of sheet travel between standby positions situated beyond said opposite ends of the back-up surface;
 means for transporting said roller relative to said back-up cylinder in said directions perpendicular to said predetermined direction of sheet travel from one to another of said standby positions while urging each roller toward said back-up surface with said sheets of developing paper and photo-sensitive material being in contact with each other between said roller and said back-up surface so as to be pressed together thereby; and
 control means for causing coordinate operations of said means for intermittently turning said cylinder and said means for transporting said roller so that said sheets are transported a predetermined incremental distance in said direction of sheet travel while said roller is situated at one of said standby positions and said sheets are at rest while said roller is transported along said back-up surface from one to another of said standby positions and rolls smoothly over said rounded end edges in moving between said back-up surface and said standby positions.

33. An apparatus for developing a picture on a sheet of developing paper from a sheet of photo-sensitive material of a type which develops said picture upon the pressing together of said sheets of developing paper and photo-sensitive material, said apparatus comprising:
 means defining a back-up surface having a longitudinal median;
 means for intermittently transporting said sheets of developing paper and photo-sensitive material in contact with each other in a predetermined direction of sheet travel across said back-up surface at a substantial angle to said longitudinal median;
 first and second rotatable rollers arranged in tandem in opposing relation to said back-up surface and each having an axis of rotation extending substantially at right angles to said longitudinal median;
 means mounting said rollers for bodily movements toward and away from said back-up surface and parallel to the back-up surface in directions parallel to said longitudinal median; and means operative when the sheets are at rest on the back-up surface for transporting said rollers relative to said back-up surface in said directions parallel to said longitudinal median while urging said rollers toward said back-up surface so that said rollers successively press together said sheets of developing paper and photo-sensitive material between said rollers and said back-up surface.

34. An apparatus according to claim 33; in which said means mounting said rollers arranged in tandem includes parallel guide rods extending parallel to said directions in which the rollers are transported, a carriage movable along said guide rods, a single pivot pin carried by said carriage between said first and second rollers and providing a pivot axis parallel to the axes of said rollers, first and second support members pivotably mounted on said single pin and extending in opposed directions from the latter, said first and second rollers being rotatably mounted on said first and second support members, respectively, for said movements toward and away from said back-up surface in response to pivoting of said support members about said pivot axis, and springs interposed between said carriage and said support members for urging the latter in the direction moving the respective rollers toward said back-up surface.

35. An apparatus according to claim 34; in which said guide rods have cylindrical surfaces, and said means mounting the rollers further include guide rolls with grooved peripheries rotatably mounted at opposite sides of said carriage and engaging at said grooved peripheries with said cylindrical surfaces of the guide rods under the influence of said springs urging said rollers against said back-up surface.

36. An apparatus for developing a picture on a sheet of developing paper from a sheet of photo-sensitive material of a type which develops said picture upon the pressing together of said sheets of developing paper and photo-sensitive material, said apparatus comprising:
a back-up member having a back-up surface with a longitudinal median;
means for intermittently transporting said sheets of developing paper and photo-sensitive material in contact with each other across said back-up surface in a predetermined direction of sheet travel at a substantial angle to said longitudinal median;
at least one rotatable roller disposed in opposing relation to said back-up surface and having an axis of rotation extending substantially at right angles to said longitudinal median of said back-up surface;
means mounting said roller for bodily movements relative to said back-up member toward and away from said back-up surface and parallel to the back-up surface in directions parallel to said longitudinal median;
means for transporting said roller relative to said back-up surface in said directions parallel to said longitudinal median while urging said roller toward said back-up surface with said sheets of developing paper and photo-sensitive material being in contact with each other between said roller and said back-up surface so as to be pressed together thereby; and
self-aligning means for automatically attaining a desired attitude of the peripheral surface of said roller relative to said back-up surface during said transporting of said roller relative to the back-up member.

37. An apparatus according to claim 36; in which said self-aligning means includes means mounting said roller for pivoting relative to said back-up surface about an axis parallel to said directions in which said roller is transported.

38. An apparatus according to claim 36; in which said self-aligning means includes means mounting said back-up member for pivoting about an axis parallel to said directions in which said roller is transported.

39. An apparatus for developing a picture on a sheet of developing paper from a sheet of photo-sensitive material of a type which develops said picture upon the pressing together of said sheets of developing paper and photo-sensitive material, said apparatus comprising:
means defining an upwardly facing back-up surface having opposed parallel margins extending longitudinally therealong, said back-up surface being convex and having a rectilinear generatrix extending parallel with said margins;
means for intermittently transporting said sheets of developing paper and photo-sensitive material in contact with each other across said back-up surface in a direction of sheet travel at a substantial angle to the longitudinal margins of said back-up surface and including sheet guide means disposed before and after said back-up surface considered in respect to said direction of sheet travel, said sheet guide means defining paths for said sheets extending to and from said back-up surface and which converge and diverge, respectively, in respect to a plane tangential to said back-up surface at the top of the latter, said paths being disposed between said plane and said back-up surface and spaced from the latter at said opposed longitudinal margins of the back-up surface;
at least one rotatable roller disposed in opposing relation to said back-up surface and having an axis of rotation extending substantially at right angles to said margins of said back-up surface;
means mounting said roller for bodily movements relative to said back-up surface toward and away from said back-up surface and parallel to the back-up surface in directions parallel to said margins; and
means for transporting said roller relative to said back-up surface in said directions parallel to said margins while urging said roller toward said back-up surface with said sheets of developing paper and photo-sensitive material being in contact with each other between said roller and said back-up surface so as to be pressed together thereby.

40. An apparatus according to claim 39; in which said roller has a peripheral surface with rounded opposed edges.

41. An apparatus according to claim 40; in which said sheet of developing paper is softer than said sheet of photo-sensitive material; and in which said sheets are arranged in contact with each other with said sheet of photo-sensitive material at the bottom to engage said back-up surface and said sheet of developing paper at the top to be engaged by said peripheral surface of the roller.

* * * * *